(12) United States Patent
Inoue et al.

(10) Patent No.: US 11,330,205 B2
(45) Date of Patent: May 10, 2022

(54) PHOTOSENSOR, IMAGE SENSOR, AND PHOTOSENSOR DRIVING METHOD

(71) Applicant: Panasonic Intellectual Property Management Co., Ltd., Osaka (JP)

(72) Inventors: Akito Inoue, Osaka (JP); Yutaka Hirose, Kyoto (JP); Seiji Yamahira, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 17/183,213

(22) Filed: Feb. 23, 2021

(65) Prior Publication Data

US 2021/0176413 A1  Jun. 10, 2021

Related U.S. Application Data

(63) Continuation of application No. PCT/JP2019/033363, filed on Aug. 26, 2019.

(30) Foreign Application Priority Data

Aug. 28, 2018 (JP) .............................. JP2018-159472

(51) Int. Cl.
| | |
|---|---|
| *H04N 5/355* | (2011.01) |
| *H04N 5/369* | (2011.01) |

(Continued)

(52) U.S. Cl.
CPC ........... *H04N 5/355* (2013.01); *H04N 5/3698* (2013.01); *H04N 5/378* (2013.01);
(Continued)

(58) Field of Classification Search
CPC ...... H04N 5/355; H04N 5/3698; H04N 5/378; H01L 31/107
See application file for complete search history.

(56) References Cited

U.S. PATENT DOCUMENTS

| | | |
|---|---|---|
| 2008/0290259 A1 | 11/2008 | Mathewson et al. |
| 2009/0256223 A1 | 10/2009 | Yamamura et al. |

(Continued)

FOREIGN PATENT DOCUMENTS

| | | |
|---|---|---|
| JP | 2015-5752 A | 1/2015 |
| WO | 2006/126926 A1 | 11/2006 |

(Continued)

OTHER PUBLICATIONS

International Search Report issued in corresponding International Application No. PCT/JP2019/033363, dated Nov. 12, 2019, with English translation.

(Continued)

*Primary Examiner* — Daniel M Pasiewicz
(74) *Attorney, Agent, or Firm* — McDermott Will & Emery LLP

(57) ABSTRACT

The photosensor includes an APD that has a multiplication region including a photoelectric converter and includes a first capacitor connected to the multiplication region in parallel, and a first transistor connected between the APD and a first power supply (voltage VC). The first transistor applies a reverse bias of a power supply voltage (VC-VA), which is larger than a breakdown voltage VBD, between an anode and a cathode of the APD during a bias setting period by connecting the APD to the first power supply, and stops an avalanche multiplication phenomenon during a light exposing period by disconnecting the APD from the first power supply to accumulate charges generated by the avalanche multiplication phenomenon in the first capacitor.

20 Claims, 47 Drawing Sheets

(51) Int. Cl.
H04N 5/378 (2011.01)
H01L 27/146 (2006.01)
H01L 31/107 (2006.01)

(52) U.S. Cl.
CPC .. *H01L 27/14629* (2013.01); *H01L 27/14643* (2013.01); *H01L 31/107* (2013.01)

(56) References Cited

U.S. PATENT DOCUMENTS

2014/0374867 A1   12/2014   De Munck et al.
2015/0281620 A1   10/2015   Usuda et al.
2018/0278877 A1   9/2018    Yamahira

FOREIGN PATENT DOCUMENTS

| WO | 2008/904547 A1 | 1/2008 |
| WO | 2012/032353 A2 | 3/2012 |
| WO | 2014/997519 A1 | 6/2014 |
| WO | 2017/098710 A1 | 6/2017 |

OTHER PUBLICATIONS

Andrea Gallivanoni, et al., "Progress in Quenching Circuits for Single Photon Avalanche Diodes". IEEE Transactions on Nuclear Science, vol. 57, No. 6, Dec. 2010, pp. 3815-3826.

PHOTOSENSOR, IMAGE SENSOR, AND PHOTOSENSOR DRIVING METHOD

CROSS REFERENCE TO RELATED APPLICATIONS

This application is a U.S. continuation application of PCT International Patent Application Number PCT/JP2019/033363 filed on Aug. 26, 2019, claiming the benefit of priority of Japanese Patent Application Number 2018-159472 filed on Aug. 28, 2018, the entire contents of which are hereby incorporated by reference.

BACKGROUND

1. Technical Field

The present disclosure relates to a photosensor, an image sensor, and a photosensor driving method, and particularly relates to a photosensor which detects weak light at high speed.

2. Description of the Related Art

Recently, highly sensitive photosensors are used in a broad range of fields such as medical, communication, biological, chemical, monitoring, vehicle installation, and radiation detection fields. Avalanche photodiodes (hereinafter, also referred to as APDs) are used as one of methods of providing high sensitivity. The APD is a photodiode having light detection sensitivity enhanced by multiplication of signal charges, which are generated by photoelectric conversion, using avalanche breakdown. A photon-counting photodetector (WO 2008/004547 (PTL 1)) and a highly sensitive image sensor (WO 2014/097519 (PTL 2)) which can detect a small number of photons using the APD are disclosed in the related art.

The APD has two different operational modes according to the voltage to be applied to the APD, i.e., a linear multiplication mode and a Geiger multiplication mode. The linear multiplication mode is an operational mode when a relatively low voltage is applied to the APD. Because only one of electrons and holes which contribute to conduction dominantly undergoes avalanche multiplication, avalanche multiplication is terminated in a time taken until the charges subjected to avalanche multiplication pass through the multiplication region. Thus, the multiplication rate is finite, and is at most about 100 times (PTL 2). In this case, the linear multiplication mode is unsuitable for applications where faint light is detected as a high S/N ratio.

In contrast, the Geiger multiplication mode is an operational mode when a relatively high voltage is applied to the APD. Because charges of electrons and holes both undergo avalanche multiplication, the charges generated by avalanche multiplication are further repeatedly multiplied, providing an infinite multiplication rate. Hereinafter, in this specification, the operating voltage when switching between the linear multiplication mode and the Geiger multiplication mode occurs is referred to as breakdown voltage. Although faint light of a single photon can also be detected at a high S/N ratio in the Geiger multiplication mode because of its significantly high charge multiplication rate, one charge is infinitely multiplied to generate a large current, which may result in breakage of elements.

PTL 1 discloses a device configuration for preventing breakage of elements even in the Geiger multiplication mode. In these techniques, voltage drop is caused by the current flowing through the resistor connected to the APD in series to reduce the voltage to be applied to the multiplication region of the APD. As a result, avalanche multiplication stops, preventing breakage of elements. However, in such a configuration, the resistance value of the resister connected to the APD should be increased to prevent a large current. Unfortunately, there is a trade-off relation such that an increase in resistance value of the resister increases the time until the voltage of the APD is reset. Thus, the techniques above are not suitable for applications which require high speed or repeated cycles between resets. Moreover, the techniques above need a special process to control the resistance value of the resistor to satisfy this trade-off requirement. In addition, miniaturization is difficult due to the resistor.

PTLs 2 and 3 (Japanese Unexamined Patent Application Publication No. 2015-5752) disclose device configurations in which APDs are arranged in an array. However, in PTLs 2 and 3, a method of stopping avalanche multiplication in the Geiger multiplication mode or a method of retaining charges generated in the Geiger multiplication mode within pixels are not mentioned, and only the linear multiplication mode is described.

PTLs 2 and 4 (WO 2017/098710) disclose circuit configurations in which APDs arranged in an array are used as an image sensor. However, in PTLs 2 and 4, a method of stopping multiplication in the Geiger multiplication mode and a device configuration suitable for the method are not mentioned.

SUMMARY

In consideration of the circumstances above, an object of the present disclosure is to provide a photosensor, an image sensor, and a photosensor driving method which enable detection of faint light at a high S/N ratio and high speed.

To attain the object above, the photosensor according to one aspect of the present disclosure includes an avalanche photodiode including a photoelectric converter and a first capacitor connected to the photoelectric converter in parallel; and a first reset transistor connected between the avalanche photodiode and a first power supply. The first reset transistor applies a reverse bias of a power supply voltage between an anode and a cathode of the avalanche photodiode during a bias setting period by connecting the avalanche photodiode to the first power supply, the power supply voltage being larger than a breakdown voltage of the avalanche photodiode, and stops an avalanche multiplication phenomenon during a light exposing period by disconnecting the avalanche photodiode from the first power supply to accumulate charges in the first capacitor, the charges being generated by the avalanche multiplication phenomenon in the avalanche photodiode.

To attain the object above, the image sensor according to one aspect of the present disclosure includes the photosensors arranged in an array.

To attain the object above, the photosensor driving method according to one aspect of the present disclosure is a method of driving a photosensor including an avalanche photodiode including a photoelectric converter and a first capacitor connected to the photoelectric converter in parallel, the method including: applying a reverse bias of a power supply voltage between an anode and a cathode of the avalanche photodiode during a bias setting period by connecting the avalanche photodiode to a first power supply, the power supply voltage being larger than a breakdown voltage of the avalanche photodiode; and stopping an avalanche multiplication phenomenon during a light exposing period by disconnecting the avalanche photodiode from the first power supply to accumulate charges in the first capacitor, the charges being generated by the avalanche multiplication phenomenon in the avalanche photodiode.

The present disclosure provides a photosensor, an image sensor, and a photosensor driving method which enable detection of faint light at a high S/N ratio and high speed.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DETAILED DESCRIPTION OF THE EMBODIMENT

Embodiment

The photosensor, the image sensor, and the photosensor driving method according to an embodiment of the present disclosure will now be described in detail with reference to the drawings. Identical referential numerals will be given to substantially identical configurations, and the description thereof will be omitted in some cases. The embodiment below should not be construed as limitations to the present disclosure. A plurality of embodiments according to the present disclosure can be combined. Moreover, the present disclosure will not exclude a structure in which the P-type and the N-type are exchanged in the embodiment below.

Figure 1:
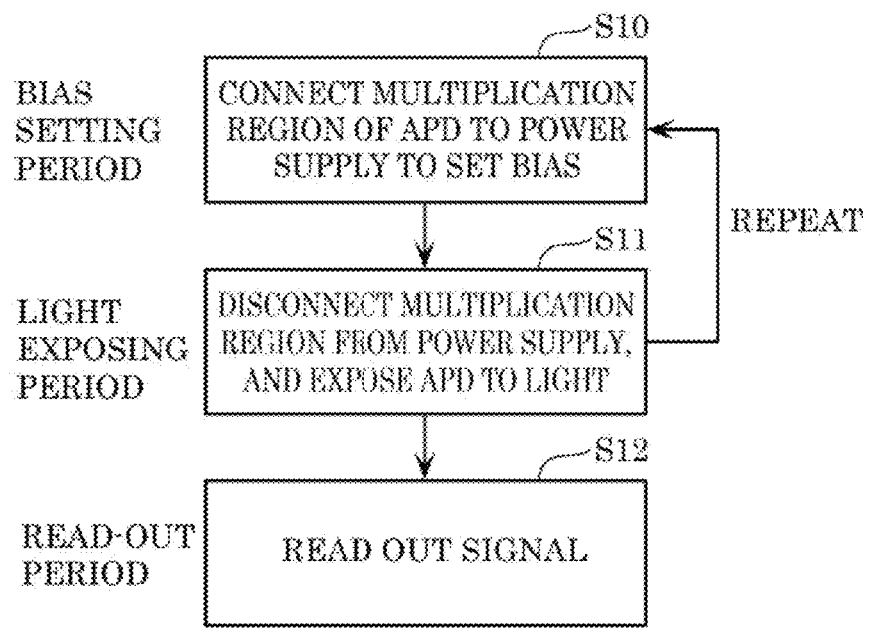
FIG. 1 is a flowchart illustrating one example of the photosensor driving method according to an embodiment.

First, a circuit configuration of the photosensor according to an embodiment, the driving method, and the operation of the photosensor in a Geiger multiplication mode will be described with reference to FIGS. 1 to 3. FIG. 1 is a flowchart illustrating one example of the photosensor driving method according to the present embodiment. In the present embodiment, a predetermined number of bias setting periods (S10) during which a voltage is applied to the multiplication region of the APD included in the photosensor and the predetermined number of light exposing periods (S11) during which the light entering the APD is detected are alternately repeated. Thereafter, a signal is read out (S12).

Figure 2:
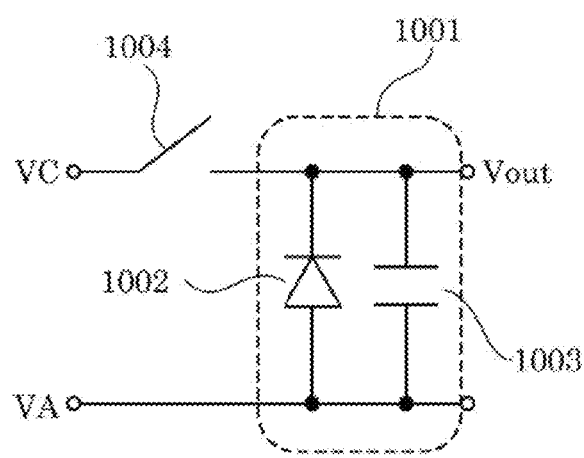
FIG. 2 is a diagram illustrating one example of a circuit configuration of the photosensor according to the embodiment.
Figure 3:
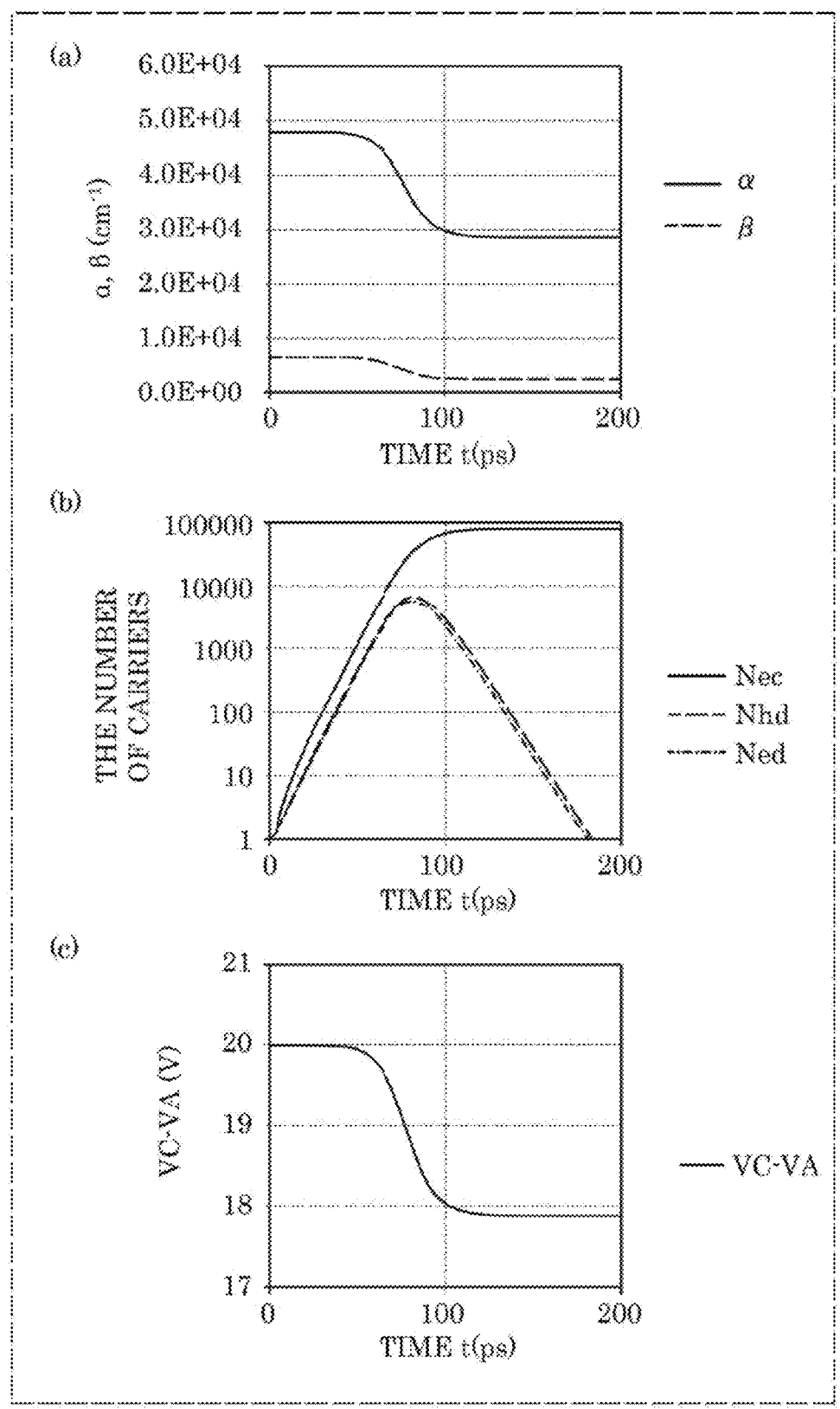
FIG. 3 is a diagram illustrating the behaviors of electrons and holes in the multiplication region of the APD in FIG. 2.

FIG. 2 is a diagram illustrating one example of the circuit configuration of the photosensor according to the embodiment. As illustrated in FIG. 2, in the circuit configuration according to the present embodiment, the photosensor includes APD 1001 connected in series and switch 1004. APD 1001 includes multiplication region 1002 including a photoelectric converter, and first capacitor 1003 connected to multiplication region 1002 in parallel. The anode of APD 1001 is set at voltage VA, which is the potential of the reference power supply. In the bias setting period, switch 1004 is turned on, and the cathode of APD 1001 is set to voltage VC, which is the voltage of a first power supply (not illustrated). A reverse bias of a power supply voltage equal to voltage VC-VA is applied across multiplication region 1002. Hereinafter, in this specification, the operation to apply a reverse bias to APD 1001 by turning on switch 1004 is defined as "reset". In the light exposing period, the first power supply is disconnected from APD 1001 by turning off switch 1004, to cancel the potential of APD 1001. By setting voltage VC-VA to be larger than breakdown voltage VBD, APD 1001 can be operated in a Geiger multiplication mode. Hereinafter, in this specification, the difference between voltage VC-VA applied to APD 1001 as a reverse bias and breakdown voltage VBD is defined as overvoltage Vov (=(VC-VA)-VBD). Because the Geiger multiplication mode has an infinite multiplication rate, a signal having a high S/N ratio can be obtained. Although the cathode of APD 1001 is configured to be disconnected from the first power supply (voltage VC) during the light exposing period in FIG. 2, the anode may be configured to be disconnected from the reference power supply (voltage VA) or both of the anode and the cathode may be configured to be disconnected.

The photosensor driving method according to the present embodiment can prevent a flow of large current even in the Geiger multiplication mode and thus breakage of elements. The electron impact ionization rate and the hole impact ionization rate are defined by equations (1) and (2), respectively:

[Expression 1]

$$\alpha = \alpha_0 \exp\left(-\frac{a_0}{E}\right) \quad (1)$$

$$\beta = \beta_0 \exp\left(-\frac{b_0}{E}\right) \quad (2)$$

Here, $\alpha$ is the electron impact ionization rate, $\alpha_0$ is a constant, $a_0$ is a constant, E is the intensity of the electric field, $\beta$ is the hole impact ionization rate, $\beta_0$ is a constant, and $b_0$ is a constant. The impact ionization rate refers to the probability that impact ionization occurs per a unit traveling distance. According to equations (1) and (2), a reduction in electric field results in a reduction in impact ionization rate. The charges generated by avalanche multiplication are accumulated in first capacitor 1003, and the charges accumulated in first capacitor 1003 reduce the voltage applied across multiplication region 1002, as defined by equation (3) below:

[Expression 2]

$$\Delta V = \frac{Q}{C} \quad (3)$$

Here, $\Delta V$ is the change amount of the voltage applied across multiplication region 1002, Q is the amount of charges generated by avalanche multiplication, and C is the capacitance value of first capacitor 1003. Where the velocity of the electron in multiplication region 1002 is defined as ve and the velocity of the hole in the deletion layer is defined as vh, in average, the electron causes one impact ionization per time represented by t0e=ve·$\alpha$ and the hole causes one impact ionization per time represented by t0h=vh·$\beta$. Where the width of multiplication region 1002 is defined as W, the electron passes through multiplication region 1002 in the time represented by t1e=W/ve, and the hole passes through multiplication region 1002 in the time represented by t1h=W/vh. The electrons which have passed through multiplication region 1002 are accumulated in first capacitor 1003, and the holes which have passed through multiplication region 1002 are discharged to the VA power supply. The relations above are modeled by the following equations (4), (5), (6), and (7), which are differential equations:

[Expression 3]

$$\frac{dN_{ed}(t)}{dt} = \left\{ \frac{N_{ed}(t)}{t_{0e}} + \frac{N_{hd}(t)}{t_{0h}} - \frac{N_{ed}(t)}{t_{1e}} \right\} \quad (4)$$

$$\frac{dN_{hd}(t)}{dt} = \left\{ \frac{N_{ed}(t)}{t_{0e}} + \frac{N_{hd}(t)}{t_{0h}} - \frac{N_{ed}(t)}{t_{1h}} \right\} \quad (5)$$

$$\frac{dN_{ec}(t)}{dt} = \left\{ \frac{N_{ed}(t)}{t_{1e}} \right\} \quad (6)$$

$$\Delta V = \frac{q(N_{ec}(t) + N_{ed}(t) + N_{hd}(t))}{C} \quad (7)$$

Here, t represents the time, $N_{ed}$ represents the number of electrons in multiplication region 1002, $N_{hd}$ represents the number of holes in multiplication region 1002, and $N_{ec}$ represents the number of electrons which pass through multiplication region 1002 and are accumulated in first capacitor 1003.

Here, the results of analysis using the differential equations (equations (4) to (7)) will be described with reference to FIG. 3. FIG. 3 is a diagram illustrating the behaviors of the electrons and the holes in multiplication region 1002 of APD 1001 illustrated in FIG. 2. Calculation is performed, where an APD having an ideal PIN junction is assumed and the intensity of the electric field is fixed in multiplication region 1002. The following parameters are used in the calculation. Here, width W of multiplication region 1002 is 0.5 μm, breakdown voltage VBD is 18.9 V, capacitance value C is 6 fF, initial voltage VC-VA applied to multiplication region 1002 is 20 V, overvoltage Vov is 1.1 V, the velocity of the electron and that of the hole are saturated velocities, the number of electrons generated in multiplication region 1002 is 1, and the time at which the electron generates is t=0. (a) of FIG. 3 is a diagram illustrating a change over time in electron impact ionization rate α and that in hole impact ionization rate β. (b) of FIG. 3 is a diagram illustrating a change over time in $N_{ed}$, $N_{hd}$, and $N_{ec}$. (c) of FIG. 3 is a diagram illustrating a change over time in reverse bias VC-VA applied to multiplication region 1002 for electrons. As shown in (a) of FIG. 3, at t=0 s, the values of α and β are large. As shown in (b) of FIG. 3, the number N of electrons, the number $N_{hd}$ of holes in multiplication region 1002, and the number $N_{ec}$ of electrons accumulated in first capacitor 1003 are increased by avalanche multiplication with the time. As shown in (c) of FIG. 3, as $N_{ed}$, $N_{hd}$, and $N_{ec}$ increase, voltage VC-VA reduces according to equation (7). As shown in (a) of FIG. 3, the reduction in voltage VC-VA results in reductions in α and β. Impact ionization is difficult to occur due to the reductions in α and β, and thus the number $N_{ed}$ of electrons and the number $N_{hd}$ of holes in multiplication region 1002 are reduced as shown in (b) of FIG. 3. The electrons and holes in the multiplication region are consumed after 200 ps from the start of avalanche multiplication, and avalanche multiplication stops. At this time, as shown in (c) of FIG. 3, voltage VC-VA is 17.9 V and the voltage amplitude is 2.1 V. This voltage amplitude of 2.1 V is the sum of overvoltage Vov of 1.1 V and an overshoot of 1.0 V, and depends on the overvoltage. In particular, when the overvoltage is low, the overshoot component is also small, and the voltage amplitude approximately matches with the overvoltage. For this reason, in an image sensor including a plurality of APD arrays, the potential barrier between adjacent APDs or that separating the APD from other elements are preferably equal to or higher than the overvoltage. At this time, approximately 80000 electrons are generated during a period of 100 ps. The corresponding current value is about 0.1 mA, and such a low current never breaks the elements. Thus, by using the photosensor according to the present embodiment, the charges generated in multiplication region 1002 of APD 1001 are accumulated in first capacitor 1003, and avalanche multiplication spontaneously stops. Hereinafter, in this specification, the spontaneous mechanism to stop avalanche multiplication by first capacitor 1003 is referred to as "capacitance quenching". By capacitance quenching, a signal having a large amplitude such as several volts can be obtained from one photon without breaking the elements, and photons can be detected at a high S/N ratio.

PTLs 1 and 3 disclose mechanisms to stop avalanche multiplication by generating voltage drop by the current flowing through the resister connected to the APD in series to reduce the voltage applied to the multiplication region of the APD. However, in such a configuration, the resistance value of the resister connected to the APD should be increased to prevent a large current. Unfortunately, there is a trade-off relation such that an increase in resistance value of the resister increases the time taken until the voltage of the APD is reset. Thus, the configuration is not suitable for applications which require high speed.

In contrast, there is no concern about flowing of a large current in the capacitance quenching described in the present embodiment, because even if avalanche multiplication occurs, voltage drop is caused by the charges accumulated in the capacitor and avalanche multiplication stops before a large current flows. Moreover, resetting of APD 1001 can be completed in a short time by turning on switch 1004 in the resetting of APD 1001, because APD 1001 is connected to first power supply (voltage VC) at a low resistance. Thus, use of the method of driving capacitance quenching provided in the present embodiment can solve the problem in the patent literatures in the related art, i.e., the trade-off between the large current and the prolonged reset time.

In capacitance quenching, charges are accumulated in first capacitor 1003 one time, and the accumulated charges are read out as a signal. For this reason, APD 1001 using capacitance quenching can be incorporated into a pixel circuit of a CMOS sensor. By incorporating APD 1001 into the pixel circuit of the CMOS sensor, the signal derived from the charges accumulated in first capacitor 1003 can be amplified by the pixel circuit, and can be output. Moreover, by adding a normal mode driving method in which the reverse bias applied to APD 1001 is reduced and charges are output without being subjected to avalanche multiplication, an analog signal corresponding to the quantity of incident light can be output at a high S/N ratio. In other words, capacitance quenching in the Geiger multiplication mode is used at a small quantity of incident light. On the other hand, a normal mode is used at a relatively large quantity of incident light. Thus, a wide dynamic range can be provided.

Next, the circuit configuration of the photosensor and the driving method according to the present embodiment will be described with reference to FIGS. 4 and 5.

Figure 4:
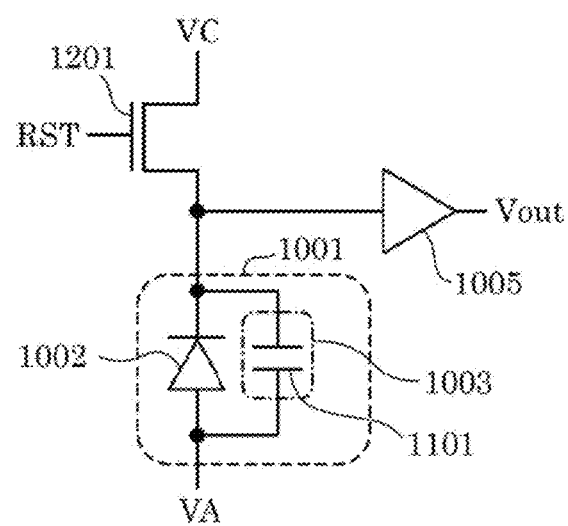
FIG. 4 is a diagram illustrating another example of the circuit configuration of the photosensor according to the embodiment.

FIG. 4 is a diagram illustrating another example of the circuit configuration of the photosensor according to the present embodiment. First capacitor 1003 in the photosensor illustrated in FIG. 2 includes the capacitance of APD 1001 itself (APD capacitance 1101), and switch 1004 in the photosensor illustrated in FIG. 2 is implemented by first transistor 1201, which is one example of a first reset transistor connected between APD 1001 and first power supply (voltage VC). APD capacitance 1101 is the junction capacitance of multiplication region 1002 and the parasitic capacitance of APD 1001. In this case, the gate of first transistor 1201 is connected to the RST terminal, and on/off of first transistor 1201 is controlled by the voltage of the RST terminal. The circuit illustrated in FIG. 4 is illustrated as a case where an N-type transistor is used as first transistor 1201. First transistor 1201 is on at a high voltage of the RST terminal, and is off at a low voltage of the RST terminal. Hereinafter, in this specification, the gate voltage to turn on the transistor is defined as high bias, and the gate voltage to turn off the transistor is defined as low bias. Typically, the high bias is equal to or higher than gate threshold voltage Vth of the transistor and the low bias is lower than or equal to gate threshold voltage Vth of the transistor. The photosensor illustrated in FIG. 4 includes read-out circuit 1005 which reads out voltage Vout of the cathode of APD 1001. Read-out circuit 1005 may be configured with only a line, or a source follower circuit or an inverter circuit may be used as read-out circuit 1005. The voltage amplitude of APD 1001 is equal to or higher than overvoltage Vov. Thus, the withstand voltage of read-out circuit 1005 and that of the transistor are desirably equal to or higher than overvoltage Vov. First capacitor 1003 may include the input capacitance of read-out circuit 100.

Figure 5:
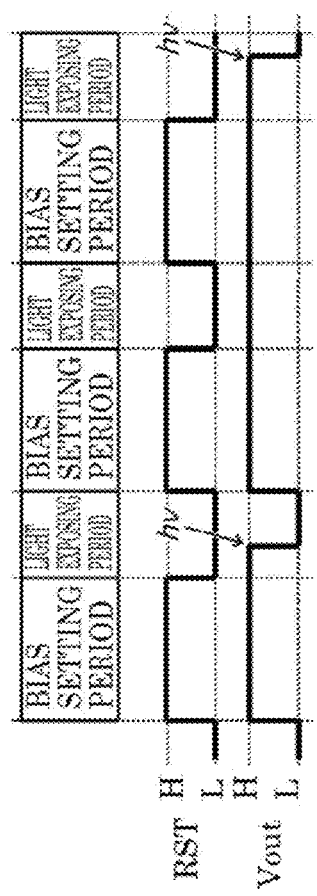
FIG. 5 is a timing chart showing one example of the driving method for the photosensor illustrated in FIG. 4.

FIG. 5 is a timing chart illustrating one example of the method of driving the photosensor illustrated in FIG. 4. Here, the bias voltage ("RST" in the chart) of the RST terminal and voltage Vout of the cathode of APD 1001 in FIG. 4 are shown. Because the voltage of the RST terminal is set to the high bias in the bias setting period, first transistor 1201 in FIG. 4 is turned on to set the voltage across APD 1001 to voltage VC-VA. Because the voltage of the RST terminal is set to the low bias in the light exposing period, first transistor 1201 is turned off to disconnect APD 1001 from the first power supply (voltage VC). Symbols H and L in FIG. 5 indicate the high bias and the low bias, respectively. The same applies to the drawings below. When photons (hv in the chart) enter APD 1001 during the light exposing period, the voltage of the cathode of APD 1001 is changed by charges generated by photoelectric conversion and charges generated by avalanche multiplication. As described above, the change amount of voltage Vout of the cathode of APD 1001 by capacitance quenching corresponds to about the overvoltage. Although not clearly shown in FIG. 5, the difference in voltage between the high bias and the low bias of the Vout terminal corresponds to about the overvoltage. In such a configuration, the signal derived from one photon can be detected as a large-amplitude signal of several hundreds millivolts to several volts, and the number of photons entering APD 1001 can be counted at a high S/N ratio.

Next, the device configuration of APD 1001 included in the photosensor according to the present embodiment will be described with reference to FIGS. 6 to 13. To clearly illustrate the photosensor according to the present embodiment in planar view of (a) of FIG. 6 to (a) of FIG. 13, part thereof is illustrated as a perspective view and the wiring layer is partially omitted. In this specification, the term "in planar view" indicates that the photosensor is viewed from the normal direction of the light receiving surface of the photoelectric converter. Hereinafter, in this specification, the terms "upper" and "shallow" refer to the front surface side of semiconductor substrate 2001 in a cross-sectional view, and the terms "lower" and "deep" refer to the rear surface side of semiconductor substrate 2001 in a cross-sectional view. In this specification, the value of the voltage is expressed based on the ground as a reference.

Figure 6:
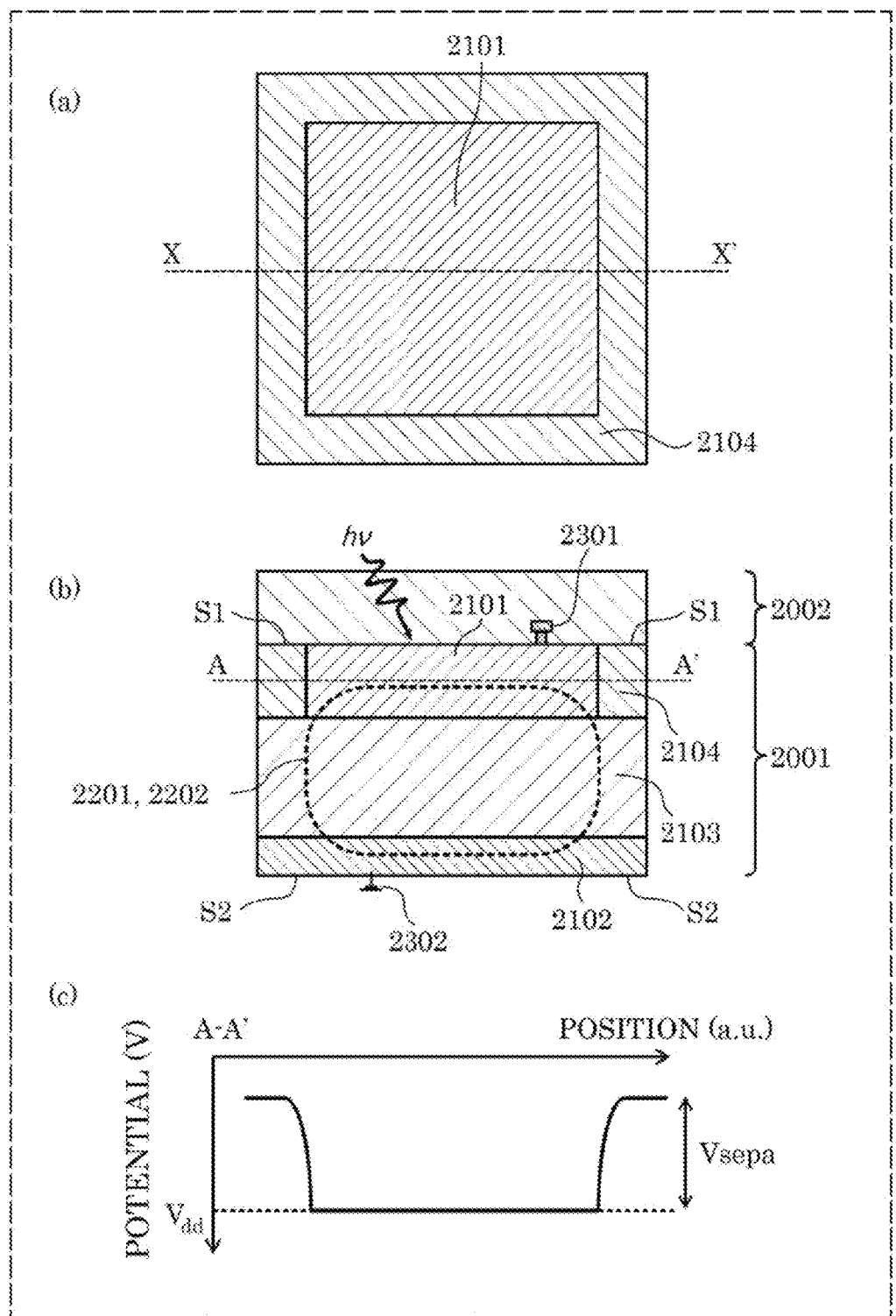
FIG. 6 is a diagram illustrating one example of the device configuration of the APD included in the photosensor according to the embodiment.

FIG. 6 is a diagram illustrating one example of the device configuration of APD 1001 included in the photosensor according to the present embodiment. (a) of FIG. 6 is a plan view of APD 1001, (b) of FIG. 6 is a cross-sectional view taken along X-X' in (a) of FIG. 6, and (c) of FIG. 6 is a diagram illustrating the potential in the cross-section taken along A-A' in (b) of FIG. 6. As illustrated in (b) of FIG. 6, APD 1001 includes semiconductor substrate 2001 and wiring layer 2002. Semiconductor substrate 2001 has first main surface S1 and second main surface 82. Semiconductor substrate 2001 includes first semiconductor layer 2101 having a first conductivity type, second semiconductor layer 2102 having a second conductivity type having a polarity opposite to that of the first conductivity type, third semiconductor layer 2103 which is disposed between first semiconductor layer 2101 and second semiconductor layer 2102 and has the first conductivity type or the second conductivity type, and fourth semiconductor layer 2104 which has the second conductivity type and is disposed around first semiconductor layer 2101 excluding the region where third semiconductor layer 2103 is disposed in planar view. In wiring layer 2002, first electrode 2301 connected to first semiconductor layer 2101 is disposed. Second semiconductor layer 2102 is connected to second electrode 2302. Part of first semiconductor layer 2101, part of second semiconductor layer 2102, and third semiconductor layer 2103 form photoelectric converter 2201. When the first conductivity type is an N-type and the second conductivity type is a P-type, switch 1004 (not illustrated in FIG. 6) connected to first semiconductor layer 2101 through first electrode 2301 is turned on in the bias setting period. Thereby, first semiconductor layer 2101 is set to voltage VC, and second semiconductor layer 2102 is set to voltage VA. An electric field is generated in part of first semiconductor layer 2101, part of second semiconductor layer 2102, and third semiconductor layer 2103 to form multiplication region 2202 where electrons and holes photoelectrically converted by entering of photons (hv in (b) of FIG. 6) are subjected to avalanche multiplication. In FIG. 6, photoelectric converter 2201 and multiplication region 2202 indicate the same region. As illustrated in (c) of FIG. 6, multiplication region 2202 is electrically separated from other elements by the potential of fourth semiconductor layer 2104. In particular, a voltage amplitude of about the overvoltage is generated from one photon in the Geiger multiplication mode. For this reason, as one feature, potential barrier Vsepa is larger than overvoltage Vov to prevent leakage of charges to the adjacent photosensor in the device.

Although the first conductivity type is the N-type and the second conductivity type is the P-type in FIG. 6, these conductivity types may be exchanged. Although first semiconductor layer 2101 and fourth semiconductor layer 2104 have the same depth (i.e., the same thickness) in FIG. 6, the depth (i.e., the thickness) of first semiconductor layer 2101 and that of fourth semiconductor layer 2104 can have any other relation.

In the configurations disclosed in PTLs 1 and 3 where voltage drop is caused by the current flowing through the resistor connected to the APD in series, the amount of generated charges is controlled by the amount of charges flowing through a resistor element outside the APD. For this reason, the potential barrier for separating the element inside the APD is hardly problematic. In contrast, in the photosensor driving method according to the present embodiment, the charges generated in avalanche multiplication are accumulated in the junction capacitance in APD 1001. For this reason, the potential barrier of the junction should be sufficiently large to the voltage amplitude caused by avalanche multiplication. This is clearly a difference of the present embodiment from PTLs 1 and 3.

PTL 4 discloses a configuration in which the charges subjected to avalanche multiplication are accumulated in the capacitor connected to the APD. However, PTL 4 never mentions to the circuit configuration, the device configuration, and the driving method needed to detect photons using capacitance quenching in the Geiger multiplication mode as described in the present embodiment, and it is difficult to use the embodiment disclosed in PTL 4 as a photosensor driving method in the Geiger multiplication mode. This is clearly a difference of the present embodiment from PTL 4.

Figure 7:
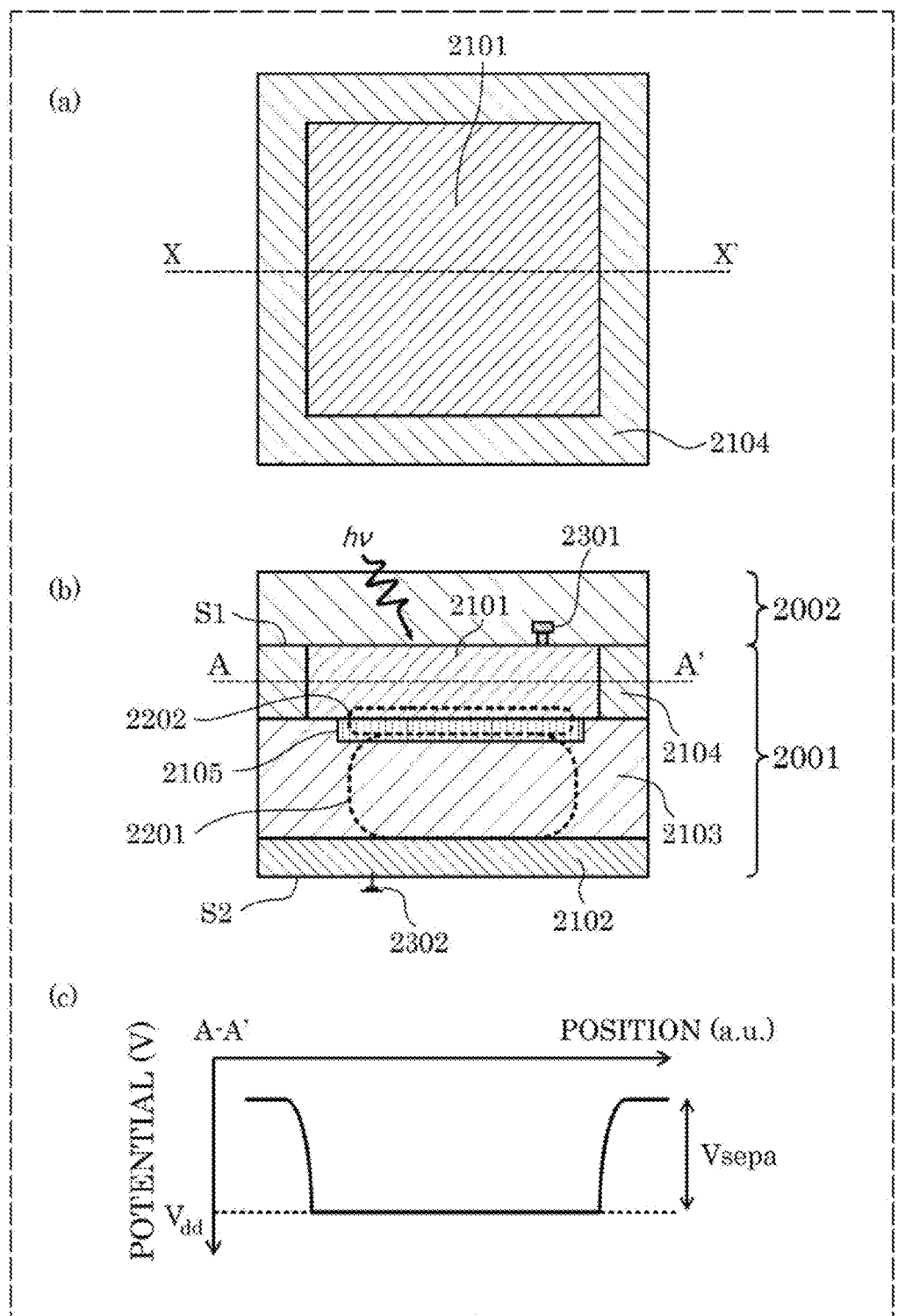
FIG. 7 is a diagram illustrating another example of the device configuration of the APD included in the photosensor according to the embodiment.

Next, another example of the device configuration of APD 1001 included in the photosensor according to the present embodiment will be described with reference to FIG. 7. (a) of FIG. 7 is a plan view of APD 1001, (b) of FIG. 7 is a cross-sectional view taken along X-X' in (a) of FIG. 7, and (c) of FIG. 7 is a diagram showing the potential in the cross-section taken along A-A' in (b) of FIG. 7. The device illustrated in FIG. 7 has the configuration in FIG. 6 further including fifth semiconductor layer 2105 having the second conductivity type, photoelectric converter 2201, and multiplication region 2202. In this case, breakdown voltage VBD can be advantageously reduced because multiplication region 2202 where a high electric field is generated is restricted to a shallow region of semiconductor substrate 2001.

Figure 8:
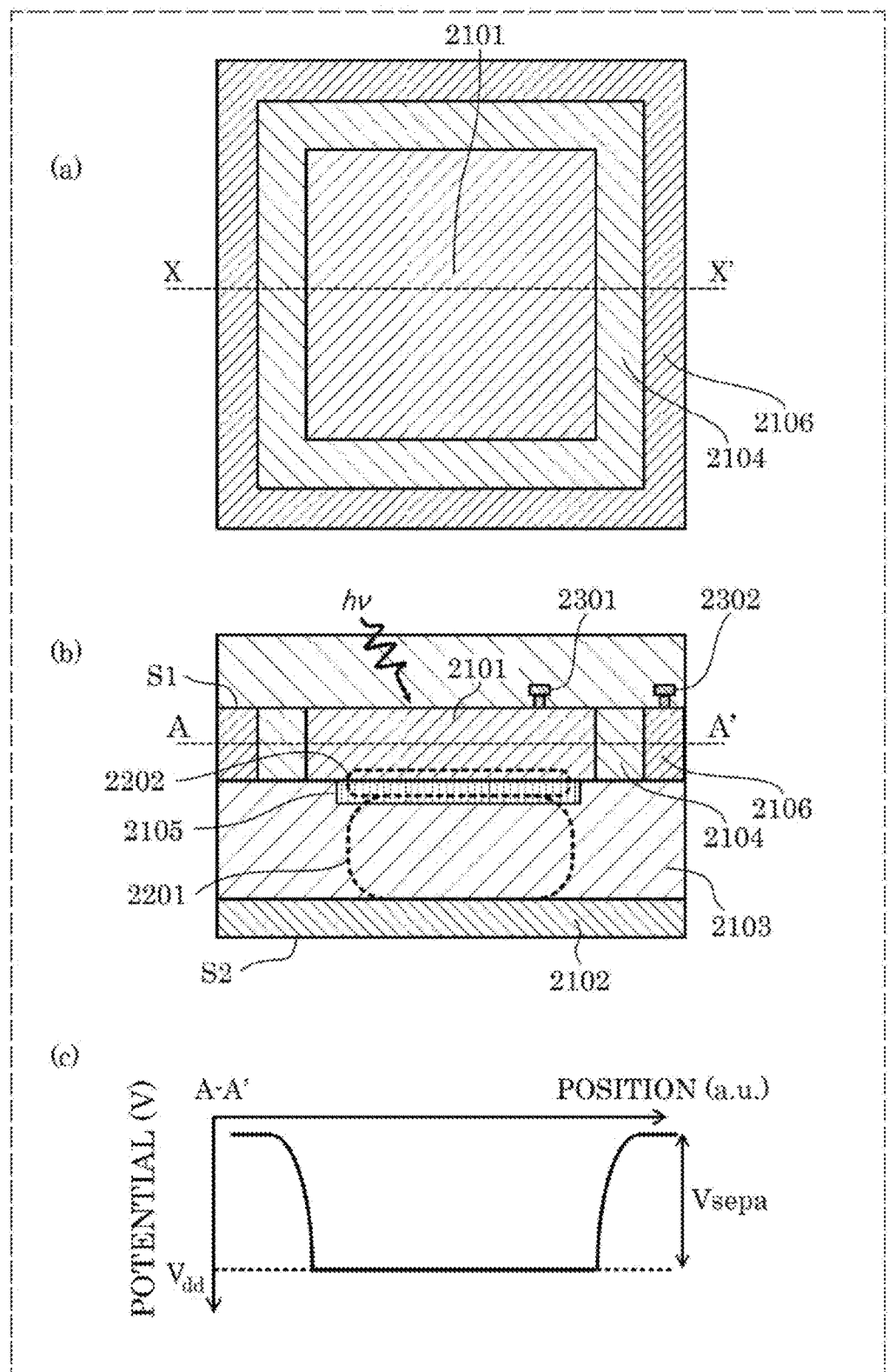
FIG. 8 is a diagram illustrating another example of the device configuration of the APD included in the photosensor according to the embodiment.

Next, another example of the device configuration of APD 1001 included in the photosensor according to the present embodiment will be described with reference to FIG. 8. (a) of FIG. 8 is a plan view of APD 1001, (b) of FIG. 8 is a cross-sectional view taken along X-X' in (a) of FIG. 8, and (c) of FIG. 8 is a diagram showing the potential in the cross-section taken along A-A' in (b) of FIG. 8. The device illustrated in FIG. 8 has the configuration illustrated in FIG. 7 further including sixth semiconductor layer 2106 having the second conductivity type around fourth semiconductor layer 2104 in planar view. Second electrode 2302 is disposed inside wiring layer 2002 to be connected to sixth semiconductor layer 2106. Second semiconductor layer 2102, third semiconductor layer 2103, fourth semiconductor layer 2104, and fifth semiconductor layer 2105 are set at voltage VA through second electrode 2302 and sixth semiconductor layer 2106. Such a configuration can increase the potential barrier between adjacent photosensors to further reduce the leakage of charges. Although first semiconductor layer 2101, fourth semiconductor layer 2104, and sixth semiconductor layer 2106 have the same depth (i.e., the same thickness) in FIG. 8, the depths (i.e., the thicknesses) of first semiconductor layer 2101, fourth semiconductor layer 2104, and sixth semiconductor layer 2106 can have any other relation.

Figure 9:
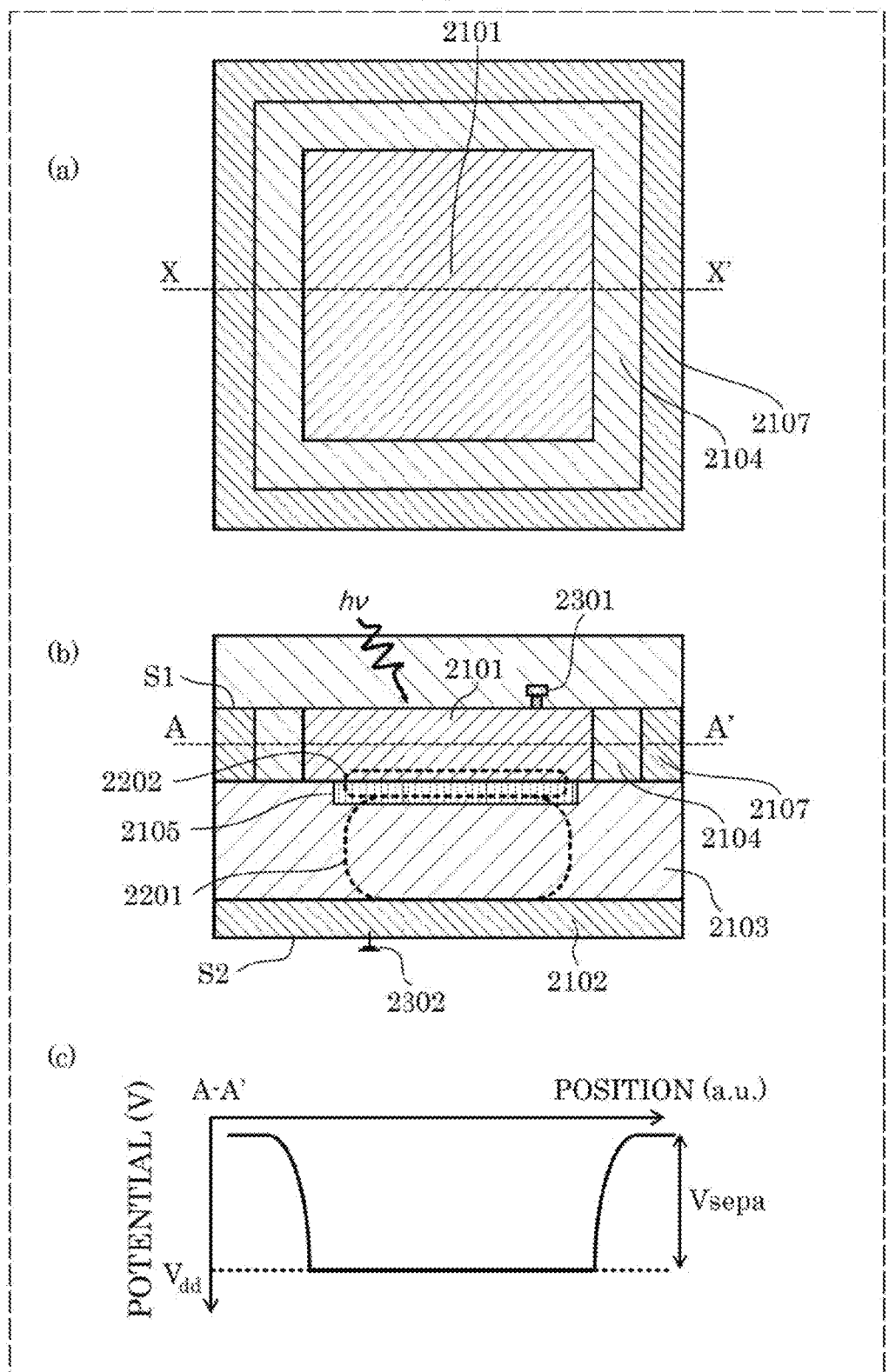
FIG. 9 is a diagram illustrating another example of the device configuration of the APD included in the photosensor according to the embodiment.

Next, another example of the device configuration of APD 1001 included in the photosensor according to the present embodiment will be described with reference to FIG. 9. (a) of FIG. 9 is a plan view of APD 1001, (b) of FIG. 9 is a cross-sectional view taken along X-X' in (a) of FIG. 9, and (c) of FIG. 9 is a diagram showing the potential in the cross-section taken along A-A' in (b) of FIG. 9. The device in illustrated in FIG. 9 has the configuration illustrated in FIG. 7 further including seventh semiconductor layer 2107 as an insulative layer around fourth semiconductor layer 2104 in planar view. Such a configuration can increase the potential barrier between adjacent photosensors to further reduce the leakage of charges. Although first semiconductor layer 2101, fourth semiconductor layer 2104, and seventh semiconductor layer 2107 have the same depth (i.e., the same thickness) in the illustration in FIG. 9, the depths (i.e., the thicknesses) of first semiconductor layer 2101, fourth semiconductor layer 2104, and seventh semiconductor layer 2107 can have any other relation. In particular, seventh semiconductor layer 2107 having a depth (or thickness) larger than those of first semiconductor layer 2101 and fourth semiconductor layer 2104 can increase the separation barrier.

Figure 10:
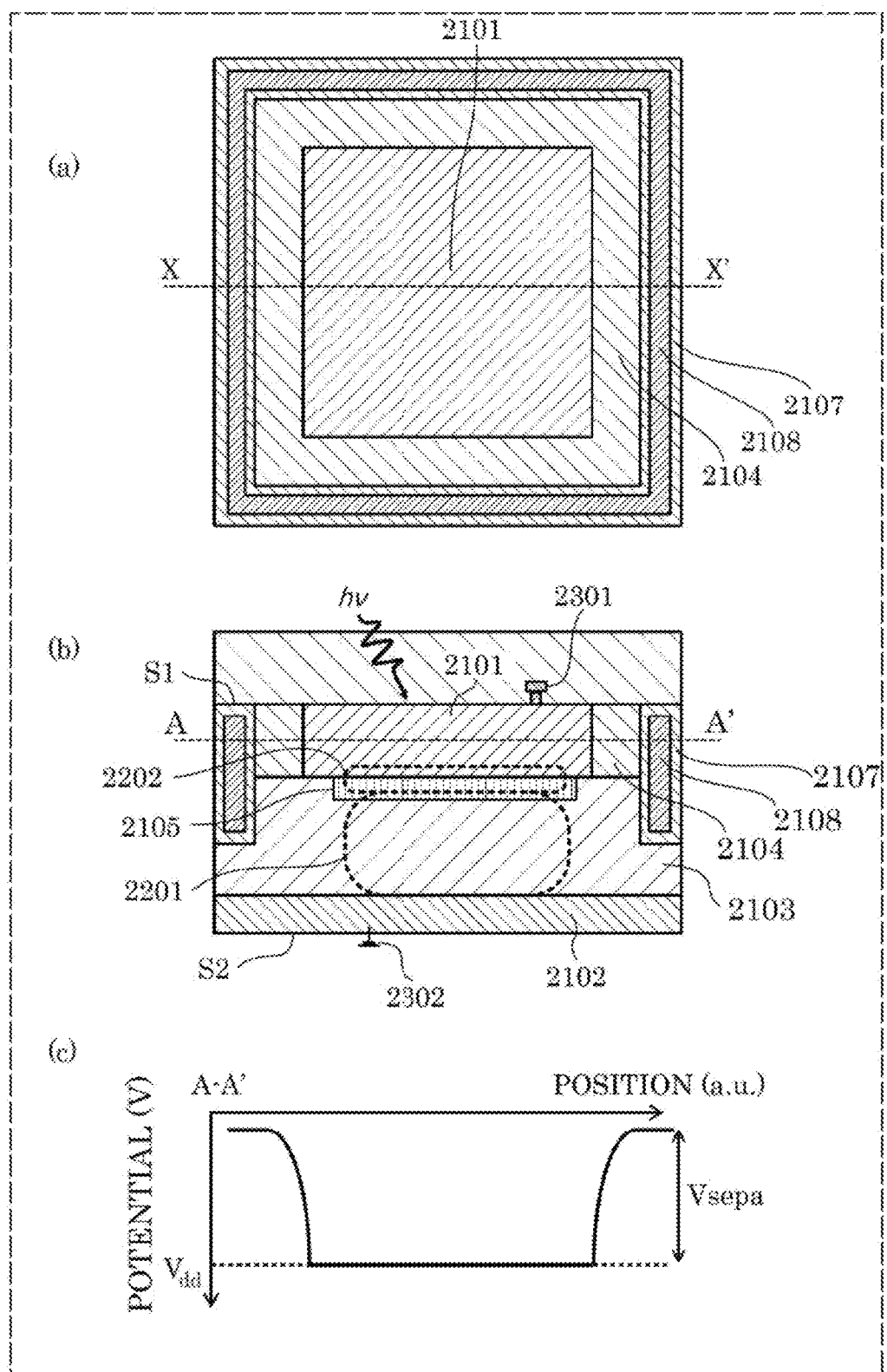
FIG. 10 is a diagram illustrating another example of the device configuration of the APD included in the photosensor according to the embodiment.

Next, another example of the device configuration of APD 1001 included in the photosensor according to the present embodiment will be described with reference to FIG. 10. (a) of FIG. 10 is a plan view of APD 1001, (b) of FIG. 10 is a cross-sectional view taken along X-X' in (a) of FIG. 10, and (c) of FIG. 10 is a diagram showing the potential in the cross-section taken along A-A' in (b) of FIG. 10. The device illustrated in FIG. 10 has the configuration illustrated in FIG. 9 further including reflective plate 2108 inside seventh semiconductor layer 2107. Such a configuration can prevent optical crosstalk between adjacent photosensors to reduce mixing of colors. In particular, photons may be generated during scattering of charges in avalanche multiplication, and the surrounding pixels may be affected through the generated photons in some cases. Reflective plate 2108 can prevent such influences.

Although the device configurations in FIGS. 8 to 10 are based on the configuration in FIG. 7, these may be based on the configuration in FIG. 6 as long as adjacent photosensors are separated at a separation potential of overvoltage Vov or higher.

Figure 11:
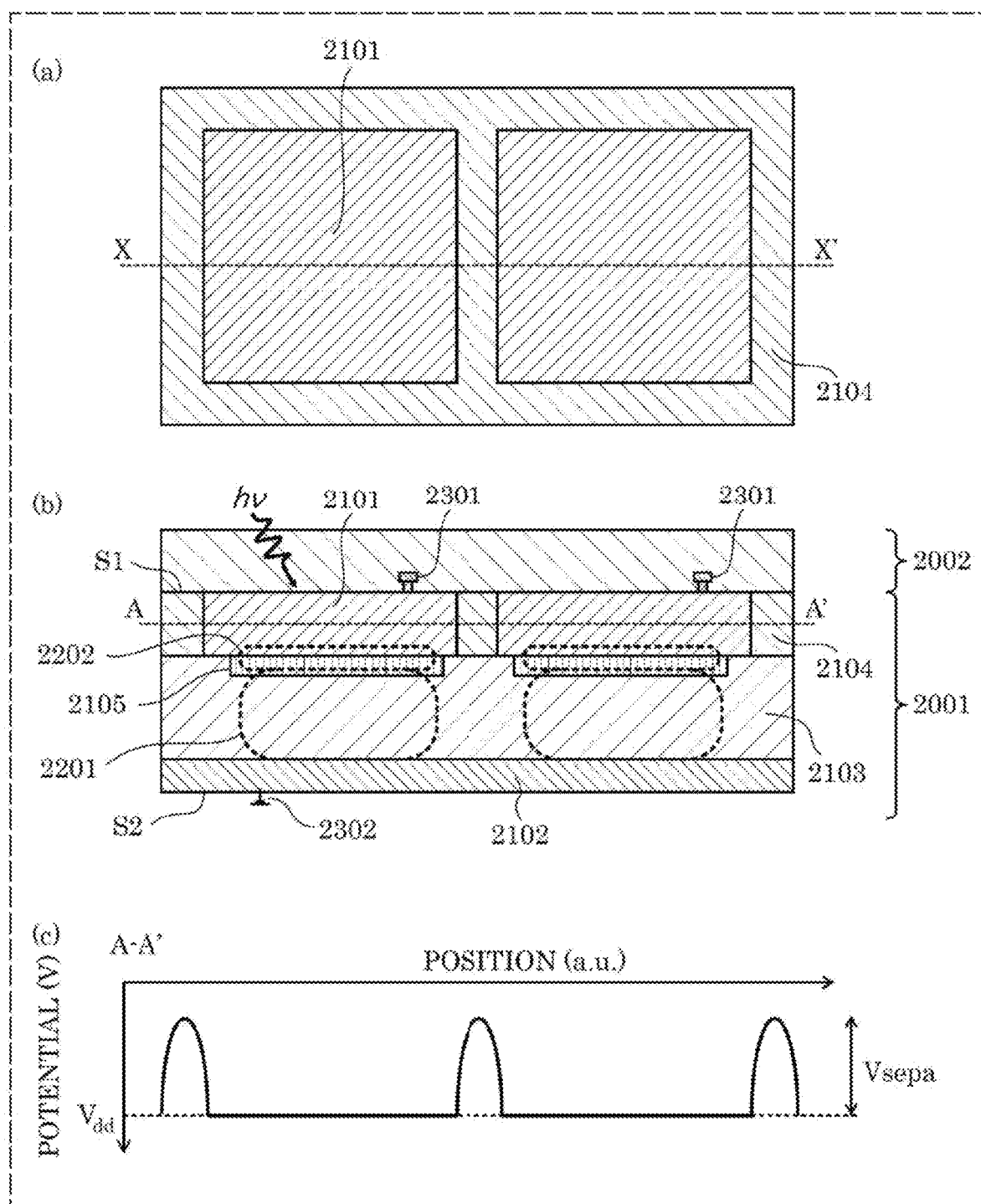
FIG. 11 is a diagram illustrating one example of the device configuration of the image sensor according to the embodiment, the image sensor including the APDs arranged in an array.

Next, one example of the device configuration of an image sensor according to the present embodiment including APDs 1001 arranged in an array will be described with reference to FIG. 11. (a) of FIG. 11 is a plan view of the image sensor, (b) of FIG. 11 is a cross-sectional view taken along X-X' in (a) of FIG. 11, and (c) of FIG. 11 is a diagram showing the potential in the cross-section taken along A-A' in (b) of FIG. 11. In the configuration illustrated in FIG. 11, APDs 1001 in FIG. 7 are arranged in an array, and first semiconductor layers 2101 in adjacent APDs are separated by fourth semiconductor layer 2104. In particular, fourth semiconductor layer 2104 is completely depleted. In this case, potential barrier Vsepa can be controlled by the impurity concentration in first semiconductor layer 2101, the impurity concentration in fourth semiconductor layer 2104, and the region width of fourth semiconductor layer 2104. Potential barrier Vsepa is larger than overvoltage Vov. The electric field in the traverse direction between first semiconductor layer 2101 and fourth semiconductor layer 2104 can be reduced by completely depleting fourth semiconductor layer 2104, thus preventing breakdown in the traverse direction. Such a configuration is advantageous in miniaturization because multiplication regions 2202 can be arranged in an array at a short interval.

Figure 12:
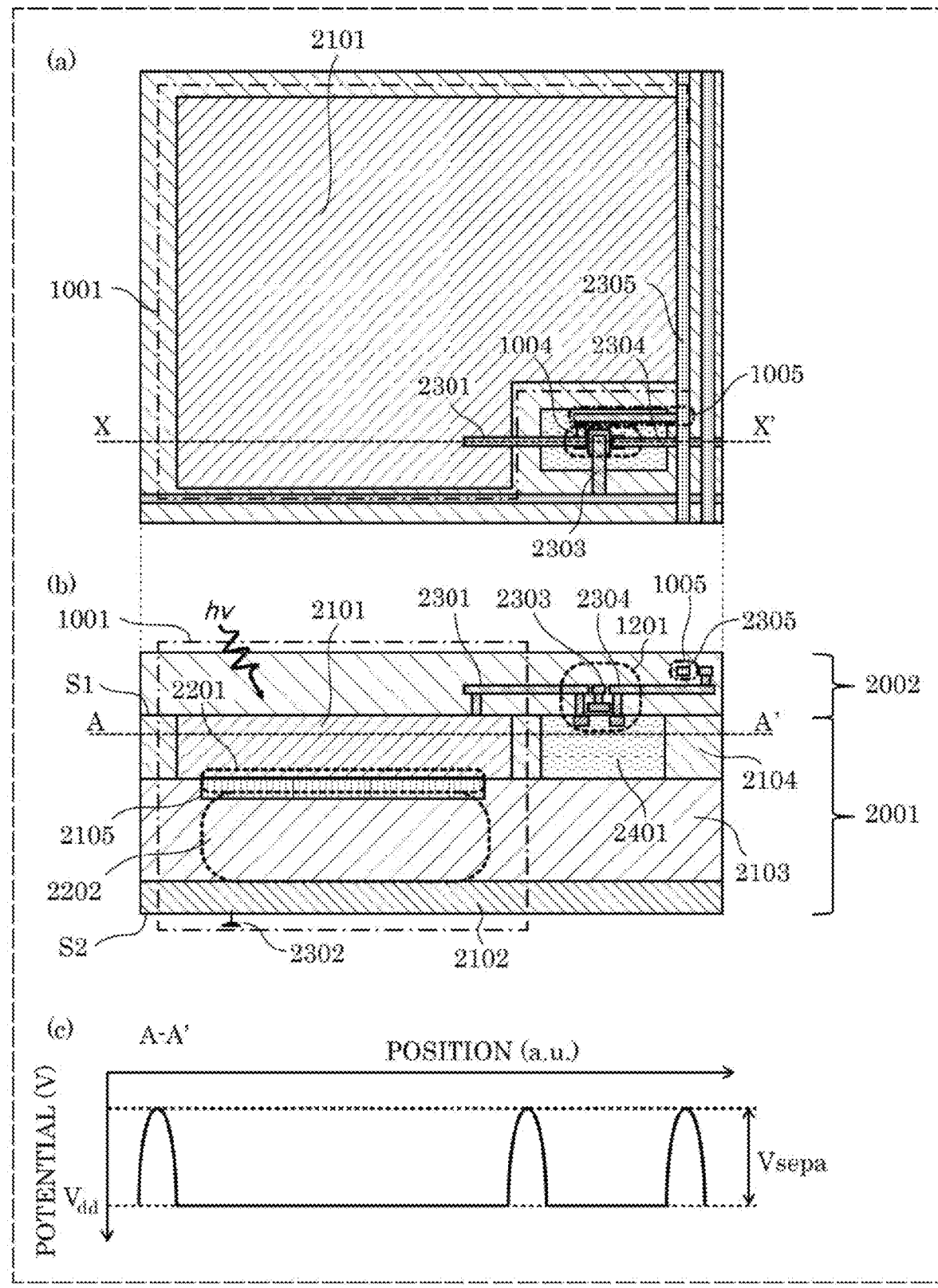
FIG. 12 is a diagram illustrating one example of the device configuration including the APD included in the photosensor according to the embodiment, a first transistor, and a read-out circuit.

Next, one example of the device configuration including APD 1001 included in the photosensor according to the present embodiment, first transistor 1201, and read-out circuit 1005 will be described with reference to FIG. 12. (a) of FIG. 12 is a plan view of APD 1001, first transistor 1201, and read-out circuit 1005. (b) of FIG. 12 is a cross-sectional view taken along X-X' in (a) of FIG. 12. (c) of FIG. 12 is a diagram showing the potential in the cross-section taken along A-A' in (b) of FIG. 12. The device in FIG. 12 has the configuration in FIG. 9 further including third electrode 2303 connected to the gate of first transistor 1201 to switch on/off first transistor 1201 by the voltage, fourth electrode 2304 connected to the drain of first transistor 1201 to fix the drain of first transistor 1201 to voltage VC, fifth electrode 2305 connected to APD 1001 through first electrode 2301 to read out the cathode voltage of APD 1001, and first well 2401, which is a well region of first transistor 1201 for resetting. In FIG. 12, read-out circuit 1005 corresponds to fifth electrode 2305, and directly reads out the charges generated in APD 1001 or a variation in voltage. In this case, as illustrated in (c) of FIG. 12, first semiconductor layer 2101 is separated from first well 2401 by fourth semiconductor layer 2104. Complete depletion of fourth semiconductor layer 2104 is desired, and the potential barrier for separation is Vsepa. Potential barrier Vsepa should be larger than overvoltage Vov. In such a configuration, APD 1001 is separated from first well 2401 to suppress flow of the charges generated by avalanche multiplication in APD 1001 through first well 2401 to read-out circuit 1005. Although the separation barrier between adjacent first semiconductor layers 2101 and the separation barrier between first semiconductor layer 2101 and first well 2401 are the same in the illustration in FIG. 12, it is not always necessary that they are the same. The potential barrier may be varied according to the position inside fourth semiconductor layer 2104. Here, first well 2401 desirably has a withstand voltage higher than that of multiplication region 2202. Such a configuration can prevent a flow of excessive current in first well 2401 caused by avalanche breakdown or Zener breakdown, and can provide the fixed potentials of first transistor 1201 and read-out circuit 1005 to maintain the properties of read-out circuit 1005 without depending on the voltage of the rear surface of the substrate.

Figure 13:
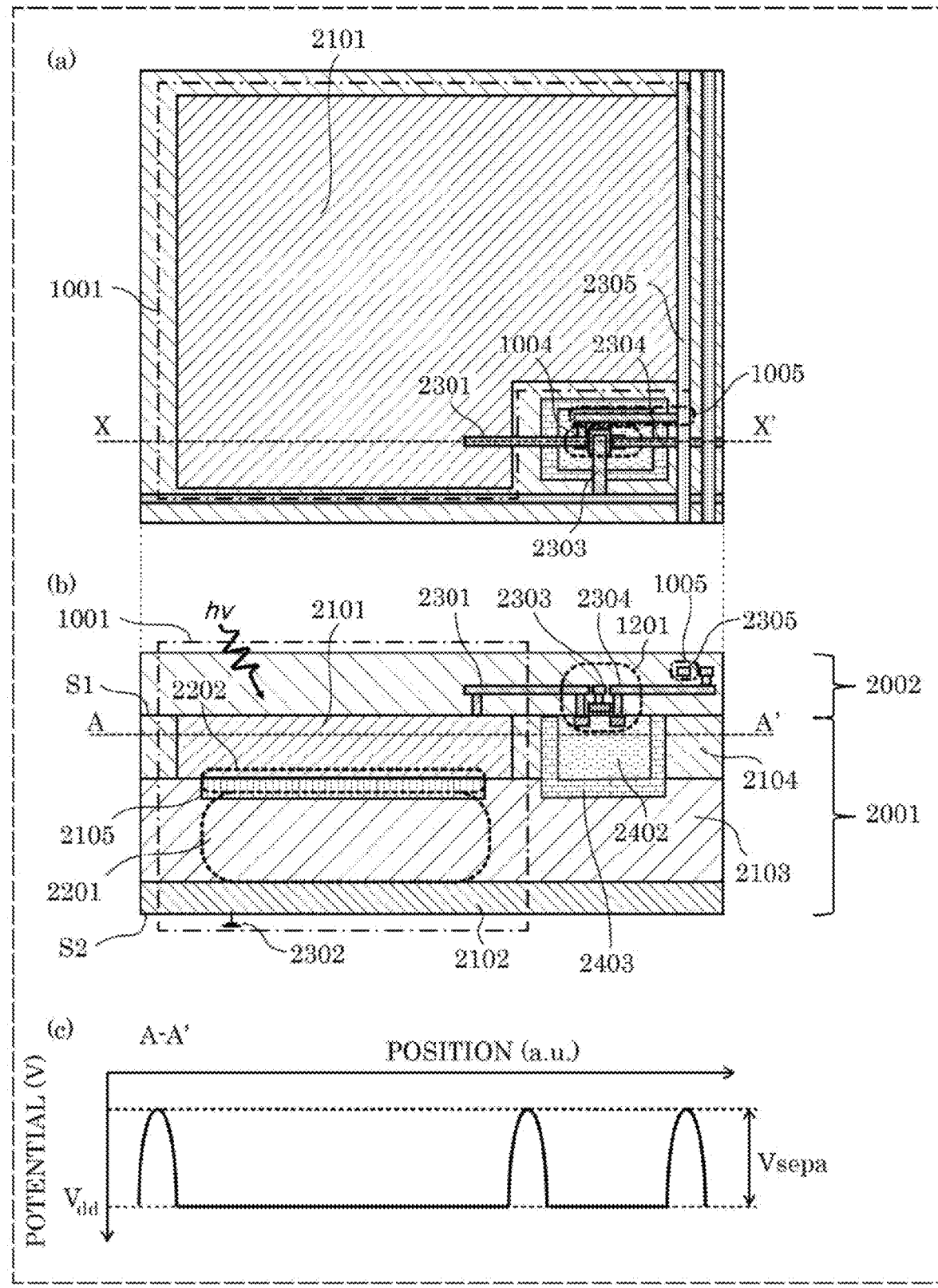
FIG. 13 is a diagram illustrating another example of the device configuration including APD included in the photosensor according to the embodiment, the first transistor, and the read-out circuit.

Next, another example of the device configuration including APD 1001 included in the photosensor according to the present embodiment, first transistor 1201, and read-out circuit 1005 will be described with reference to FIG. 13. (a) of FIG. 13 is a plan view of APD 1001, first transistor 1201, and read-out circuit 1005, (b) of FIG. 13 is a cross-sectional view taken along X-X' in (a) of FIG. 13, and (c) of FIG. 13 is a diagram showing the potential in the cross-section taken along A-A' in (b) of FIG. 13. In FIG. 13, first well 2401 in the configuration of FIG. 12 is configured of second well 2402 having second conductivity type and third well 2403 having the first conductivity type, and the conductivity type of first transistor 1201 corresponds to the first conductivity type. In this case, because second well 2402 is separated from second semiconductor layer 2102 by third well 2403, the potential of second well 2402 can be freely set to stably operate first transistor 1201.

Figure 14:
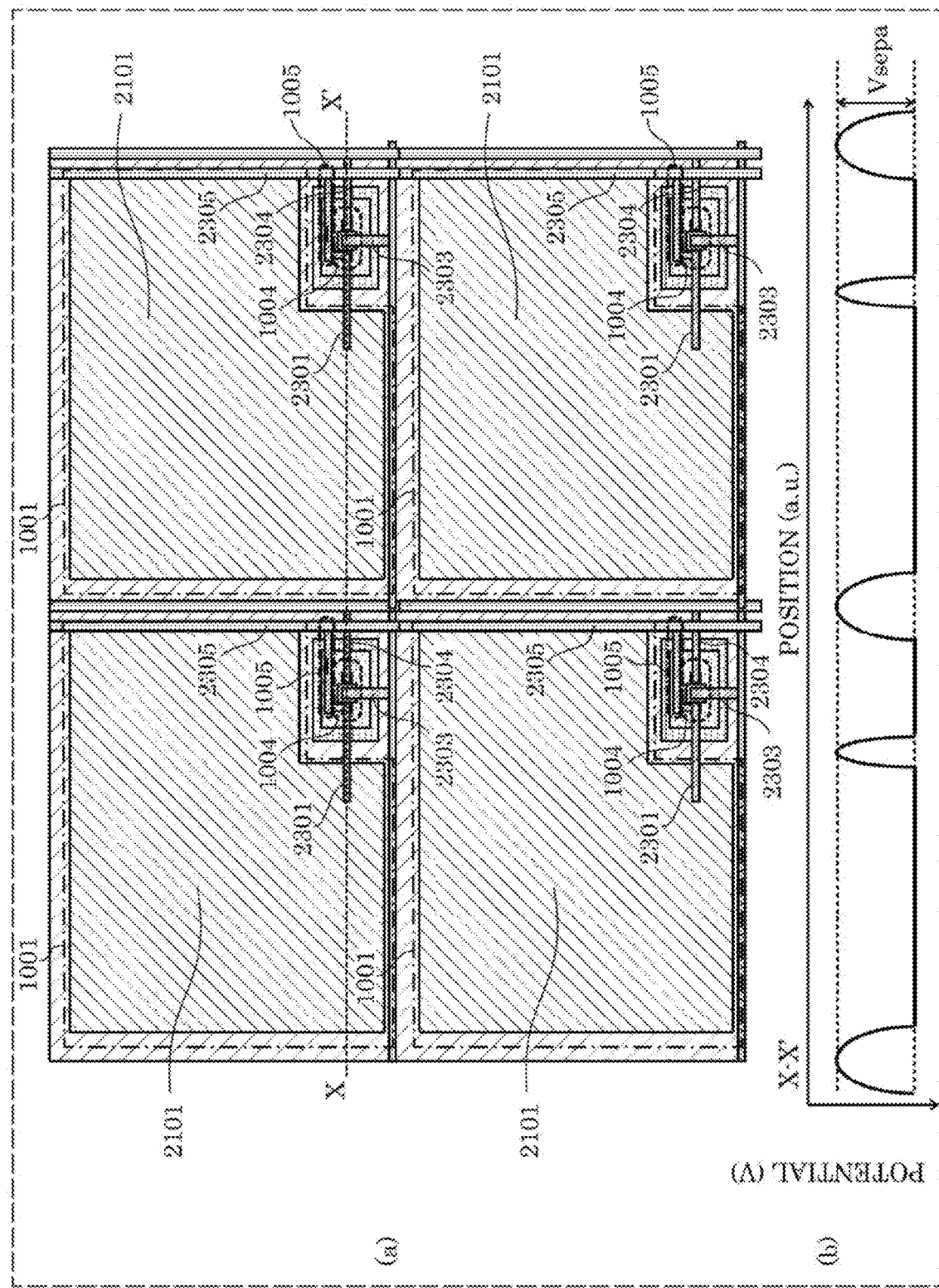
FIG. 14 is a diagram illustrating one example of the device configuration of the image sensor including a plurality of APDs illustrated in FIG. 13 and a plurality of read-out circuits.

FIG. 14 is a diagram illustrating one example of the device configuration of an image sensor including APDs 1001 and read-out circuits 1005 illustrated in FIG. 13. (a) of FIG. 14 is a plan view of the image sensor including APDs 1001 and read-out circuits 1005, and (b) of FIG. 14 is a diagram showing the potential in the cross-section taken along X-X' in (a) of FIG. 14. Although (a) of FIG. 14 illustrates an example in which one read-out circuit 1005 is disposed to one APD 1001, the image sensor may have a configuration in which one read-out circuit 1005 is shared with a plurality of APDs 1001. Although the separation width between first semiconductor layer 2101 and third well 2403 is shorter than that between adjacent first semiconductor layers 2101 in the illustration in FIG. 14, the separation width between adjacent first semiconductor layers 2101 and that between first semiconductor layer 2101 and third well 2403 may be the same, or the separation width between first semiconductor layer 2101 and third well 2403 may be larger than that between adjacent first semiconductor layers 2101.

Next, another example of the circuit configuration of the photosensor and the driving method according to the present embodiment will be described with reference to FIGS. 15 to 18.

Figure 15:
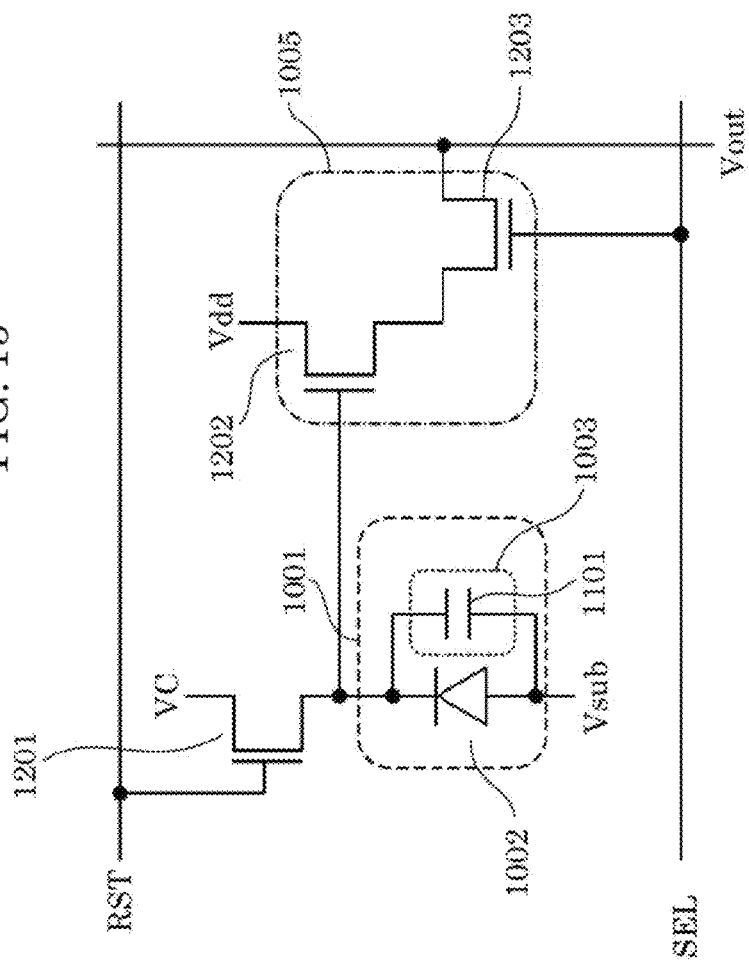
FIG. 15 is a diagram illustrating another example of the circuit configuration of the photosensor according to the embodiment.

FIG. 15 is a diagram illustrating another example of the circuit configuration of the photosensor according to the present embodiment. The circuit in FIG. 15 has the configuration in FIG. 4 in which read-out circuit 1005 further includes second transistor 1202 and third transistor 1203. The cathode of APD 1001 is connected to the gate electrode of second transistor 1202. Third transistor 1203 is connected to second transistor 1202 in series. The gate of third transistor 1203 is connected to the SEL terminal, and on/off of third transistor 1203 is controlled by the voltage of the SEL terminal. Thereby, the signal of the APD can be selectively read out when third transistor 1203 is turned on. The image sensor includes the circuits according to the present embodiment arranged in an array. In such an image sensor, the signals from the APDs can be converted into an image by sampling Vout while sequentially changing third transistor 1203 to be turned on.

Figure 16:
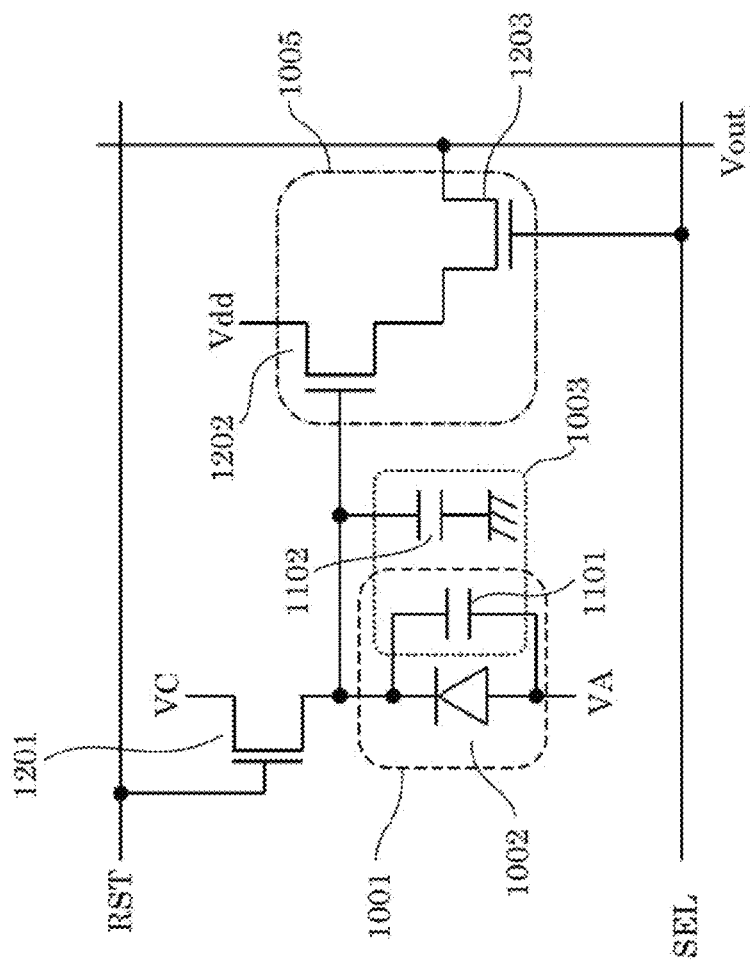
FIG. 16 is a diagram illustrating another example of the circuit configuration of the photosensor according to the embodiment.

FIG. 16 is a diagram illustrating another example of the circuit configuration of the photosensor according to the present embodiment. The circuit in FIG. 16 has the configuration in FIG. 15 in which first capacitor 1003 further includes parasitic capacitance 1102 connected to multiplication region 1002. Parasitic capacitance 1102 typically includes, but should not limited to, a junction capacitance of a contact connected to multiplication region 1002, a capacitance between a metal line and a substrate, a capacitance between the metal lines, the gate capacitance of second transistor 1202, a gate fringe capacitance, and a source capacitance of first transistor 1201. Although, of the ends of parasitic capacitance 1102, the end not connected to the APD is connected to the ground in FIG. 16, the end does not need to be always connected to the ground. Thereby, the capacitance value of the capacitance related to quenching can be adjusted to control the amount of charges to be generated.

Figure 17:
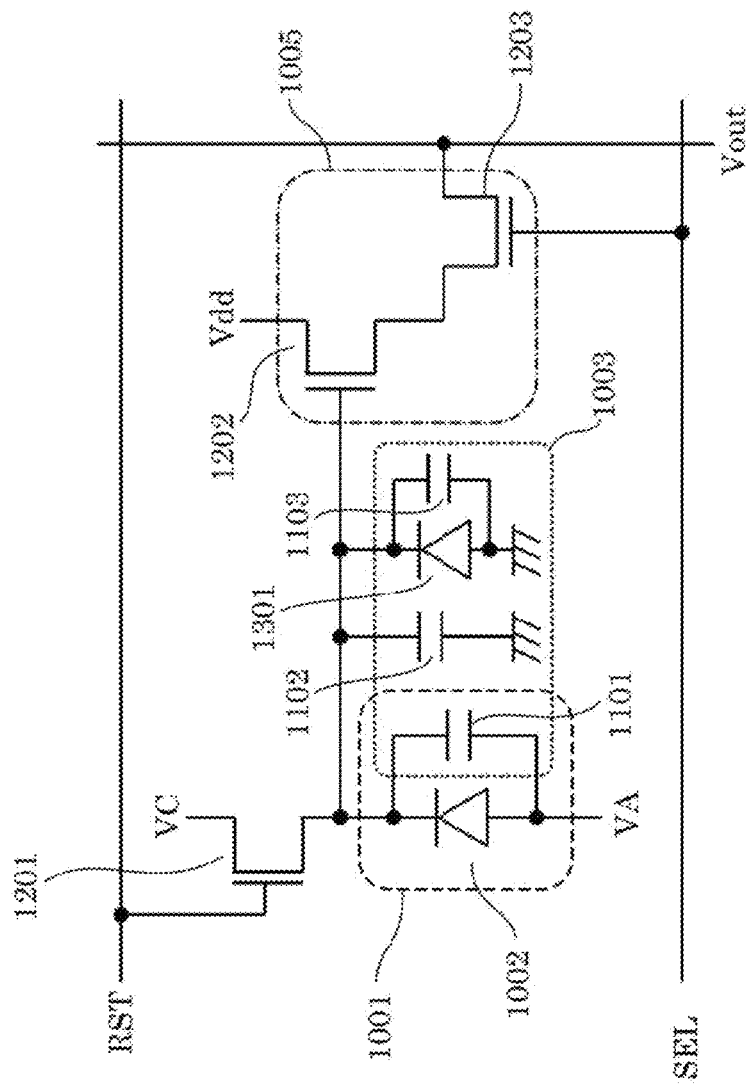
FIG. 17 is a diagram illustrating another example of the circuit configuration of the photosensor according to the embodiment.

FIG. 17 is a diagram illustrating another example of the circuit configuration of the photosensor according to the present embodiment. The circuit in FIG. 17 has the configuration in FIG. 16 in which first capacitor 1003 further includes junction capacitance 1103 of P-N junction 1301 connected to multiplication region 1002 with a line. P-N junction 1301 is a junction between the source or drain of first transistor 1201 and the well. Thereby, the capacitance value of the capacitance related to quenching can be further adjusted. Moreover, the charges generated in the multiplication region can be discharged through P-N junction 1301 to the ground. In this case, cathode voltage VC is desirably a positive voltage.

The circuit configurations illustrated in FIGS. 15 to 17 enable disconnection of multiplication region 1002 from a signal line or a pad to reduce the capacitance value of first capacitor 1003 and reduce the amount of charges generated by avalanche multiplication. Thus, power consumption can be reduced, providing a read-out circuit having a higher speed.

Figure 18:
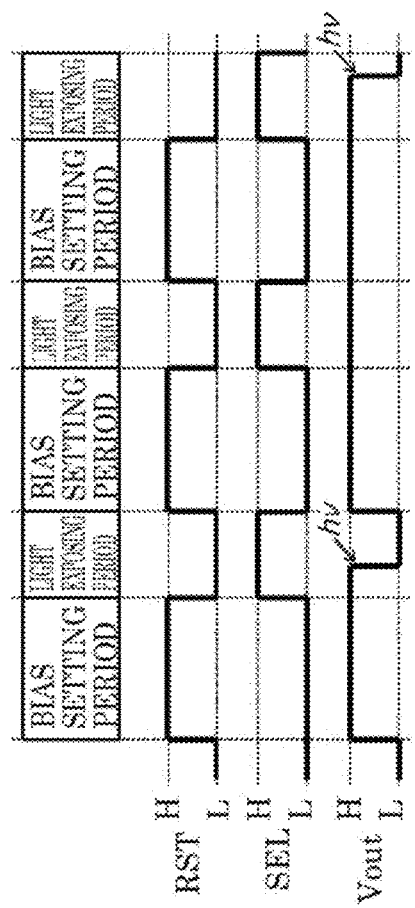
FIG. 18 is a timing chart illustrating one example of the driving method for the photosensors illustrated in FIGS. 15 to 17.

FIG. 18 is a timing chart illustrating one example of the driving method for the photosensors illustrated in FIGS. 15 to 17. Here, the bias voltage of the SEL terminal ("SEL" in the chart) in FIGS. 15 to 17 is also shown in addition to the voltages shown in FIG. 5. By increasing the voltage applied to the SEL terminal during the light exposing period in addition to the drive in FIG. 5, the voltage of the cathode of APD 1001 can be output to the Vout terminal. Thereby, APD 1001 which outputs the voltage can be selected. By outputting the output from the selected APD 1001 according to the coordinates, the distribution of the detected photons can be output as an image.

Figure 19:
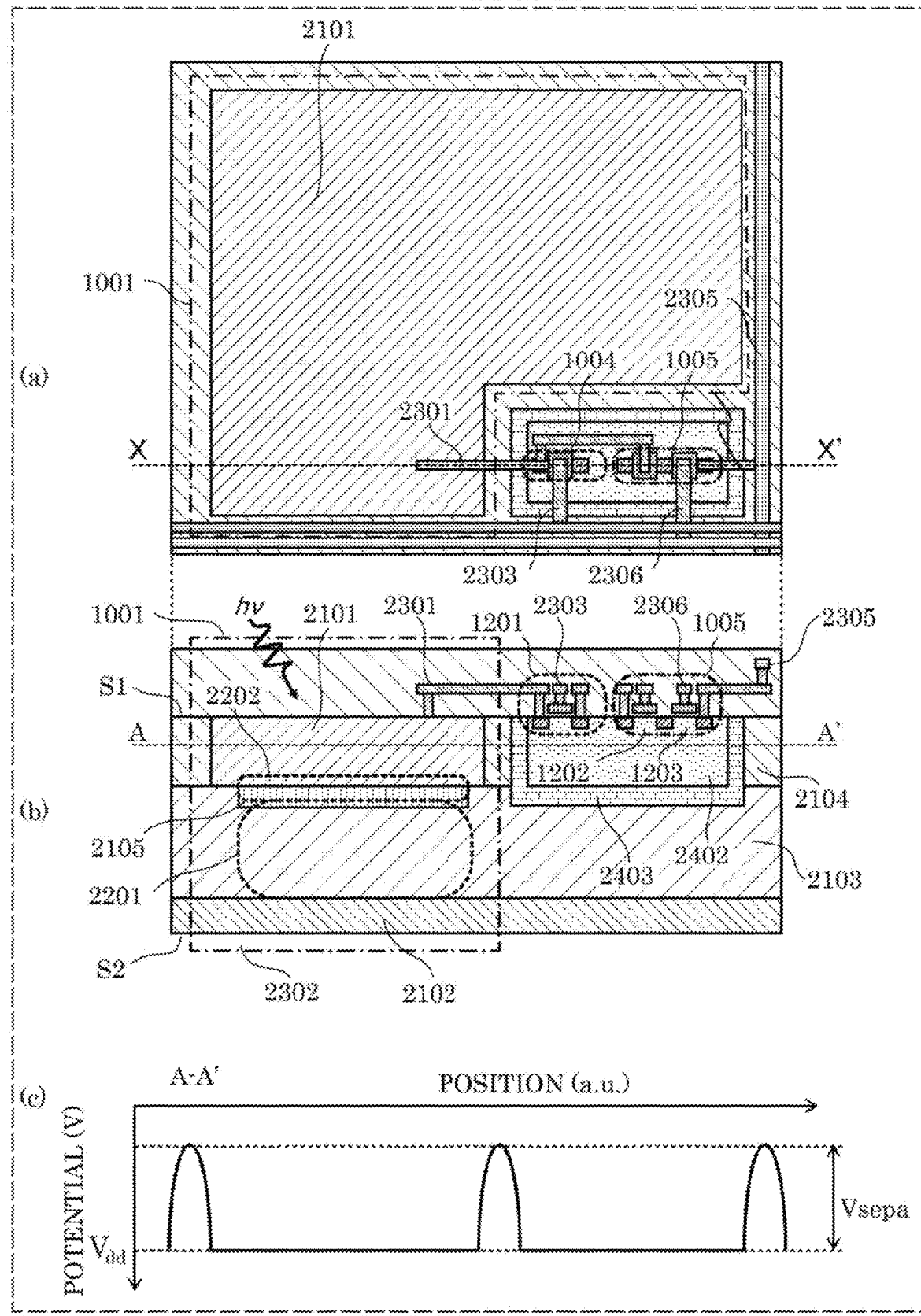
FIG. 19 is a diagram illustrating one example of the device configuration of the APD included in the photosensors illustrated in FIGS. 15 to 18.

Next, the device configuration of APD 1001 included in the photosensors illustrated in FIGS. 15 to 18 will be described with reference to FIG. 19. To avoid complexity of illustration, the lines of the drain power supplies for fourth electrode 2304 and second transistor 1202 are partially omitted. (a) of FIG. 19 is a plan view of APD 1001, first transistor 1201, and read-out circuit 1005. (b) of FIG. 19 is a cross-sectional view taken along X-X' in (a) of FIG. 19. (c) of FIG. 19 is a diagram showing the potential in the cross-section taken along A-A' in (b) of FIG. 19.

The device in FIG. 19 has a configuration in FIG. 13 in which second transistor 1202 and third transistor 1203 are included as read-out circuit 1005. First semiconductor layer 2101 of APD 1001 is connected to the source of first transistor 1201 and the gate of second transistor 1202 through first electrode 2301. The gate of the third transistor is connected to sixth electrode 2306. A voltage is applied to the gate through sixth electrode 2306 to select APD 1001 which reads the signal. The signal is read out through fifth electrode 2305.

Figure 21:
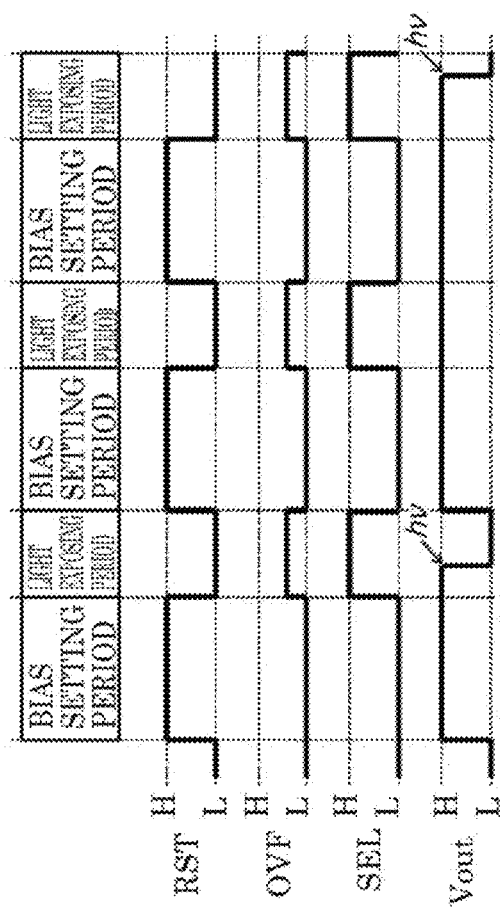
FIG. 21 is a timing chart illustrating one example of the driving method for the photosensor illustrated in FIG. 20.
Figure 22:
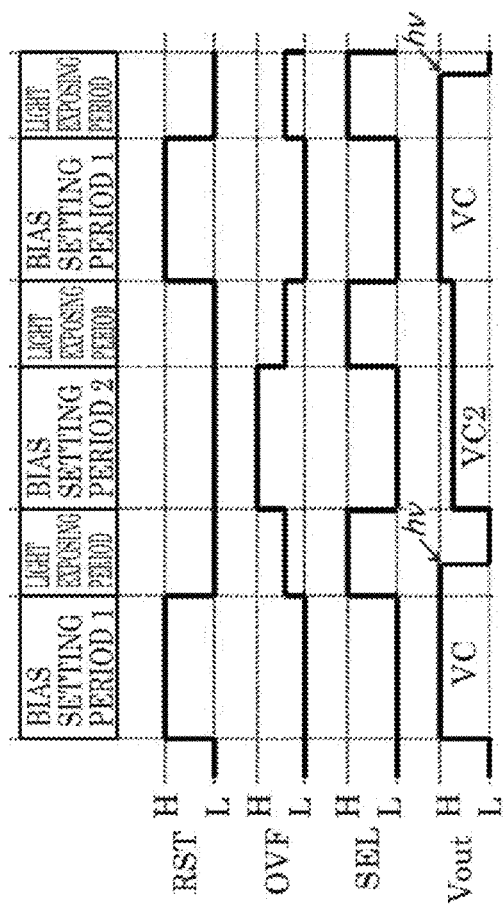
FIG. 22 is a timing chart illustrating another example of the driving method for the photosensor illustrated in FIG. 20.

Next, another example of the circuit configuration of the photosensor and the circuit driving method according to the present embodiment will be described with reference to FIGS. 20 to 22.

Figure 20:
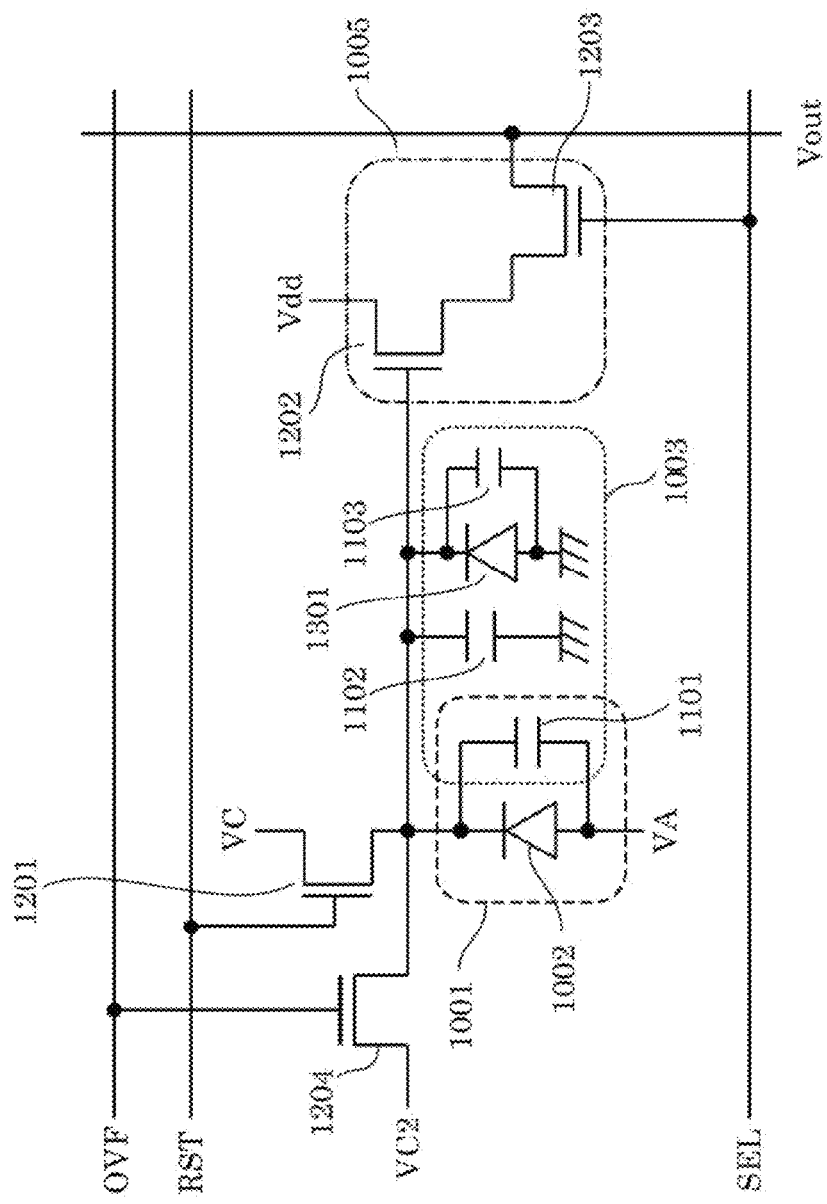
FIG. 20 is a diagram illustrating another example of the circuit configuration of the photosensor according to the embodiment.

FIG. 20 is a diagram illustrating another example of the circuit configuration of the photosensor according to the present embodiment. The circuit has the circuit configuration in FIG. 17 further including fourth transistor 1204, which is one example of the second reset transistor connected between APD 1001 (more specifically, multiplication region 1002) and a second power supply (voltage VC2) to connect the gate electrode to the OVF line. FIGS. 21 and 22 are timing charts each showing one example of the driving method for the photosensor illustrated in FIG. 20. FIGS. 21 and 22 show the bias voltage of the OVF line ("OVF" in the drawing) in addition to the voltages shown in FIG. 18. In FIG. 21, the RST terminal is set to the high bias in the bias setting period to reset APD 1001. In the light exposing period, the RST terminal is set to the low bias, and the OVF line is set to an intermediate value between the low bias and the high bias of the RST terminal. Thereby, excessive charges generated in APD 1001 are discharged through fourth transistor 1204. FIG. 22 shows the driving method in which bias setting period 1 and bias setting period 2 are alternately repeated. APD 1001 is reset through first transistor 1201 in bias setting period 1, and is reset through fourth transistor 1204 in bias setting period 2. Thereby, APD 1001 can be set at different voltages during different bias setting periods to modulate the amount of charges to be generated.

A driving method of resetting the APD through fourth transistor 1204 in all the bias setting periods may be used. A driving method of setting fourth transistor 1204 to the low bias or the high bias in the light exposing period is also included in the present embodiment. In this circuit configuration, first capacitor 1003 may include the junction capacitance of the source or drain of fourth transistor 1204.

Next, another example of the circuit configuration of the photosensor, the driving method, and the device configuration according to the present embodiment will be described with reference to FIGS. 23 to 29.

Figure 23:
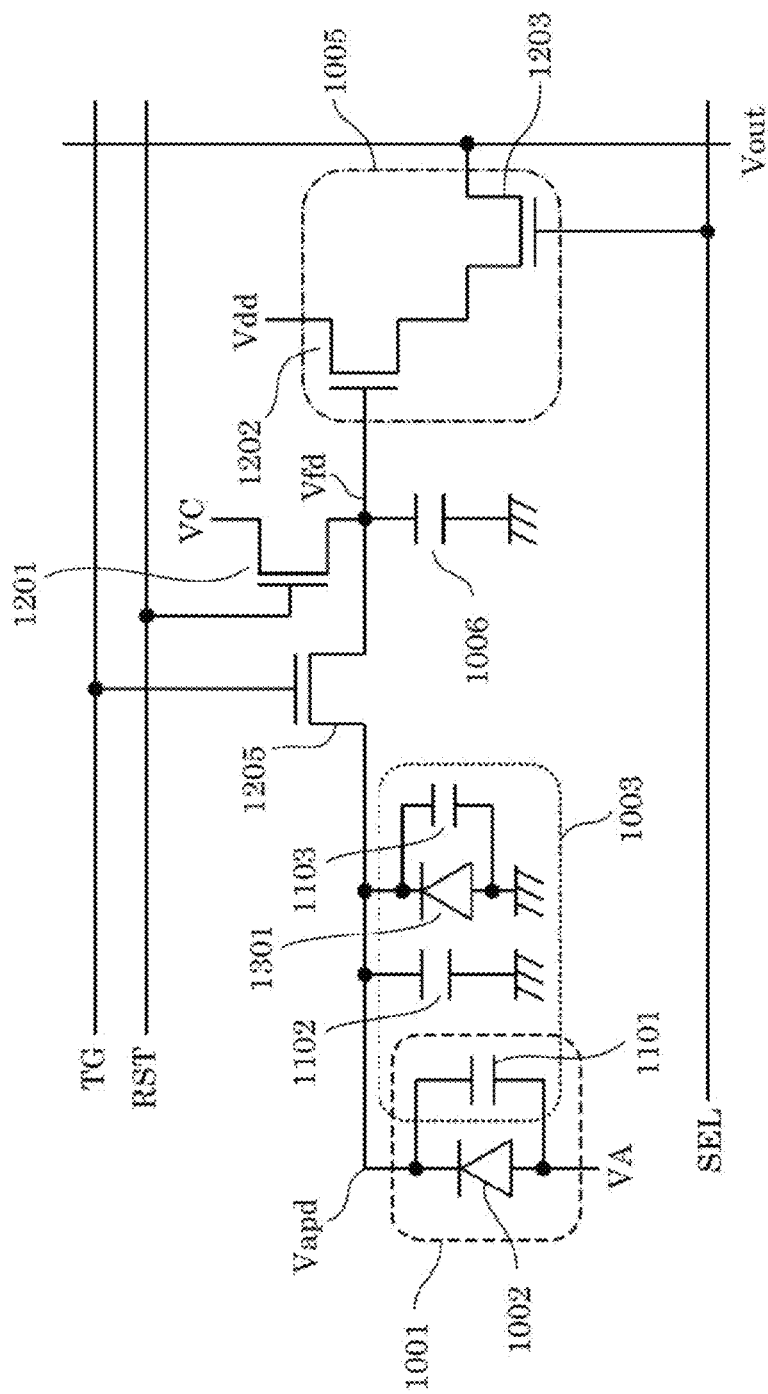
FIG. 23 is a diagram illustrating another example of the circuit configuration of the photosensor according to the embodiment.

FIG. 23 is a diagram illustrating another example of the circuit configuration of the photosensor according to the present embodiment. The circuit has the circuit configuration in FIG. 20 further including fifth transistor 1205, which is one example of a transfer transistor connected between (i) APD 1001 and (ii) first transistor 1201 and read-out circuit 1005, and second capacitor 1006 connected to multiplication region 1002 through fifth transistor 1205. Second capacitor 1006 includes a drain capacitance of fifth transistor 1205, a source capacitance of first transistor 1201, a gate capacitance of second transistor 1202, a gate fringe capacitance, a line capacitance, and an MIM capacitance. First capacitor 1003 may include the junction capacitance of the source or drain of fifth transistor 1205.

Figure 24:
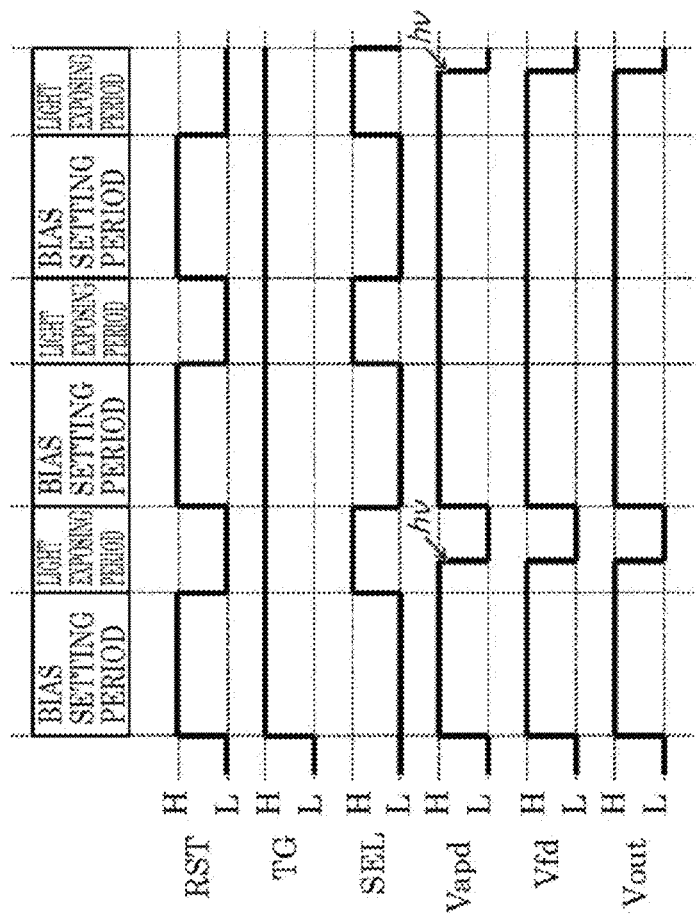
FIG. 24 is a timing chart illustrating one example of the driving method for the photosensor illustrated in FIG. 23.

FIG. 24 is a timing chart showing one example of the driving method for the photosensor illustrated in FIG. 23. Here, the bias voltage of the TG terminal, the bias voltage of the SEL terminal, voltage Vapd, and voltage Vfd are shown in addition to the voltages shown in FIG. 18. Voltage Vapd and voltage Vfd are the biases of the nodes illustrated in FIG. 23, and correspond to the voltage of the cathode of APD 1001 and the voltage of second capacitor 1006 on the side of read-out circuit 1005, respectively. In the bias setting period, the TG terminal and the RST terminal are set to the high bias to reset APD 1001. Thereby, voltage Vapd and voltage Vfd are set to voltage VC. In the light exposing period, the TG terminal is set to the high bias and the RST terminal is set to the low bias. Thereby, voltage Vapd and voltage Vfd are disconnected from the first power supply (voltage VC), causing capacitance quenching of APD 1001. At this time, capacitance value C in equation (7) corresponds to the sum of the capacitance values of first capacitor 1003 and second capacitor 1006. Thereby, compared to the case where only first capacitor 1003 is included, the amount of charges generated by avalanche multiplication can be increased, thus increasing the S/N ratio.

Figure 25:
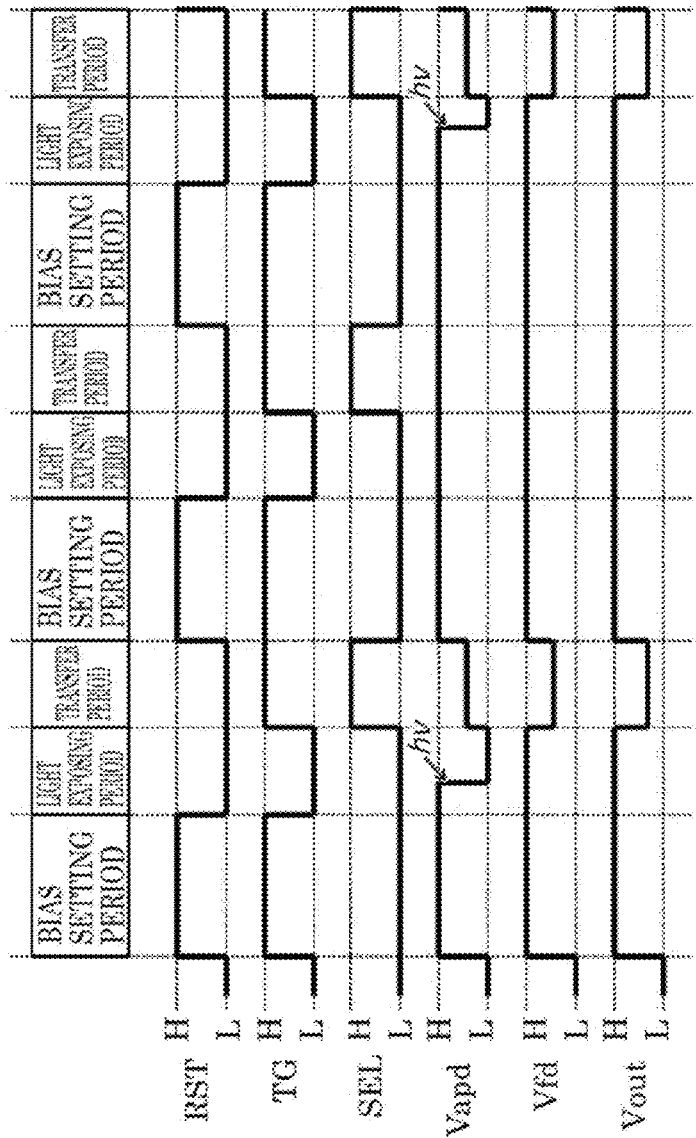
FIG. 25 is a timing chart illustrating another example of the driving method for the photosensor illustrated in FIG. 23.

FIG. 25 is a timing chart showing another example of the driving method for the photosensor illustrated in FIG. 23. Here, the voltages at the same places in FIG. 24 are shown. In this case, the bias setting period, the light exposing period, and the transfer period are alternately repeated. In the bias setting period, the TG terminal and the RST terminal are set to the high bias to reset APD 1001. Thereby, Vapd and Vfd are set to voltage VC. In the light exposing period, the TG terminal and the RST terminal are set to the low bias. Thereby, APD 1001 is disconnected from the first power supply (voltage VC), causing capacitance quenching of APD 1001. At this time, capacitance value C of equation (7) corresponds to only the capacitance value of first capacitor 1003. In the transfer period, the TG terminal is set to the high bias and the RST terminal is set to the low bias. Thereby, the charges generated in APD 1001 and accumulated in first capacitor 1003 are transferred to second capacitor 1006, and are read out through read-out circuit 1005.

Although FIG. 25 shows the case where the charges generated in first capacitor 1003 are transferred by capacitance distribution, the charges generated in first capacitor 1003 may all be transferred by complete transfer without undergoing capacitance distribution. When the charges generated by avalanche multiplication are transferred by capacitance distribution, the noises of the voltage amplitude generated during avalanche multiplication are distributed to first capacitor 1003 and second capacitor 1006, thus reducing a variation in amplitude. In contrast, when the charges generated by avalanche multiplication are transferred by complete transfer, the voltage amplitude can be increased by the ratio of the capacitance value of first capacitor 1003 and capacitance value of second capacitor 1006, thus increasing the S/N ratio.

Figure 26:
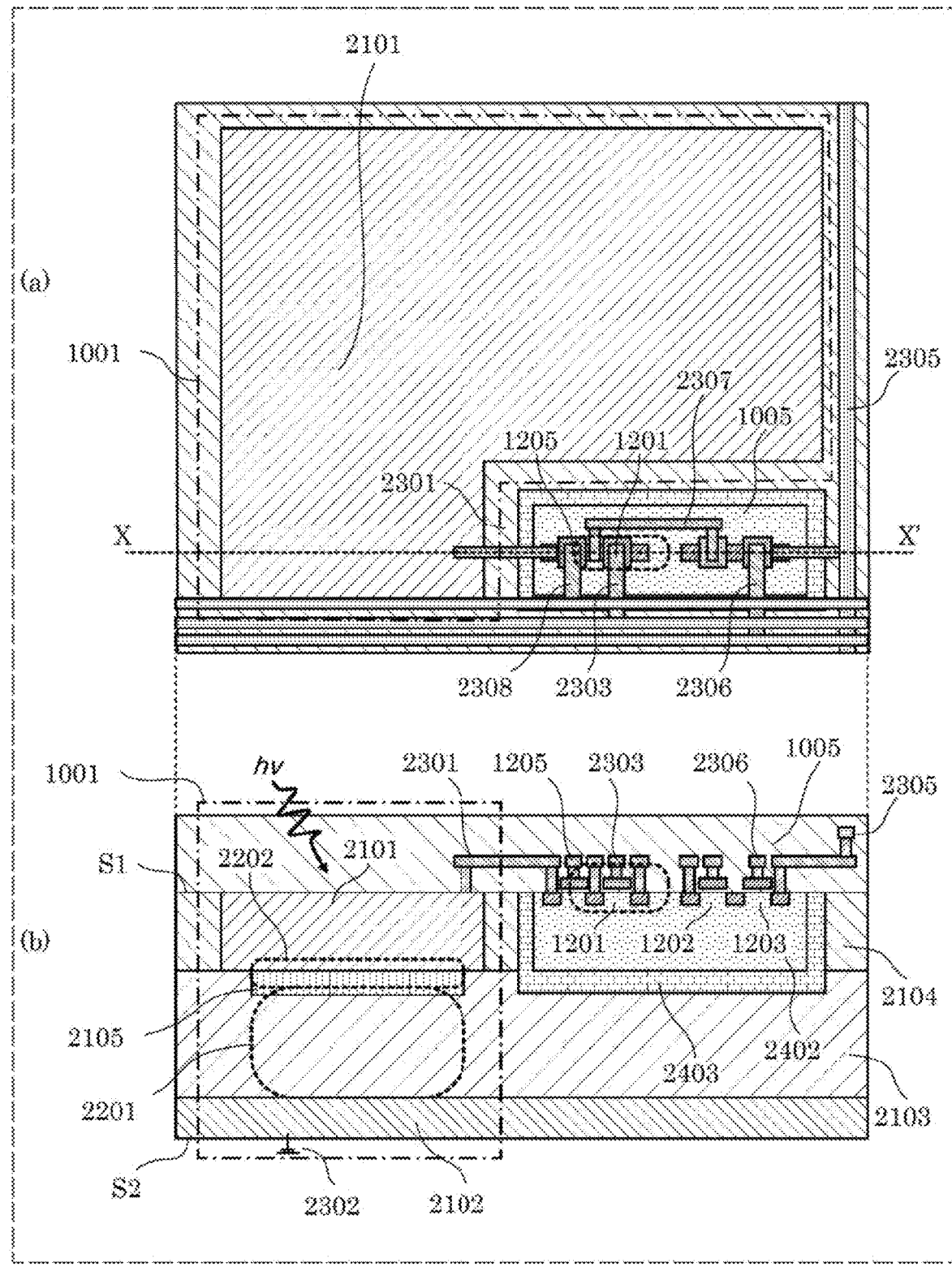
FIG. 26 is a diagram illustrating one example of the device configuration of the photosensor illustrated in FIG. 23.

FIG. 26 is a diagram illustrating one example of the device configuration of the photosensor illustrated in FIG. 23. (a) of FIG. 26 is a plan view of APD 1001, first transistor 1201, and read-out circuit 1005. (b) of FIG. 26 is a cross-sectional view taken along X-X' in (a) of FIG. 26. The device in FIG. 26 has the device structure in FIG. 19 further including fifth transistor 1205, seventh electrode 2307, which is an electrode connecting fifth transistor 1205 to the gate of second transistor 1202, and eighth electrode 2308, which is the gate electrode of fifth transistor 1205. Fifth transistor 1205 is connected from APD 1001 through first electrode 2301. Fifth transistor 1205 is connected to the gate of second transistor 1202 through seventh electrode 2307. A voltage is applied to the gate of fifth transistor 1205 through eighth electrode 2308 to switch on/off fifth transistor 1205.

Figure 27:
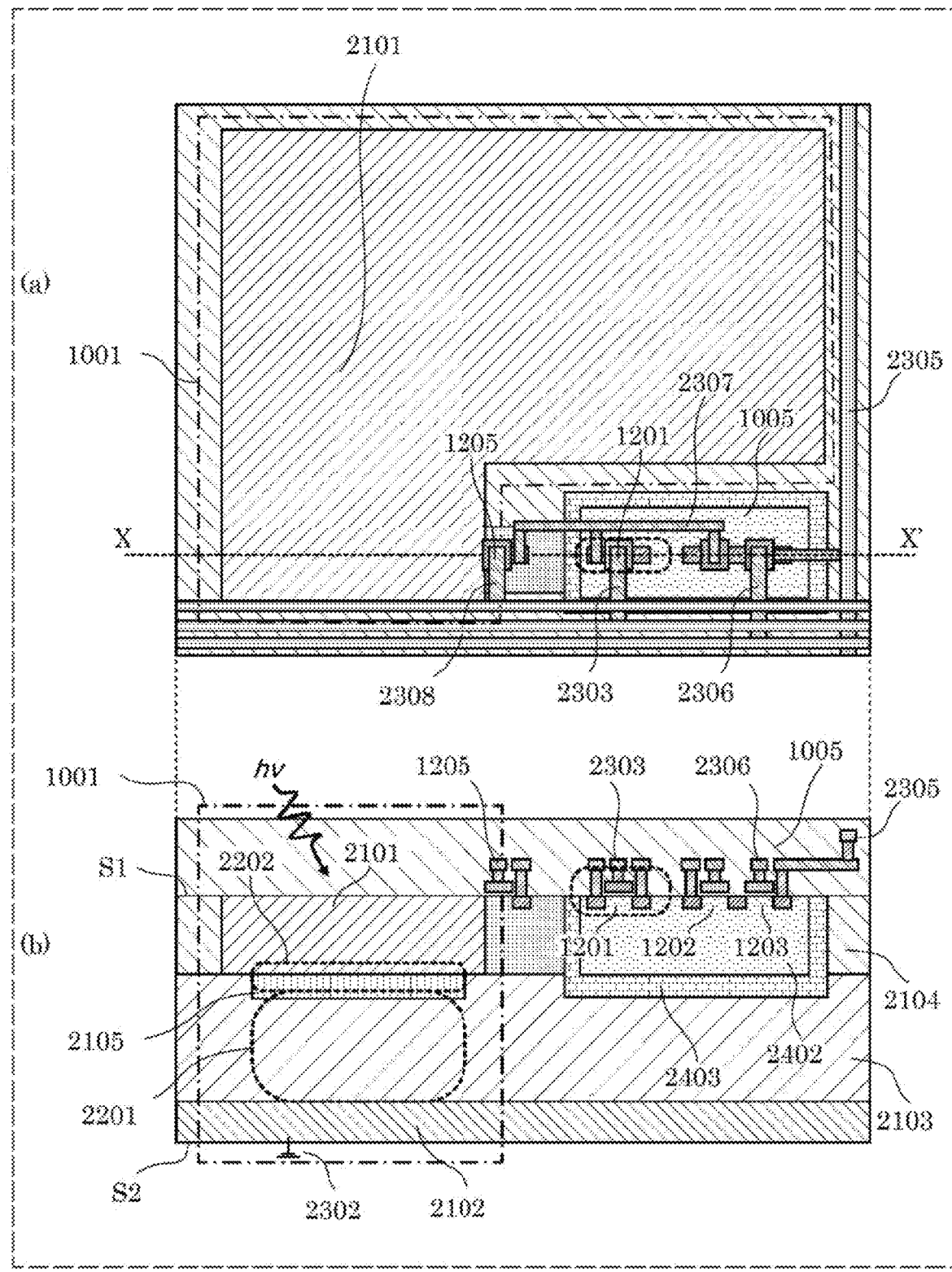
FIG. 27 is a diagram illustrating another example of the device configuration of the photosensor illustrated in FIG. 23.

FIG. 27 is a diagram illustrating another example of the device configuration of the photosensor illustrated in FIG. 23. (a) of FIG. 27 is a plan view of APD 1001, first transistor 1201, and read-out circuit 1005. (b) of FIG. 27 is a cross-sectional view taken along X-X' in (a) of FIG. 27. The configuration in FIG. 27 is the same as that in FIG. 26 except that first electrode 2301, which is connected to APD 1001 in FIG. 26, is included in fifth transistor 1205 and the source of fifth transistor 1205 in FIG. 26 is first semiconductor layer 2101 of APD 1001. In such a configuration, the capacitance of the line connected to APD 1001 can be eliminated.

Figure 28:
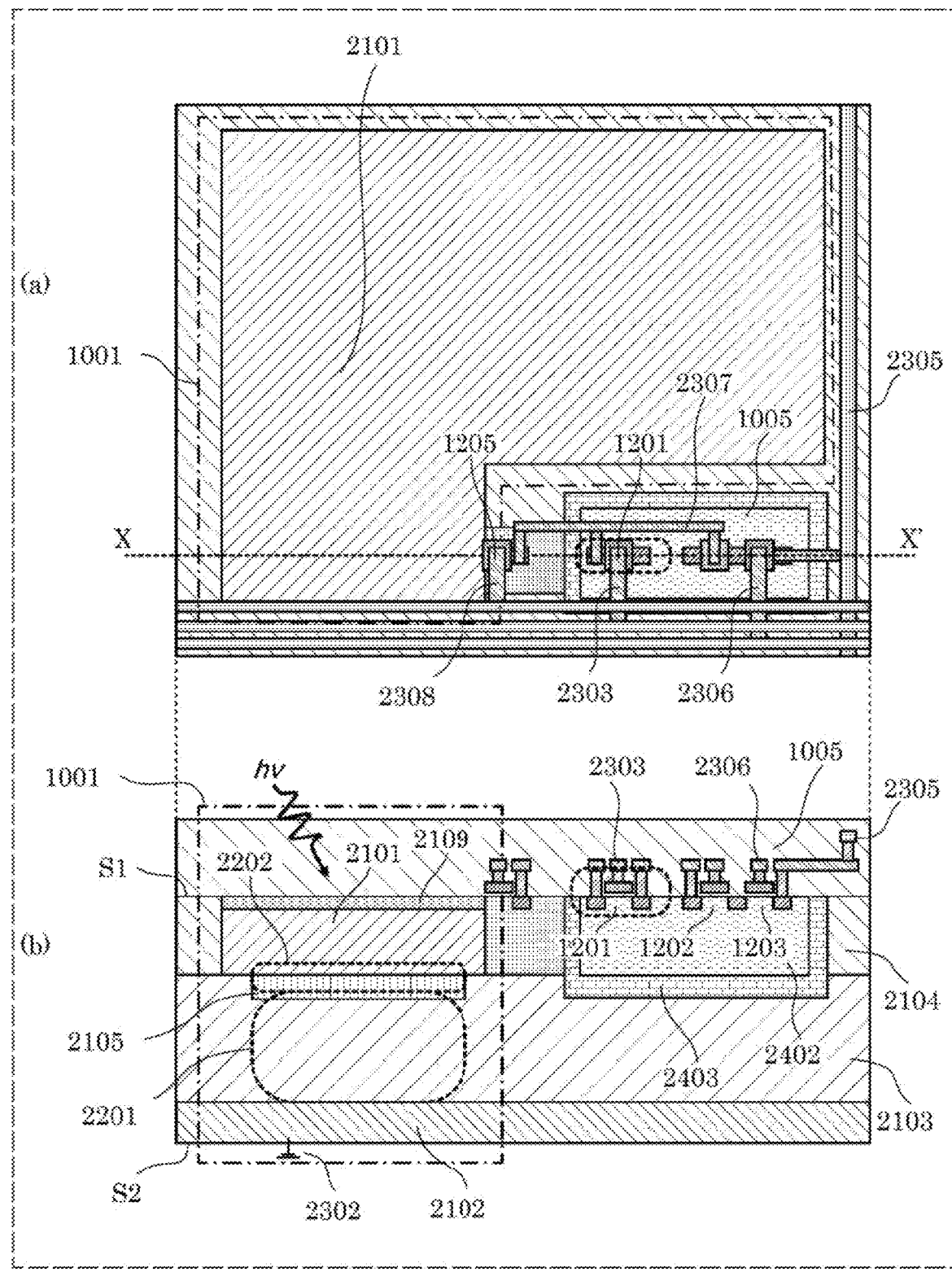
FIG. 28 is a diagram illustrating another example of the device configuration of the photosensor illustrated in FIG. 23.

FIG. 28 is a diagram illustrating another example of the device configuration of the photosensor illustrated in FIG. 23. (a) of FIG. 28 is a plan view of APD 1001, first transistor 1201, and read-out circuit 1005. (b) of FIG. 28 is a cross-sectional view taken along X-X' in (a) of FIG. 28. The device in FIG. 28 has the configuration in FIG. 27 further including ninth semiconductor layer 2109 having the second conductivity type on the side of first main surface S1 of first semiconductor layer 2101. Thereby, first semiconductor layer 2101 of APD 1001 can be embedded inside the device to reduce the amount of dark current to be generated.

Figure 29:
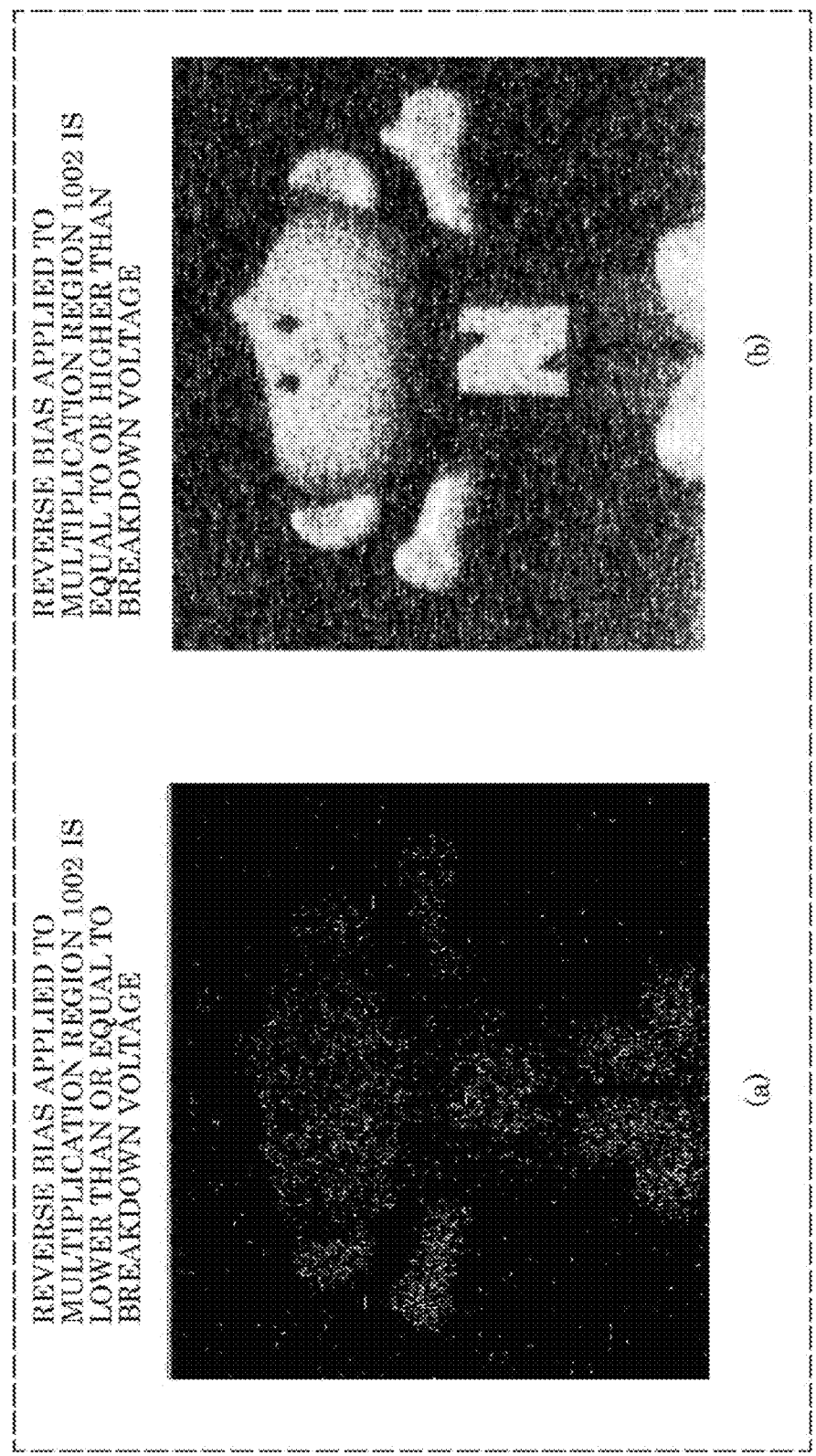
FIG. 29 is a diagram illustrating examples of images captured using an image sensor including the photosensor according to the embodiment.

FIG. 29 is a diagram illustrating examples of images captured using an image sensor including the photosensor according to the present embodiment. The images were captured under an environment in which several photons per pixel entered a bright region of the screen. When voltage VC-VA of the reverse bias applied across multiplication region 1002 is lower than or equal to the breakdown voltage, recognition of the target object is difficult as shown in (a) of FIG. 29. In contrast, when voltage VC-VA of the reverse bias applied across multiplication region 1002 is equal to or higher than the breakdown voltage, the target object can be clearly recognized as shown in (b) of FIG. 29. As shown in (b) of FIG. 29, the pixels where photons are detected are clearly distinguished from those where photons are not detected, because the former pixels have a large output and the latter pixels have a small output.

In particular, the average of the voltage amplitude was 2 V in the pixels where photons were detected, and never exceeded 2.5 V. No blooming occurred. This is because the avalanche multiplication of the charges was suppressed by capacitance quenching. The current flowing per pixel was 1 mA or less in the pixels where photons were detected, and the elements were never broken. In contrast, when first transistor 1201 was turned on to evaluate the light response. The current flowing per pixel was 1 mA or more, and the elements were broken. Thus, breakage of the elements and occurrence of blooming can be suppressed by use of the driving method according to the present embodiment, enabling detection of photons at a high S/N ratio.

Next, another example of the circuit configuration of the photosensor and the driving method according to the present embodiment will be described with reference to FIGS. 30 to 35.

Figure 30:
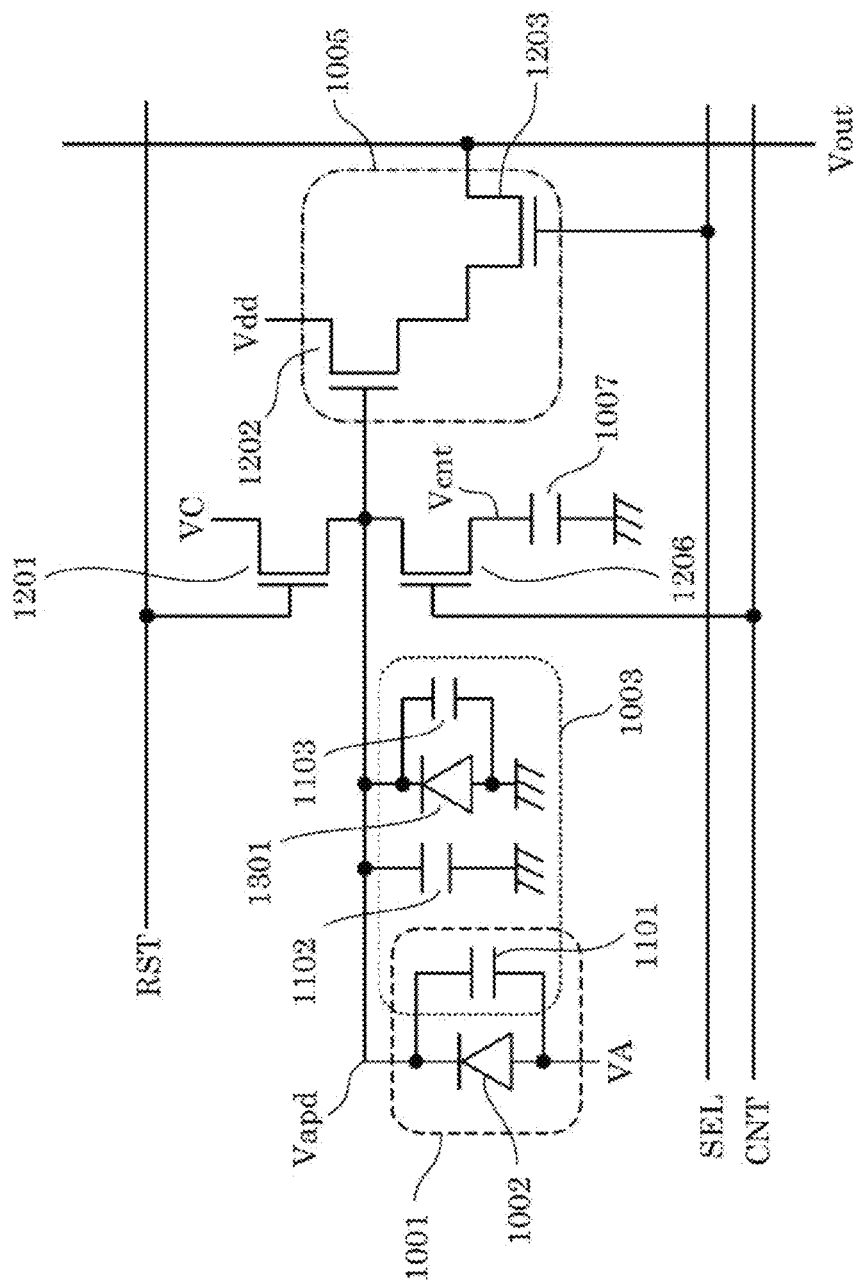
FIG. 30 is a diagram illustrating another example of the circuit configuration of the photosensor according to the embodiment.

FIG. 30 is a diagram illustrating another example of the circuit configuration of the photosensor according to the present embodiment. The circuit has the circuit configuration in FIG. 17 further including sixth transistor 1206, which is one example of a count transistor connected to APD 1001 and connected to read-out circuit 1005 in parallel, and third capacitor 1007 connected to APD 1001 through sixth transistor 1206. In particular, third capacitor 1007 is larger than first capacitor 1003.

Figure 31:
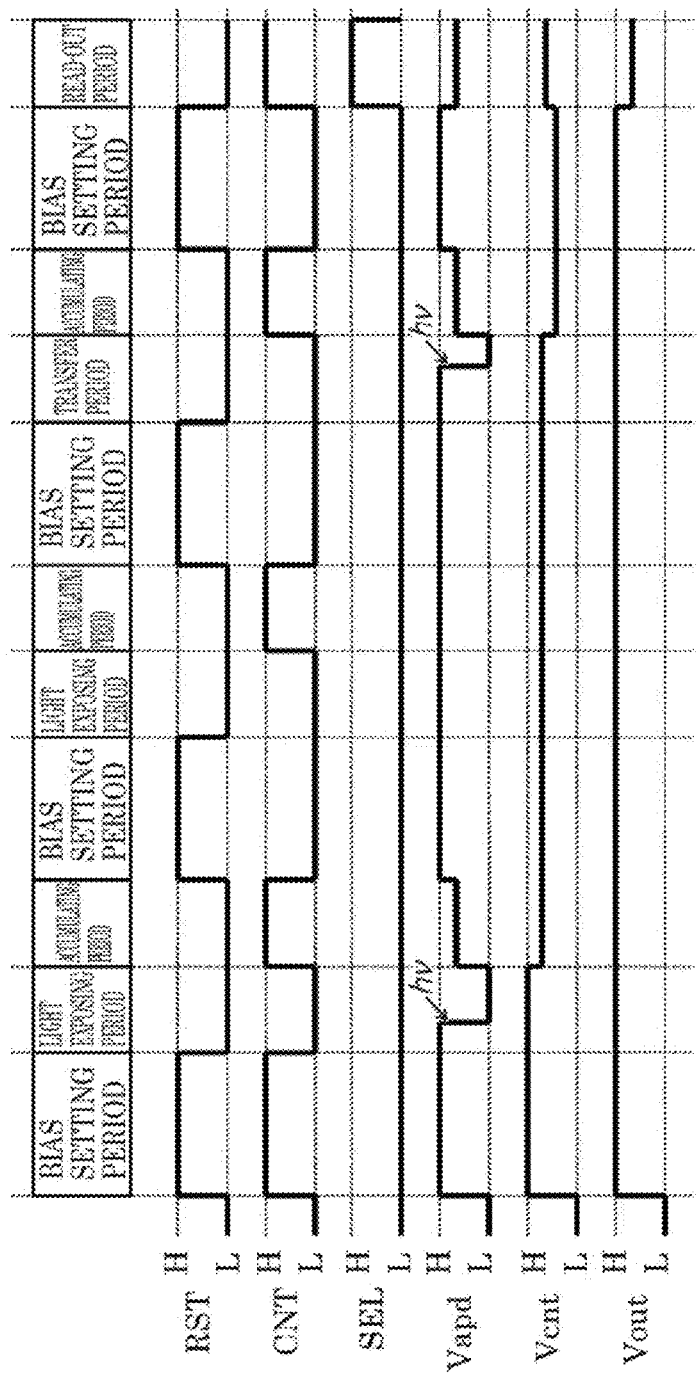
FIG. 31 is a timing chart illustrating one example of the driving method for the photosensor illustrated in FIG. 30.

FIG. 31 is a timing chart showing one example of the driving method for the photosensor illustrated in FIG. 30. Here, the bias voltage of the CNT terminal ("CNT" in the drawing), voltage Vapd, and voltage Vcnt are shown in addition to the voltages shown in FIG. 18. Voltage Vcnt is the bias of node Vcnt illustrated in FIG. 30. In this case, the bias setting period, the light exposing period, and the accumulation period are repeated several times. Thereafter, a read-out period are disposed. Specifically, in the accumulating period, the charges accumulated in first capacitor 1003 are transferred to third capacitor 1007, and are accumulated in third capacitor 1007. In the read-out period, the amount of charges accumulated in third capacitor 1007 is read out. Due to the effect of capacitance quenching, the number of charges to be generated per one avalanche multiplication is a fixed value corresponding to overvoltage Vov. For this reason, discrete charges corresponding to the number of detections of photons are accumulated in third capacitor 1007. By reading out the voltage of third capacitor 1007, the number of detections of photons can be counted.

Figure 32:
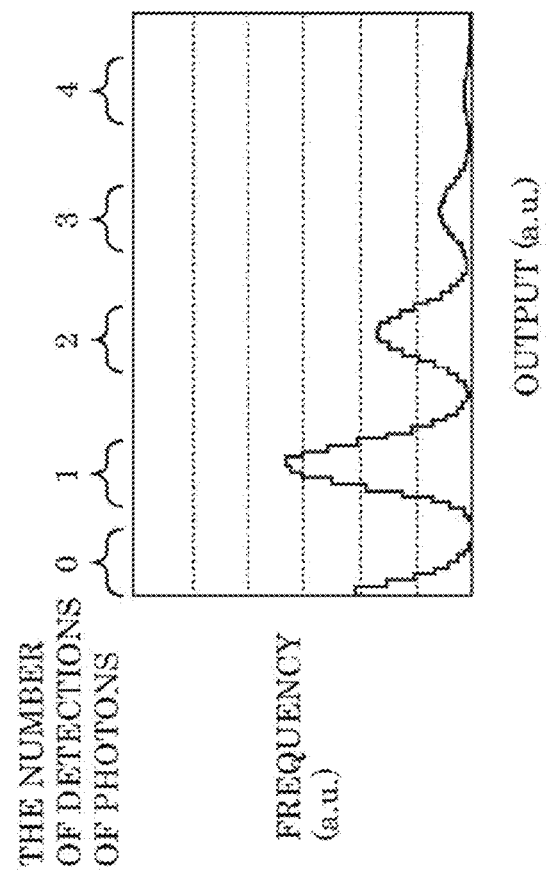
FIG. 32 is a diagram illustrating the result of evaluation on the number of detections of photons using the photosensor illustrated in FIGS. 30 and 31 in the form of a histogram.

FIG. 32 is a diagram illustrating the result of the number of detections of photons using the photosensor illustrated in FIGS. 30 and 31, where the result is evaluated in the form of a histogram. The abscissa represents the output (relative amount) of APD 1001, and the ordinate represents the frequency of occurrence (frequency) per output of APD 1001. Evaluation of the frequency of occurrence (i.e., the number of integrations) per output of APD 1001 was performed using an image sensor including a plurality of APDs 1001 arranged in an array under an environment where about 1.5 photons in average entered each pixel. Thus, the output of APD 1001 has a discrete value according to the number of detections of photons (i.e., several peaks are observed in the histogram), and it is shown that the number of detections of photons can be counted using the circuit illustrated in FIGS. 30 and 31.

Figure 33:
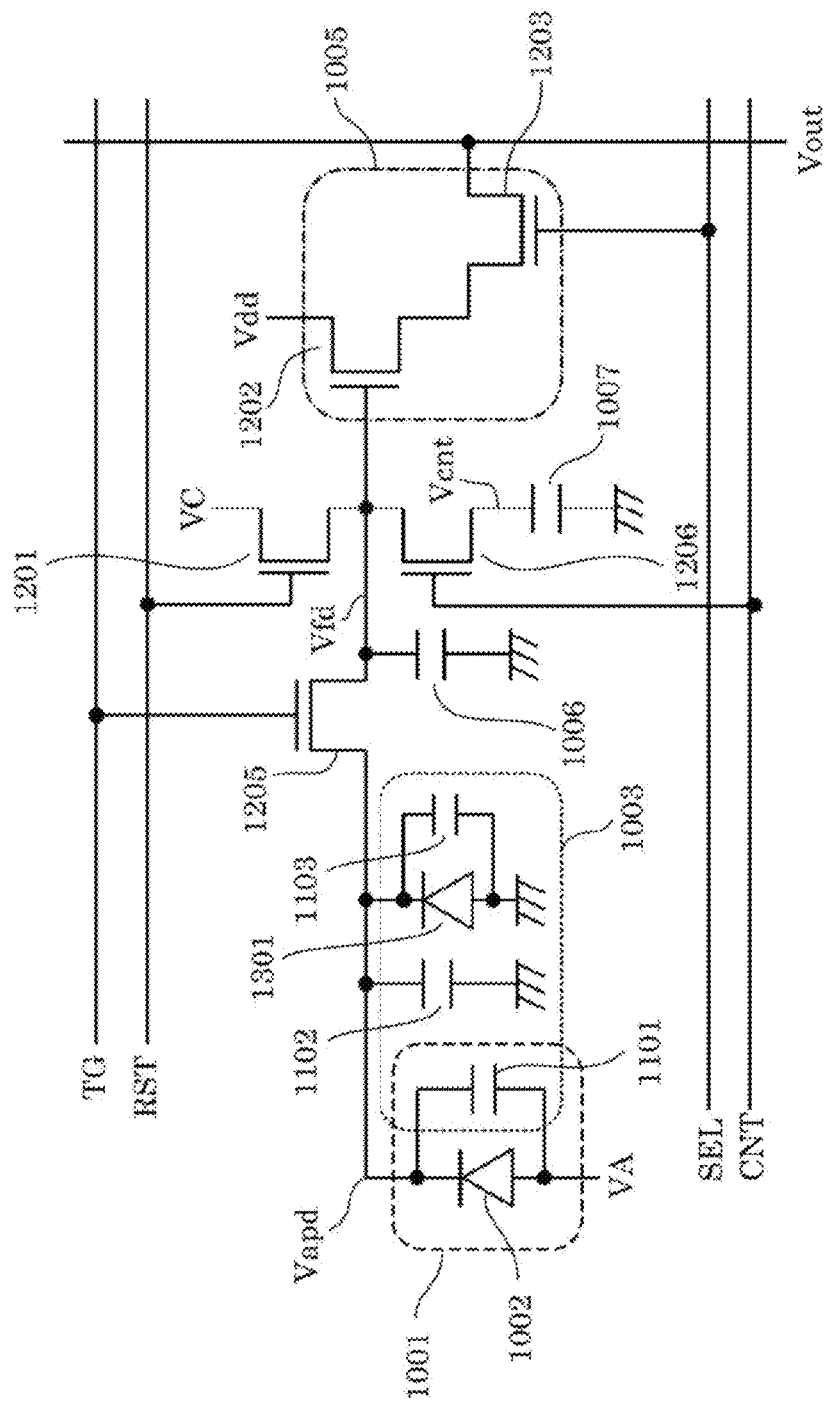
FIG. 33 is a diagram illustrating another example of the circuit configuration of the photosensor according to the embodiment.

Although sixth transistor 1206 is added to the circuit configuration without fifth transistor 1205 in the configuration illustrated in FIGS. 30 and 31, fifth transistor 1205 may be disposed between APD 1001 and read-out circuit 1005. The circuit configuration in this case is as in FIG. 33, which is a diagram illustrating another example of the circuit configuration of the photosensor according to the embodiment. In FIG. 33, fifth transistor 1205 is disposed between APD 1001 and read-out circuit 1005.

Figure 34:
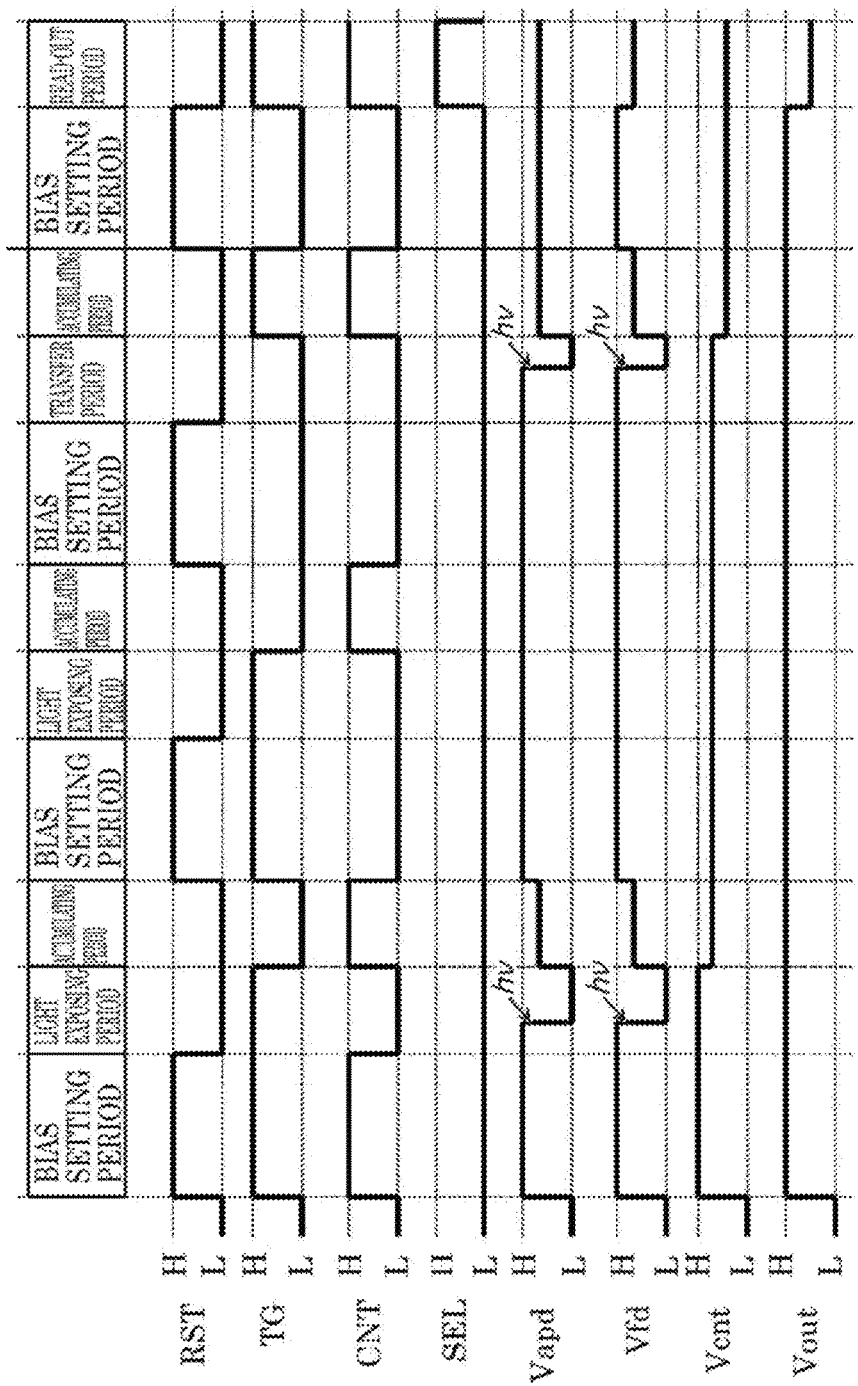
FIG. 34 is a timing chart illustrating one example of the driving method for the photosensor illustrated in FIG. 33.

FIG. 34 is a timing chart showing one example of the driving method for the photosensor illustrated in FIG. 33. Here, the gate bias (bias of the TG terminal: "TG" in the drawing) of fifth transistor 1205 and voltage Vfd of second capacitor 1006 are shown in addition to the voltages shown in FIG. 31. In this case, the TG terminal is set to the high bias in the bias setting period and the transfer period, and is set to the low bias in the accumulating period. The TG terminal is set to the low bias in the bias setting period immediately before the read-out period. Thereby, the amount of charges accumulated in third capacitor 1007 during each accumulating period can be controlled by the capacitance value of second capacitor 1006, and the S/N ratio can be improved by increasing the number of accumulations.

Figure 35:
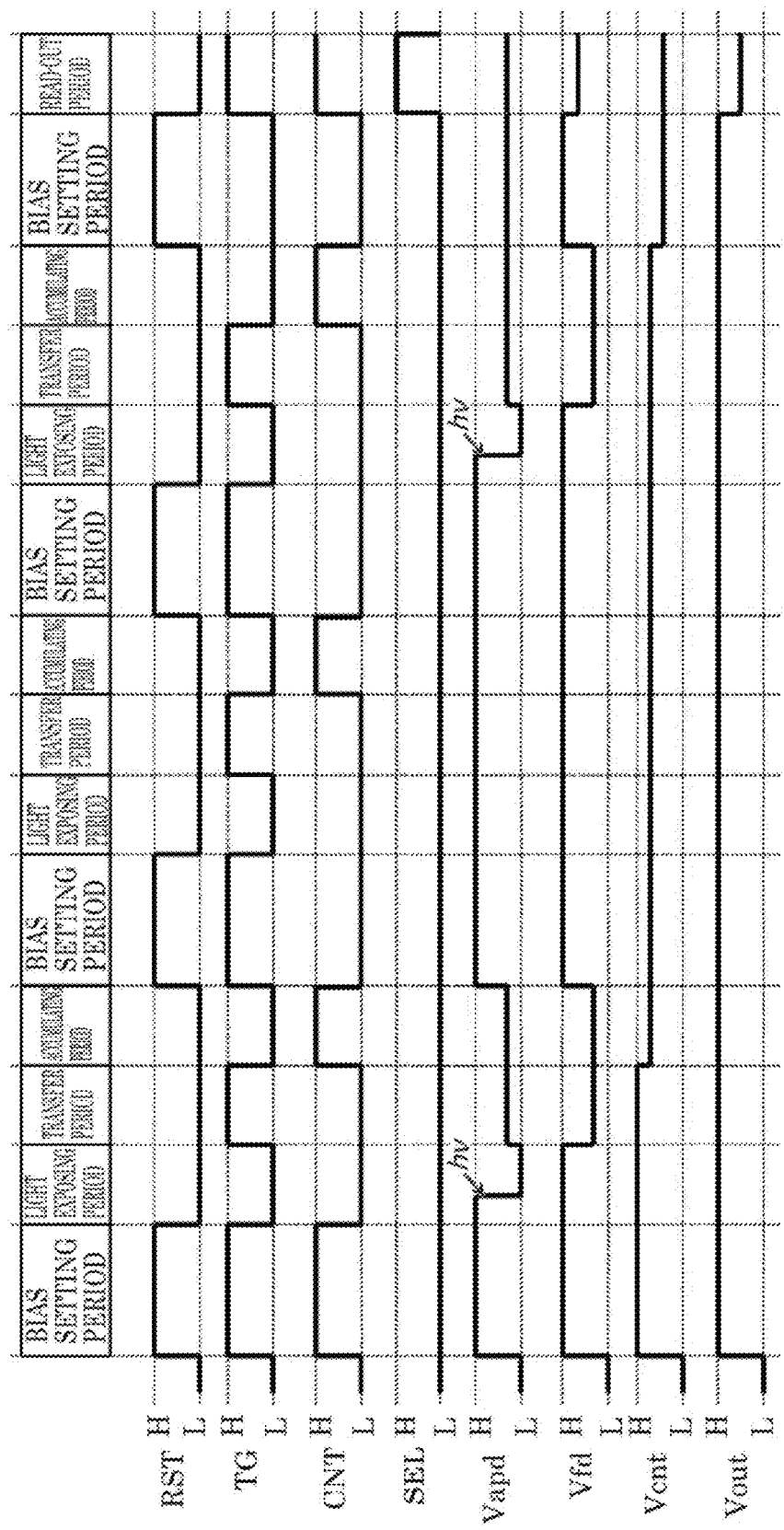
FIG. 35 is a timing chart illustrating another example of the driving method for the photosensor illustrated in FIG. 33.

FIG. 35 is a timing chart showing another example of the driving method for the photosensor illustrated in FIG. 33. Here, the same voltages as those in FIG. 34 are shown. The TG terminal is set to the low bias in the light exposing period, and is set to the high bias in the subsequent transfer period. As described in FIG. 25, by transferring the charges, which are generated by causing capacitance quenching in APD 1001 and first capacitor 1003, to second capacitor 1006, noises can be reduced in the case of capacitance distribution, while the voltage amplitude can be amplified or the dark current can be reduced in the case of complete transfer.

Next, another example of the circuit configuration of the photosensor and the driving method according to the present embodiment will be described with reference to FIGS. 36 and 37.

Figure 36:
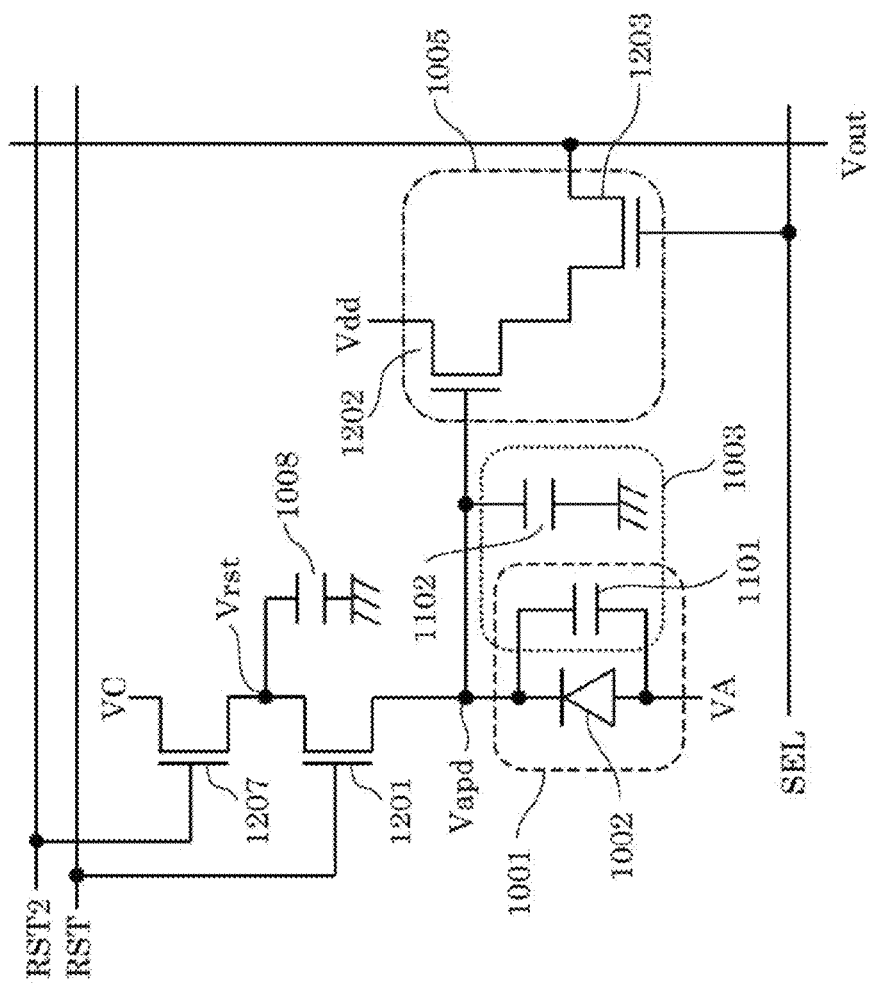
FIG. 36 is a diagram illustrating another example of the circuit configuration of the photosensor according to the embodiment.

FIG. 36 is a diagram illustrating another example of the circuit configuration of the photosensor according to the present embodiment. The circuit has the circuit configuration in FIG. 17 further including seventh transistor 1207, which is one example of the third reset transistor connected between the first power supply (voltage VC) and first transistor 1201, the gate electrode (RST2 terminal) of seventh transistor 1207, and fourth capacitor 1008 disposed at the connection point between first transistor 1201 and seventh transistor 1207. The capacitance value of fourth capacitor 1008 is larger than that of first capacitor 1003 as one feature.

Figure 37:
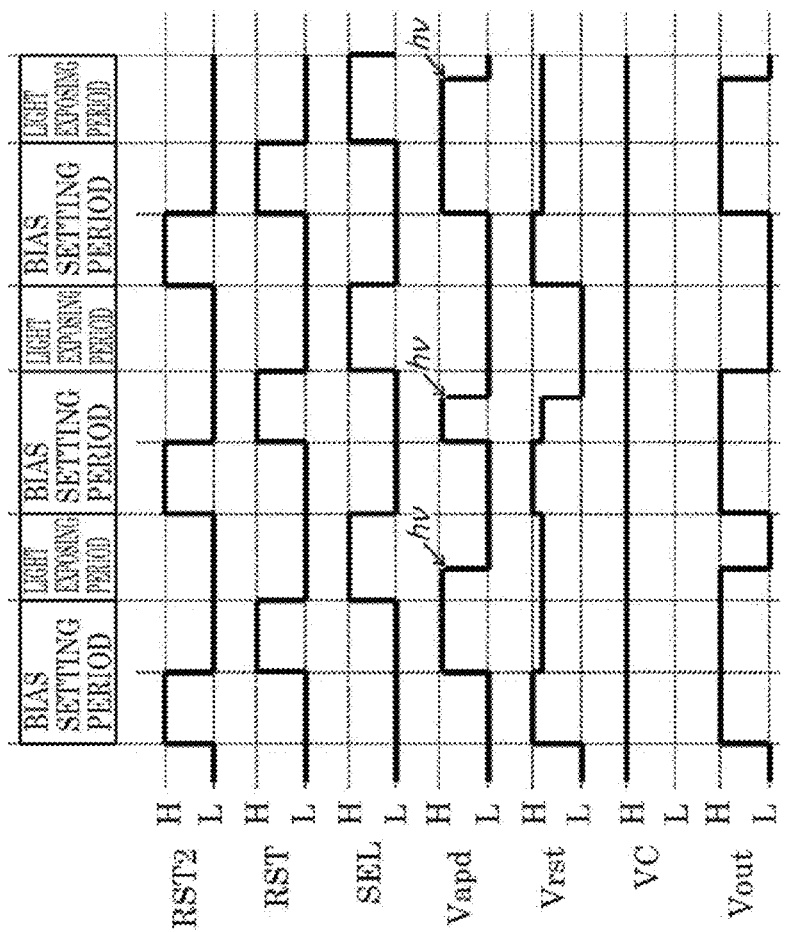
FIG. 37 is a timing chart illustrating one example of the driving method for the photosensor illustrated in FIG. 36.

FIG. 37 is a timing chart showing one example of the driving method for the photosensor illustrated in FIG. 36. Here, the bias voltage ("RST2" in the drawing) of the RST2 terminal, voltage Vapd, voltage Vrst, and voltage VC are shown in addition to the voltages shown in FIG. 18. Voltage VC is the bias of node VC illustrated in FIG. 36. The bias setting period is divided into two. In a first half of the bias setting period, the RST2 terminal is set to the high bias, the RST terminal is set to the low bias, and fourth capacitor 1008 is set to voltage VC. In a second half of the bias setting period, the RST2 terminal is set to the low bias, the RST terminal is set to the high bias, and the voltage of the cathode of APD 1001 is set by capacitance distribution of fourth capacitor 1008 and first capacitor 1003.

In this driving method, the first power supply (voltage VC) is always disconnected from APD 1001 during the bias setting period. For this reason, even when photons enter APD 1001 during the bias setting period to cause avalanche multiplication, a flow of large current from APD 1001 to the first power supply (voltage VC) can be suppressed to increase the reliability. In addition, a variation in voltage VC of the first power supply can be suppressed to suppress shading and blooming of images.

Figure 38:
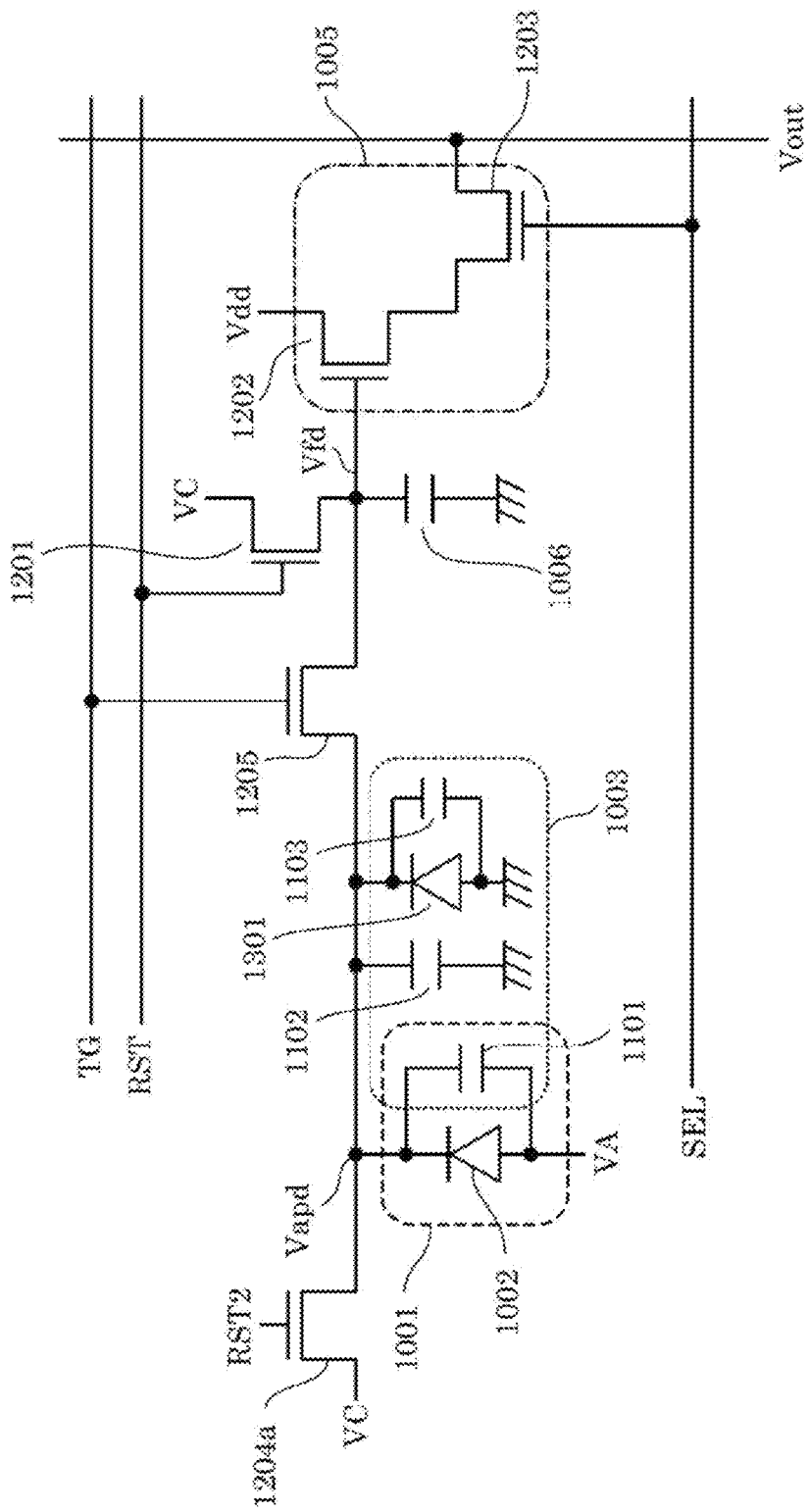
FIG. 38 is a diagram illustrating another example of the circuit configuration of the photosensor according to the embodiment.

FIG. 38 is a diagram illustrating another example of the circuit configuration of the photosensor according to the embodiment. The circuit has the circuit configuration in FIG. 23 further including fourth transistor 1204a, which is one example of the second reset transistor, which is connected to APD 1001 (more specifically, multiplication region 1002) and the third power supply (voltage VC) and has a gate electrode connected to the RST2 terminal.

Figure 39:
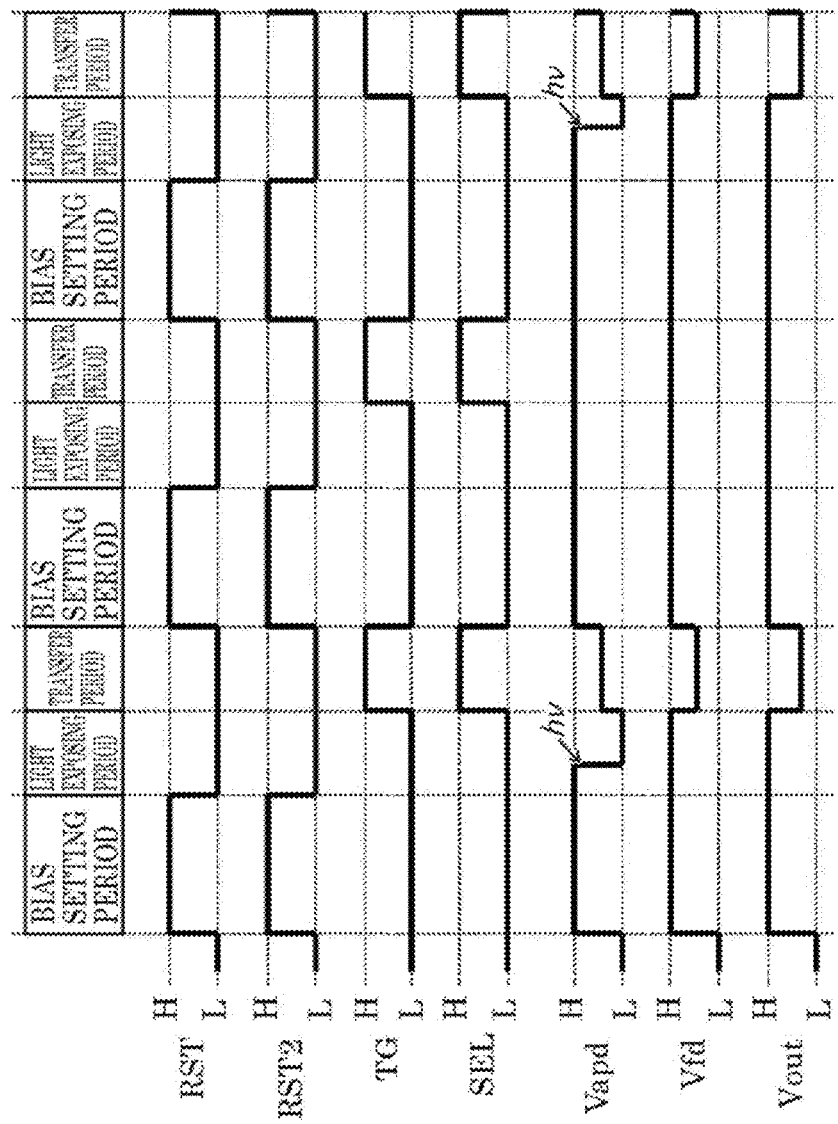
FIG. 39 is a timing chart illustrating one example of the driving method for the photosensor illustrated in FIG. 38.

FIG. 39 is a timing chart showing one example of the driving method for the photosensor illustrated in FIG. 38. The bias voltage of the RST2 terminal is shown in addition of the voltages shown in FIG. 25. As shown in FIG. 38, in the bias setting period, the RST terminal and the RST2 terminal are set to the high bias to reset APD 1001 and second capacitor 1006. Thereby, Vapd and Vfd are set to voltage VC. In the light exposing period, the RST terminal, the RST2 terminal, and the TG terminal are set to the low bias. Thereby, APD 1001 is disconnected from the third power supply (voltage VC) to cause capacitance quenching. At this time, capacitance value C in equation (7) corresponds to only the capacitance value of first capacitor 1003. In the transfer period, the TG terminal is set to the high bias, and the RST terminal and the RST2 terminal are set to the low bias. Thereby, the charges generated in APD 1001 and accumulated in first capacitor 1003 are transferred to second capacitor 1006, and are read out through read-out circuit 1005. In this circuit configuration, APD 1001 can be disconnected from second capacitor 1006 through fifth transistor 1205 as a transfer transistor, independently resetting APD 1001 and second capacitor 1006.

Although the voltage of the third power supply is the same as that (voltage VC) of the first power supply in the circuit configuration in FIG. 38, the third power supply can have any other voltage and may have a voltage different from that of the first power supply.

Figure 40:
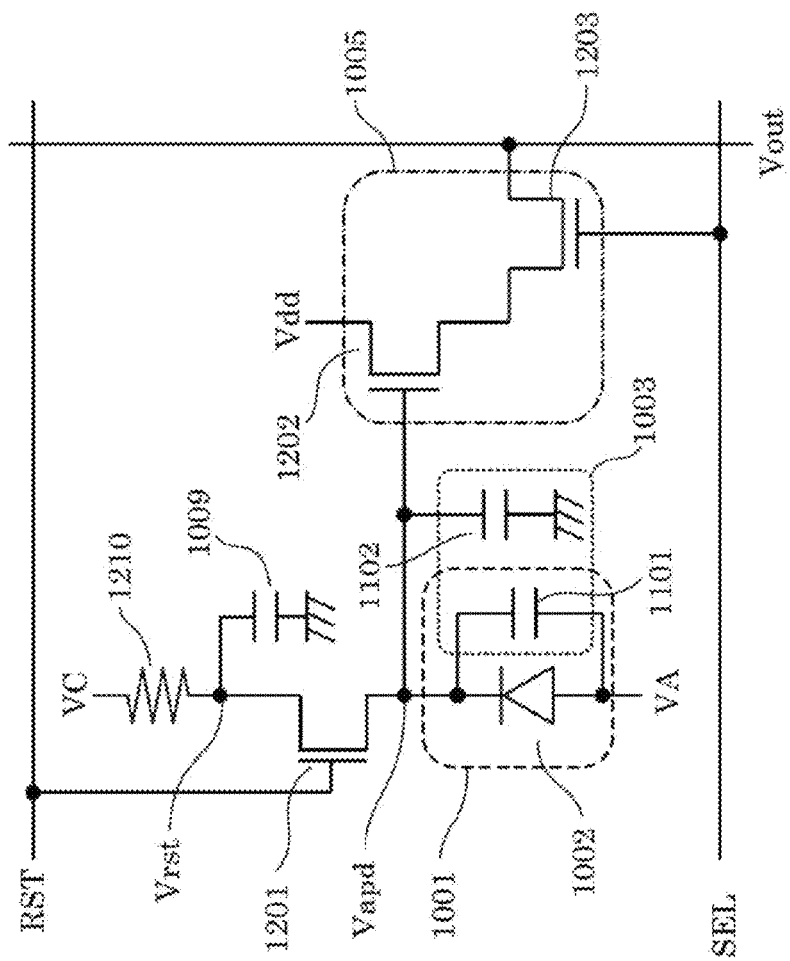
FIG. 40 is a diagram illustrating another example of the circuit configuration of the photosensor according to the embodiment.

FIG. 40 is a diagram illustrating another example of the circuit configuration of the photosensor according to the embodiment. The circuit has the circuit configuration in FIG. 16 further including resistor 1210 connected between the first power supply (voltage VC) and first transistor 1201, and fifth capacitor 1009 connected to a connection point between resistor 1210 and first transistor 1201. Resistor 1210 preferably has a sufficiently large resistance value to stop avalanche multiplication in APD 1001. Specifically, although it depends on the structure of APD 1001, it is desired that the resistance value be typically larger than 1 kΩ. The capacitance value of fifth capacitor 1009 is desirably smaller than that of first capacitor 1003. Fifth capacitor 1009 having a smaller capacitance value can shorten the time needed for quenching, enabling driving at higher speed.

Figure 41:
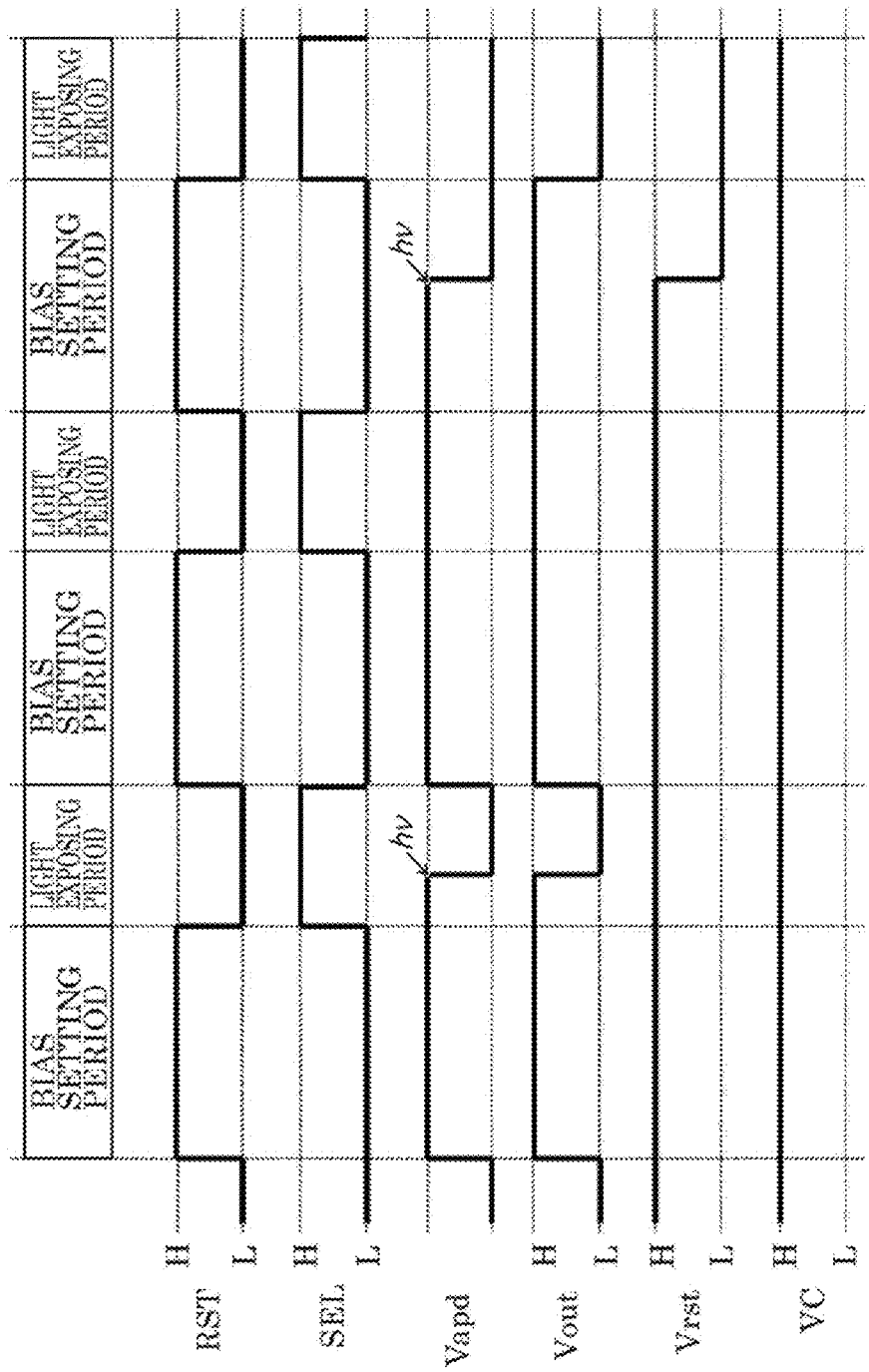
FIG. 41 is a timing chart illustrating one example of the driving method for the photosensor illustrated in FIG. 40.

FIG. 41 is a timing chart showing one example of the driving method for the photosensor illustrated in FIG. 40. In addition to the voltages shown in FIG. 18, FIG. 41 also shows voltage "Vapd" of node Vapd, voltage "Vrst" of node Vrst, and voltage "VC" of node VC. As illustrated in this chart, the current is restricted by resistor 1210 even when first transistor 1201 is on during the bias setting period and avalanche breakdown occurs in APD 1001. Thus, a variation in voltage of node VC is suppressed.

Figure 42:
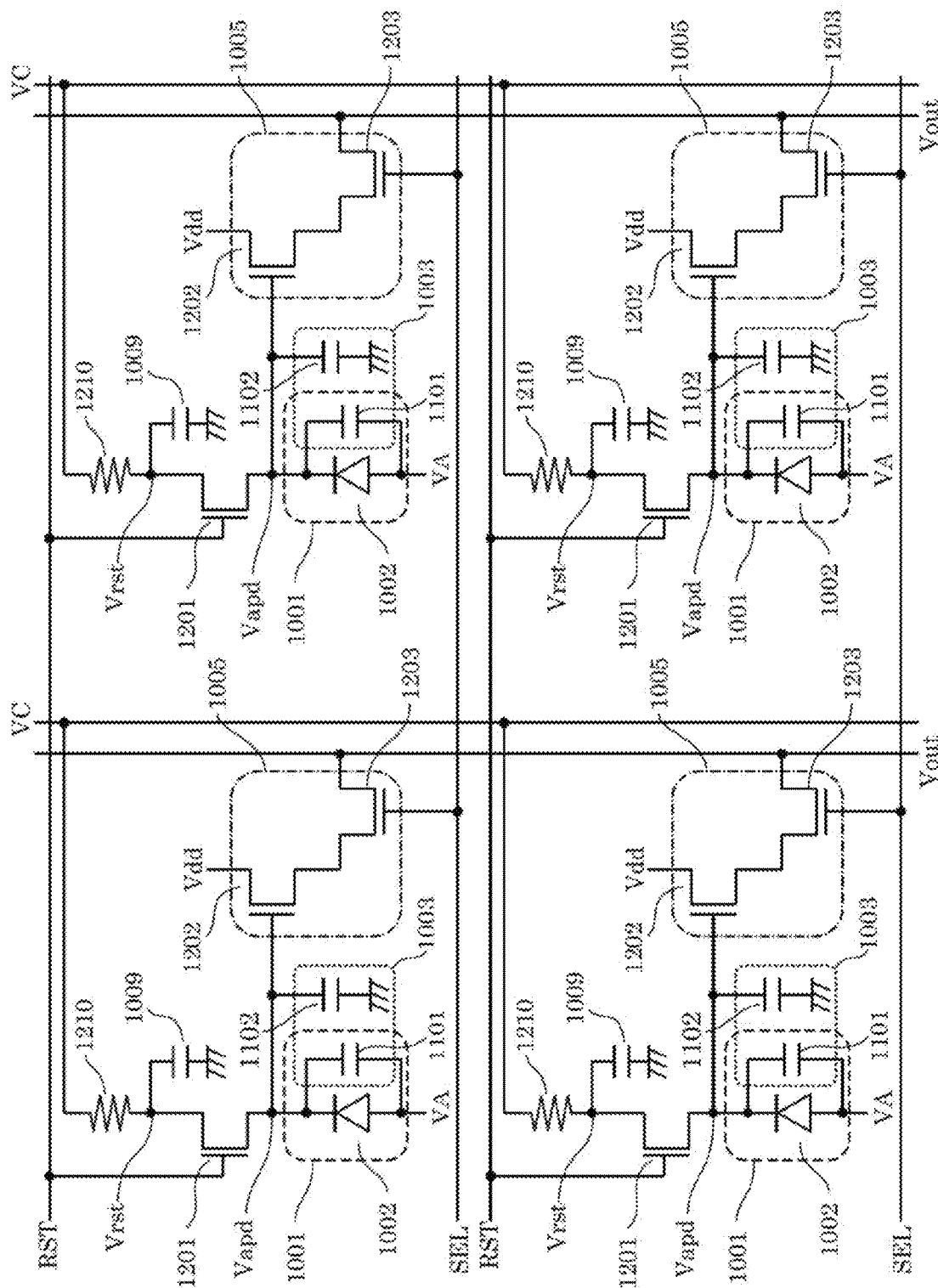
FIG. 42 is a circuit diagram illustrating one example of the image sensor including the photosensors illustrated in FIG. 40, the photosensors being arranged in an array.

FIG. 42 is a circuit diagram illustrating one example of an image sensor including the photosensors illustrated in FIG. 40, the photosensors being arranged in an array. As illustrated in the circuit diagram, the first power supply is shared with a plurality of APDs 1001. Thus, resistor 1210 is preferably arranged such that adjacent APDs 1001 are separated from each other. Resistor 1210 can be disposed by a process of manufacturing the photosensor. For example, a method of forming wiring with a highly resistive material such as polysilicon may be used. A significantly high resistance value of resistor 1210 increases the time to reset APD 1001. To suppress this, the resistance value preferably has the upper limit. For example, it is preferred that resistor 1210 have a resistance value of typically 1 MΩ or less.

Figure 43:
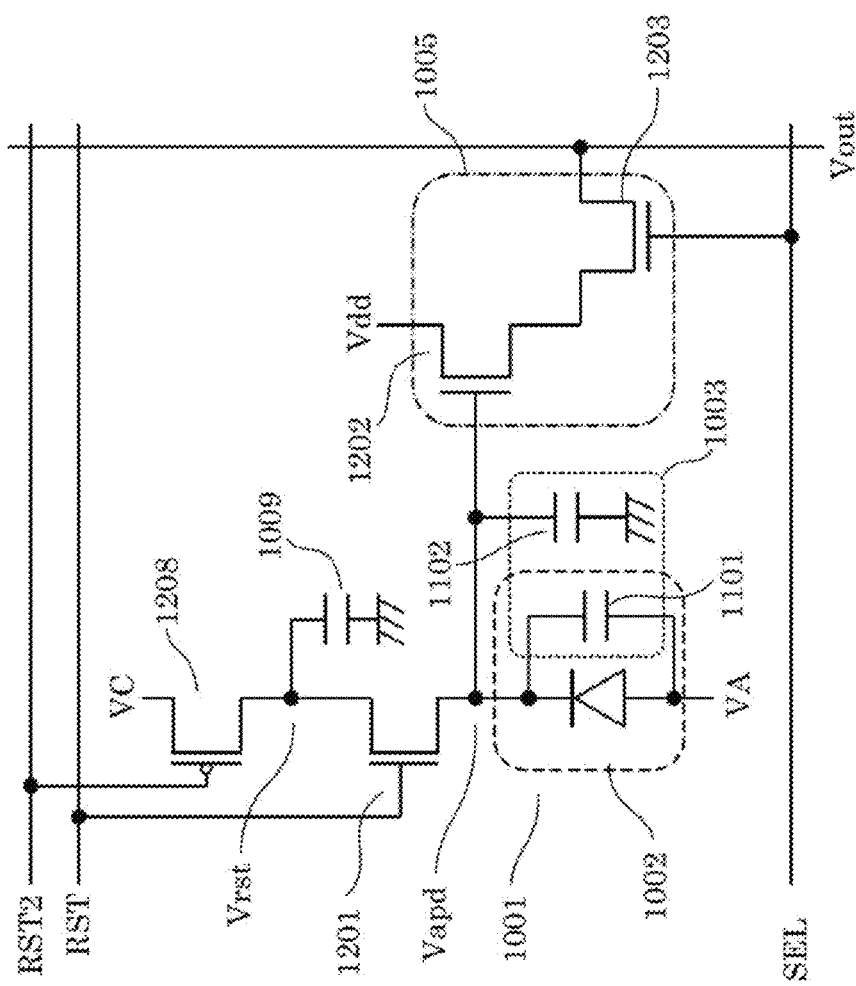
FIG. 43 is a diagram illustrating another example of the circuit configuration of the photosensor according to the embodiment.

FIG. 43 is a diagram illustrating another example of the circuit configuration of the photosensor according to the embodiment. The circuit has the circuit configuration in FIG. 40 in which resistor 1210 is replaced by eighth transistor 1208 having a P-type channel. The gate of eighth transistor 1208 is connected to terminal RST2 fixed at the low bias. In this circuit, when avalanche breakdown occurs in APD 1001 during a period in which first transistor 1201 is on (specifically, during the reset period), the voltage of node Vrst is varied due to the charges generated by avalanche multiplication, and the channel of eighth transistor 1208 is closed by the variation in voltage. For this reason, the current is difficult to flow in node VC of the first power supply (voltage VC) (in other words, eighth transistor 1208 functions as a high resistor), reducing the variation in voltage VC. It is also desired in this circuit configuration that the capacitance value of fifth capacitor 1009 be smaller than that of first capacitor 1003.

Figure 44:
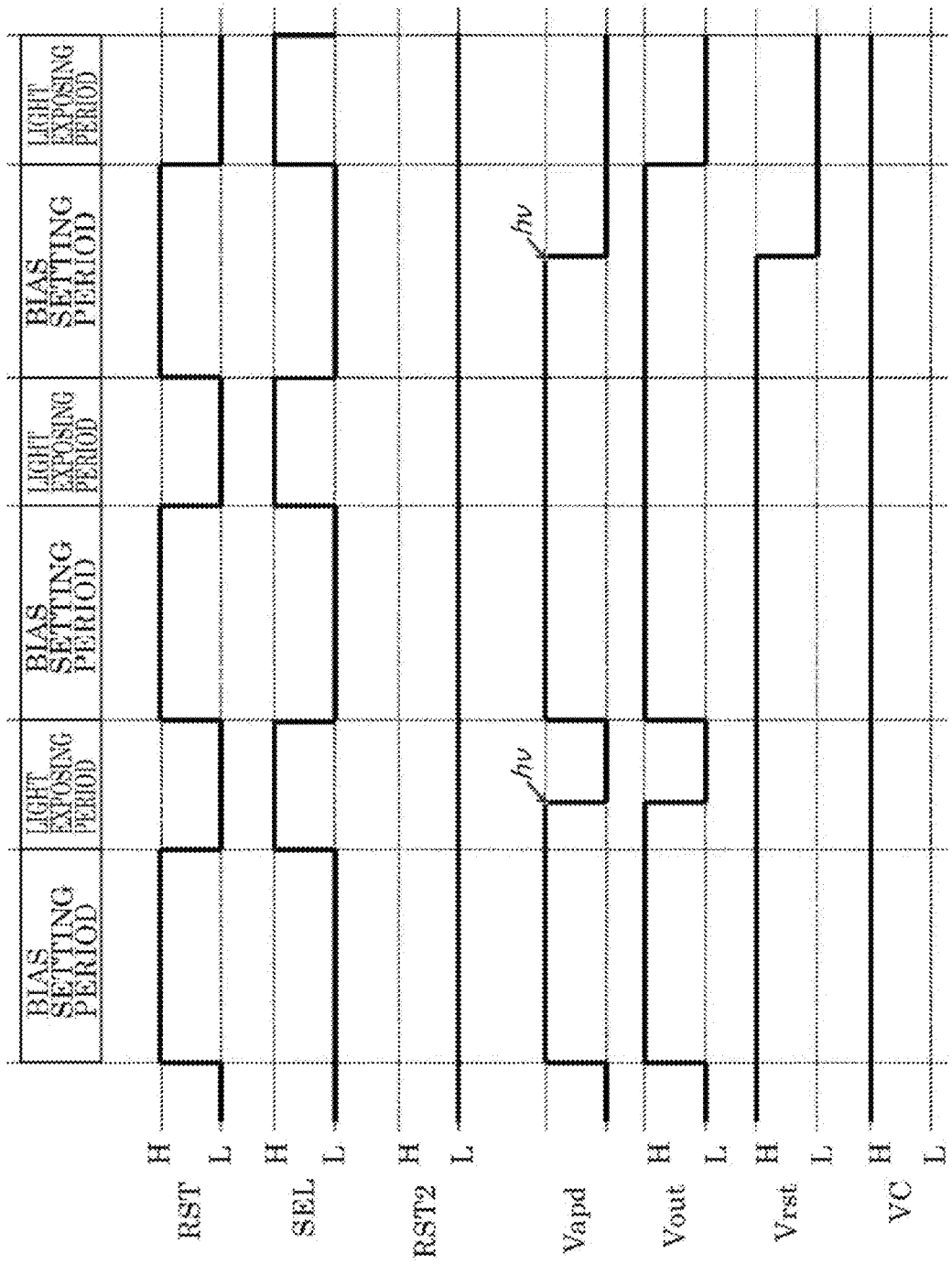
FIG. 44 is a timing chart illustrating one example of the driving method for the photosensor illustrated in FIG. 43.

FIG. 44 is a timing chart showing one example of the driving method for the photosensor illustrated in FIG. 43. Voltage "RST2" of the terminal RST2 is shown in addition to the voltages shown in FIG. 41. Eighth transistor 1208, which is a P-type, is off (insulated) when terminal RST2 is at a high voltage (H), and is on (electrically conducted) when terminal RST2 is at a low voltage (L). Eighth transistor 1208 is usually electrically conducted during the bias setting period and during the light exposing period. The voltages of terminal RST2 applied at H and L do not need to be the same as those of other transistors applied at H and L.

Eighth transistor 1208 is of a P-type in this circuit because eighth transistor 1208 is connected to the cathode of APD 1001. When eighth transistor 1208 is connected to the anode of APD 1001, an N-type transistor should be used. In short, it is sufficient that eighth transistor 1208 is a transistor having a channel with a conductivity type opposite to that of the terminal of APD 1001 to which the transistor is connected. To be noted, the configuration in which a P-type transistor is connected to the cathode of APD 1001 as in this circuit is preferred because the P-type transistor usually has a resistance higher than that of the N-type transistor.

Although FIGS. 40 and 43 are based on the circuit diagram in FIG. 16 as the basic circuit diagram, any combination of the circuit configurations described in this specification may be used.

Figure 45:
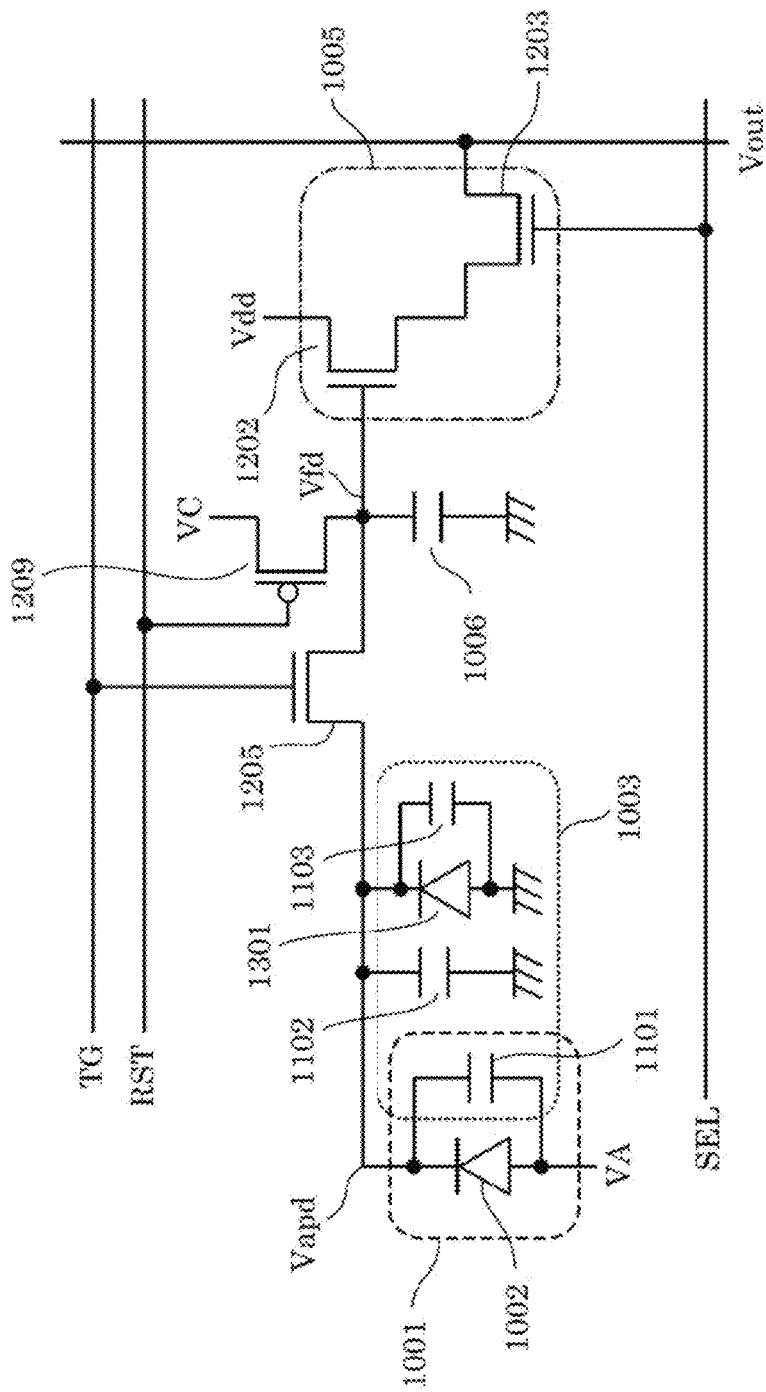
FIG. 45 is a diagram illustrating another example of the circuit configuration of the photosensor according to the embodiment.

FIG. 45 is a diagram illustrating another example of the circuit configuration of the photosensor according to the embodiment. This circuit corresponds to the circuit configuration in FIG. 23 in which first transistor 1201 is replaced by ninth transistor 1209 having a channel of the opposite conductivity type or a channel of the P-type. Ninth transistor 1209 having a P-type channel has a conductivity type with a polarity opposite to that of conductivity of the anode or cathode of APD 1001, the anode or the cathode being connected to ninth transistor 1209. In this circuit, when avalanche breakdown occurs in APD 1001 during a period in which ninth transistor 1209 is on (specifically, during the reset period), the voltage of node Vfd is varied due to the charges generated by avalanche multiplication, and the channel of ninth transistor 1209 is closed by this variation in voltage. For this reason, the current is difficult to flow in node VC of the first power supply (voltage VC) (in other words, ninth transistor 1209 functions as a high resistor), reducing the variation in voltage VC.

Figure 46:
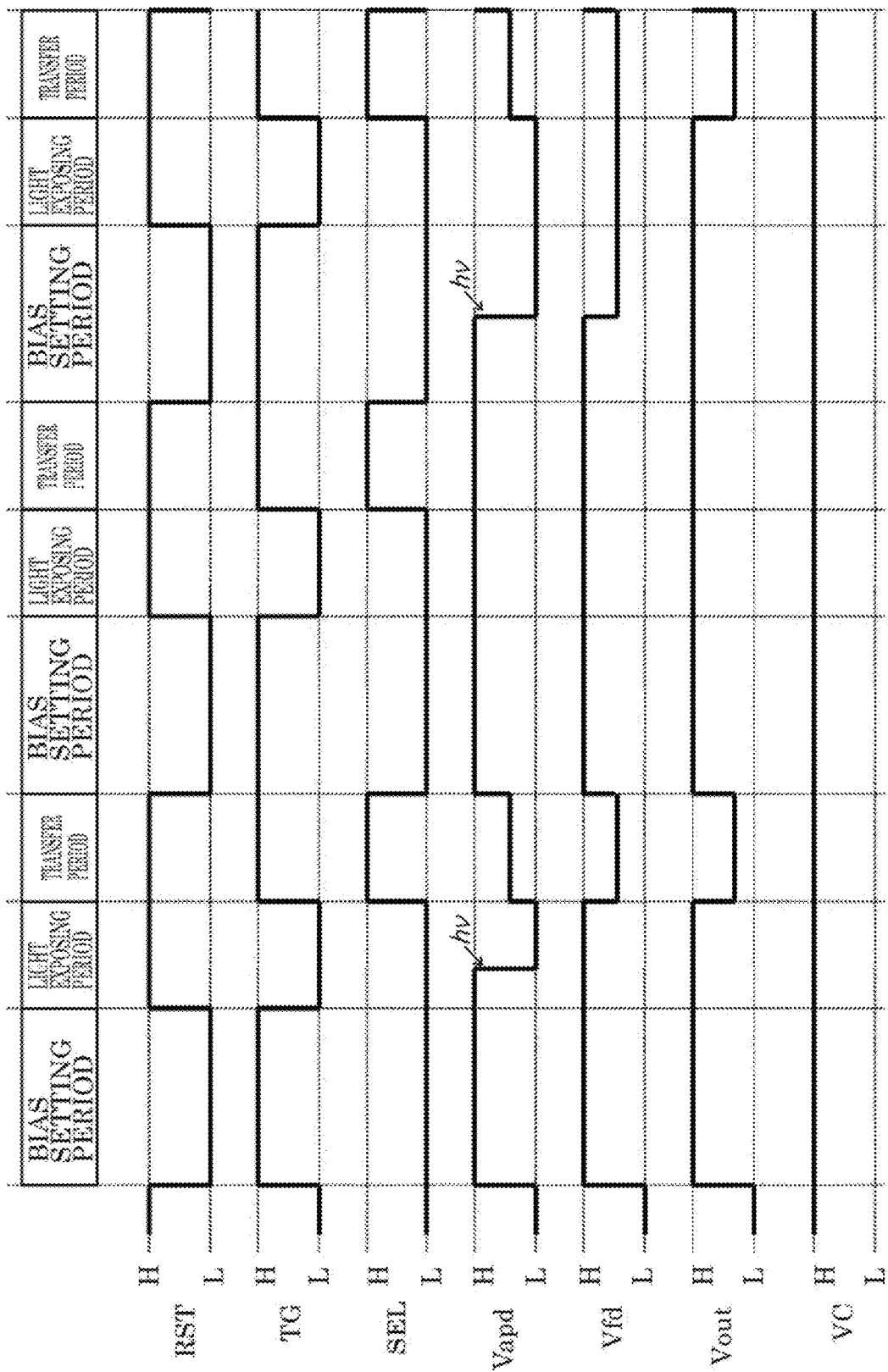
FIG. 46 is a timing chart illustrating one example of the driving method for the photosensor illustrated in FIG. 45.

FIG. 46 is a timing chart showing one example of the driving method for the photosensor illustrated in FIG. 45. The timing chart corresponds to the timing chart in FIG. 25 in which H and L of the voltage of the RST are inverted and the voltage of VC, which is the node of the power supply voltage, is added. The voltage of VC, which is the node of the power supply voltage, is constant even when light enters the photosensor in the bias setting period.

Figure 47:
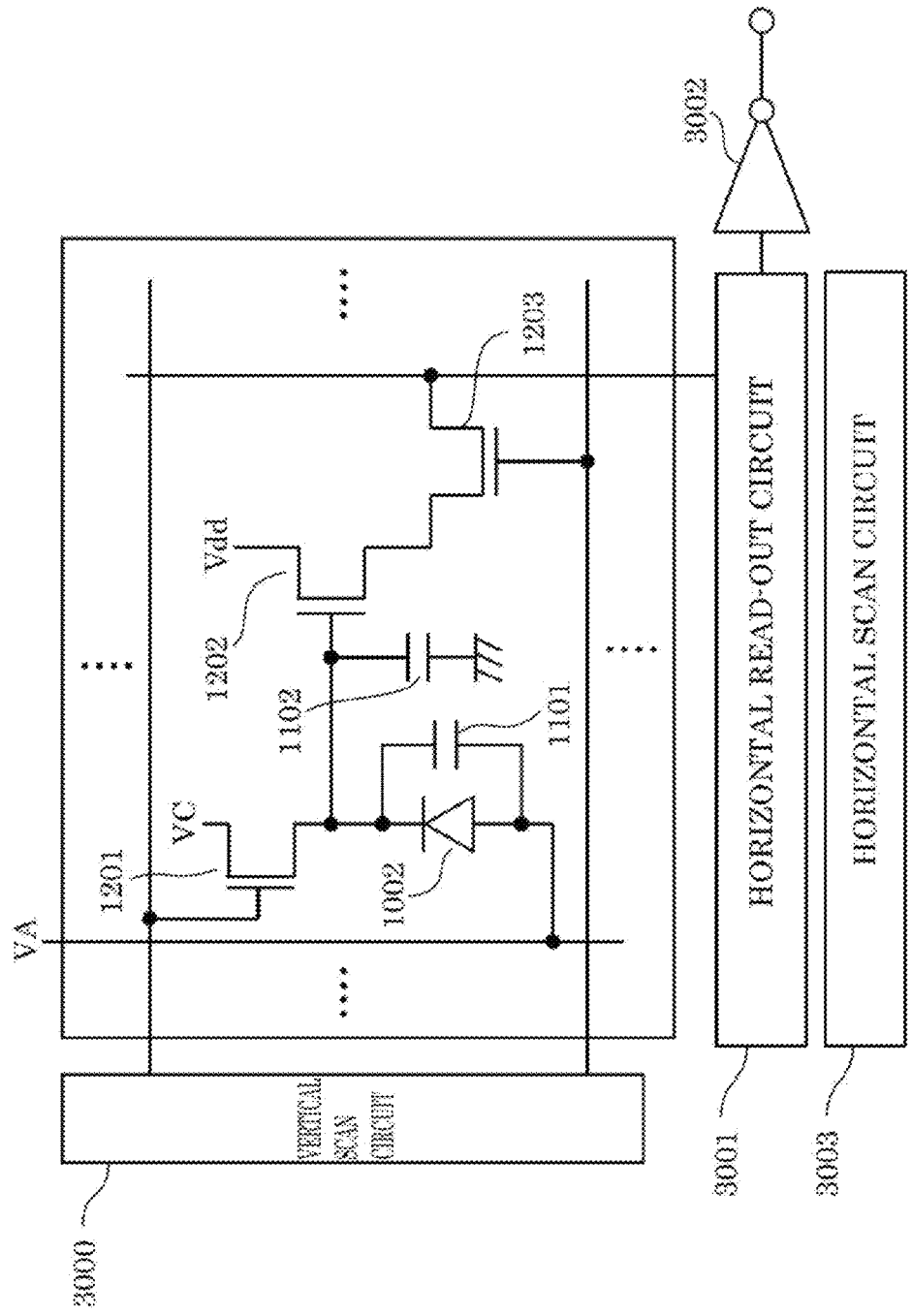
FIG. 47 is a circuit diagram illustrating one example of the configuration of the image sensor including the photosensor according to the embodiment.

FIG. 47 is a circuit diagram illustrating one example of the configuration of an image sensor including the photosensors according to the embodiment. The image sensor includes the photosensors in FIG. 16 arranged in an array, vertical scan circuit 3000 which controls first transistor 1201, horizontal read-out circuit 3001 which reads out signals from the photosensors, amplifier 3002 which amplifies the signals from horizontal read-out circuit 3001, and horizontal scan circuit 3003 which drives horizontal read-out circuit 3001. Each photosensor includes one APD 1001, one first transistor 1201, one second transistor 1202, and one third transistor 1203. Although FIG. 47 is based on the circuit diagram in FIG. 16 as the basic circuit diagram, any combination of the circuit configurations described in this specification may be used.

Figure 48:
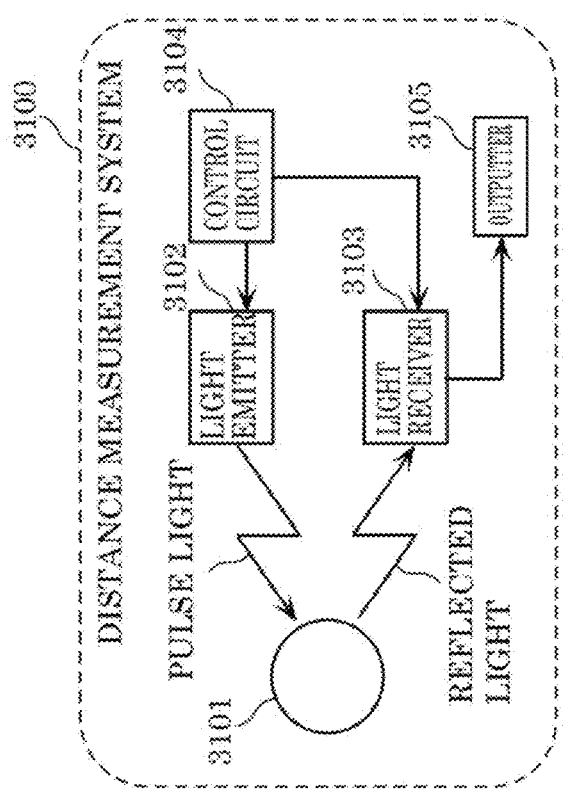
FIG. 48 is a block diagram illustrating one example of the distance measurement system including the photosensor or the image sensor according to the embodiment.

FIG. 48 is a block diagram illustrating one example of distance measurement system 3100 including the photosensor or the image sensor according to the embodiment. Distance measurement system 3100 includes light emitter 3102 which emits pulse light to target object 3101, light receiver 3103 which receives the pulse light reflected from target object 3101, control circuit 3104 which controls light emitter 3102 and light receiver 3103, and outputter 3105 which outputs an signal from light receiver 3103. The photosensor or the image sensor according to the embodiment can be used as light receiver 3103. Control circuit 3104 measures the distance to target object 3101 by synchronizing light emitter 3102 with light receiver 3103 and measuring the time taken from reflection of pulse light from target object 3101 to return thereof to light receiver 3103. Outputter 3105 outputs the distance to target object 3101 in the form of numeric data or an image. In the photosensor or the image sensor according to the present embodiment, the timing for exposure to light can be arbitrarily set by first transistor 1201. For this reason, distance measurement system 3100 including the photosensor or the image sensor according to the present embodiment can suppress errors in detection of the distance caused by background light and can determine the distance to the object with high precision.

As described above, the photosensor according to the present embodiment includes APD 1001 that has multiplication region 1002 including a photoelectric converter and includes first capacitor 1003 connected to multiplication region 1002 in parallel, and first transistor 1201, which is a first reset transistor connected between APD 1001 and a first power supply (voltage VC). First transistor 1201 applies a reverse bias of power supply voltage VC-VA larger than breakdown voltage VBD of APD 1001 between the anode and the cathode of APD 1001 during a bias setting period by connecting APD 1001 to first power supply (voltage VC), and stops an avalanche multiplication phenomenon during a light exposing period by disconnecting APD 1001 from the first power supply (voltage VC) to accumulate the charges in first capacitor 1003, the charges being generated by the avalanche multiplication phenomenon in APD 1001.

In such a configuration, the charges generated in multiplication region 1002 of APD 1001 are accumulated in first capacitor 1003, and avalanche multiplication spontaneously stops. A signal having a large amplitude of several volts can be obtained from a single photon by capacitance quenching without breaking the elements, and photons can be detected at a high S/N ratio.

The photosensor may further include read-out circuit 1005 which reads out the charges accumulated in first capacitor 1003. In such a configuration, a signal corresponding to the charges generated by the avalanche multiplication phenomenon during the light exposing period is output.

Here, first capacitor 1003 may include at least one of (1) a junction capacitance of APD 1001, (2) a parasitic capacitance of APD 1001, (3) a line capacitance of a line connected to APD 1001, (4) a junction capacitance of a source or drain of first transistor 1201, or (5) an input capacitance of read-out circuit 1005.

The amplitude of the input signal input to read-out circuit 1005 depends on overvoltage Vov, which is the difference between power supply voltage VC-VA and breakdown voltage VBD. In such a configuration, the amplitude of the input signal input to read-out circuit 1005 can be controlled by controlling the power supply voltage.

Read-out circuit 1005 may include first well 2401, and may be electrically insulated from the power supply voltage (i.e., both of the anode and the cathode of APD 1001) by first well 2401. In such a configuration, APD 1001 is separated from first well 2401, suppressing leakage of the charges generated by avalanche multiplication in APD 1001 to read-out circuit 1005 through first well 2401.

The photosensor may further include fourth transistor 1204, which is a second reset transistor connected between APD 1001 and a second power supply (voltage VC2). Fourth transistor 1204 may be turned off in the bias setting period, and may be turned on in the light exposing period. In such a configuration, excessive charges generated in APD 1001 are discharged through fourth transistor 1204.

Here, first capacitor 1003 may include a junction capacitance of a source or drain of fourth transistor 1204.

The photosensor may further include fifth transistor 1205, which is a transfer transistor connected between (i) APD 1001 and (ii) first transistor 1201 and read-out circuit 1005, and second capacitor 1006 which accumulates the charges transferred from APD 1001 through fifth transistor 1205. In such a configuration, the 8/N ratio can be increased by use of second capacitor 1006 in addition to first capacitor 1003 depending on the photosensor driving method.

At this time, first capacitor 1003 may include the junction capacitance of the source or drain of fifth transistor 1205.

Fifth transistor 1205 may be turned on in the light exposing period. In such a configuration, capacitance value C which contributes to capacitance quenching of APD 1001 can be defined as the sum of the capacitance values of first capacitor 1003 and second capacitor 1006, and the amount of charges generated in avalanche multiplication can be increased compared to the case where only first capacitor 1003 is included, increasing the S/N ratio.

Alternatively, fifth transistor 1205 may be turned off in the light exposing period. In such a configuration, when the charges generated by avalanche multiplication are transferred by capacitance distribution, noises of the voltage amplitude generated in avalanche multiplication are distributed to first capacitor 1003 and second capacitor 1006. For this reason, a variation in amplitude can be reduced. In contrast, when the charges generated by avalanche multiplication are transferred by complete transfer, the voltage amplitude can be increased by the ratio of the capacitance value of first capacitor 1003 and that of second capacitor 1006, increasing the S/N ratio.

The photosensor may further include fourth transistor 1204*a* connected between APD 1001 and a third power supply. Fourth transistor 1204*a* may be turned on and fifth transistor 1205 may be turned off in the bias setting period, and fourth transistor 1204*a* may be turned off and fifth transistor 1205 may be turned on in the light exposing period.

In such a configuration, APD 1001 is separated from second capacitor 1006 through fifth transistor 1205 as a transfer transistor, and APD 1001 and second capacitor 1006 can be independently reset.

The photosensor may further include sixth transistor 1206, which is a count transistor connected to APD 1001 and connected to read-out circuit 1005 in parallel, and third capacitor 1007 connected to APD 1001 through sixth transistor 1206. Third capacitor 1007 may have a capacitance value larger than that of first capacitor 1003.

In such a configuration, discrete charges according to the number of detections of photons can be accumulated in third capacitor 1007 by repeating several times of the bias setting period, the light exposing period, and the accumulating period in which the charges accumulated in first capacitor 1003 are transferred to third capacitor 1007 and accumulated in third capacitor 1007, and then reading out the amount of charges accumulated in third capacitor 1007, and the number of detections of photons can be counted by reading out the voltage of third capacitor 1007.

The photosensor may further include seventh transistor 1207, which is a third reset transistor connected between first power supply (voltage VC) and first transistor 1201, and fourth capacitor 1008 connected to a connection point between first transistor 1201 and seventh transistor 1207. Fourth capacitor 1008 may have a capacitance value larger than that of first capacitor 1003. At this time, the bias setting period may include a first period during which seventh transistor 1207 is on and first transistor 1201 is off, and a second period during which seventh transistor 1207 is off and first transistor 1201 is on.

In such a configuration, the first power supply (voltage VC) is always separated from APD 1001 during the bias setting period. For this reason, even when photons enter APD 1001 during the bias setting period to cause avalanche multiplication, a flow of large current from APD 1001 to the first power supply (voltage VC) does not occur, enhancing the reliability. Moreover, voltage VC of the first power supply is not varied, thus preventing generation of shading and blooming of images.

The photosensor may further include resistor 1210 connected between the first power supply (voltage VC) and first transistor 1201, and fifth capacitor 1009 connected to a connection point between first transistor 1201 and resistor 1210. The avalanche multiplication phenomenon may be stopped during the bias setting period by accumulating the charges in first capacitor 1003 and fifth capacitor 1009, the charges being generated by the avalanche multiplication phenomenon in APD 1001.

In such a configuration, the current is restricted by resistor 1210 even when first transistor 1201 is on during the bias setting period and avalanche breakdown occurs in APD 1001. Thus, a variation in voltage of node VC is suppressed.

Resistor 1210 may be eighth transistor 1208 having a conductivity type with a polarity opposite to that of the conductivity type of first transistor 1201. In such a configuration, when avalanche breakdown occurs in APD 1001 during a period in which first transistor 1201 is on (specifically, during the reset period), the voltage of node Vrst is varied due to the charges generated by avalanche multiplication, and the channel of eighth transistor 1208 is closed by the variation in voltage. For this reason, the current is difficult to flow in node VC of the first power supply (voltage VC) (in other words, eighth transistor 1208 functions as a high resistor), reducing the variation in voltage VC.

First transistor 1201 may be replaced by ninth transistor 1209 having a conductivity type with a polarity opposite to that of the conductivity of the anode or cathode of APD 1001, the anode or the cathode being connected to first transistor 1201. In this configuration, when avalanche breakdown occurs in APD 1001 during a period in which ninth transistor 1209 is on (specifically, during the reset period), the voltage of node Vfd is varied due to the charges generated by avalanche multiplication, and the channel of ninth transistor 1209 is closed by this variation in voltage. For this reason, the current is difficult to flow in node VC of the first power supply (voltage VC) (in other words, ninth transistor 1209 functions as a high resistor), reducing the variation in voltage VC.

An embodiment according to the present disclosure is an image sensor including photosensors arranged in an array. In such a configuration, an image sensor which detects faint light at a high S/N ratio and high speed is implemented.

Here, adjacent APDs 1001 may be separated by a potential barrier, and the potential barrier may be larger than overvoltage Vov, which is the difference between power supply voltage VC-VA and breakdown voltage VBD. In such a configuration, leakage of the charges between adjacent elements can be suppressed, and signals from a plurality of APDs can be converted into an image.

An embodiment according to the present disclosure is a method of driving a photosensor including APD 1001 that has multiplication region 1002 including a photoelectric converter and includes first capacitor 1003 connected to multiplication region 1002 in parallel. The method includes applying a reverse bias of power supply voltage VC-VA larger than breakdown voltage VBD of APD 1001 between the anode and the cathode of APD 1001 during the bias setting period by connecting APD 1001 to a first power supply (voltage VC); and stopping an avalanche multiplication phenomenon during the light exposing period by disconnecting APD 1001 from the first power supply to accumulate charges in first capacitor 1003, the charges being generated by the avalanche multiplication phenomenon in APD 1001.

In such a configuration, the charges generated in multiplication region 1002 of APD 1001 are accumulated in first capacitor 1003, and avalanche multiplication spontaneously stops. A signal having a large amplitude of several volts can be obtained from a single photon by capacitance quenching without breaking the elements, and photons can be detected at a high S/N ratio.

As above, the photosensor, the image sensor, and the photosensor driving method according to the present disclosure have been described based on the embodiment and modifications thereof, but these embodiment and modifications should not be construed as limitations to the present disclosure. The present disclosure also covers a variety of modifications of the embodiment and the modifications thereof made by persons skilled in the art without departing from the gist of the present disclosure, and other embodiments including combinations of part of the components included in the embodiment and the modifications thereof.

For example, the image sensor according to the present disclosure may include any photosensors according to the present disclosure two-dimensionally arranged, and the charges may be read out at the timing by any driving method according to the present disclosure.

INDUSTRIAL APPLICABILITY

The photosensor, the image sensor, and the photosensor driving method according to the present disclosure can be used in highly sensitive and high-speed photosensors, image sensors, and photosensor driving methods. For example, these can be used in highly sensitive photosensors and image sensors in a variety of fields such as medical, communication, biological, chemical, monitoring, vehicle-installation, and radiation detection fields.

What is claimed is:

1. A photosensor, comprising:
   an avalanche photodiode including a photoelectric converter and a first capacitor connected to the photoelectric converter in parallel;
   a first reset transistor connected between the avalanche photodiode and a first power supply; and
   a second reset transistor connected between the avalanche photodiode and the first power supply,
   wherein the first reset transistor:
   applies a reverse bias of a power supply voltage between an anode and a cathode of the avalanche photodiode during a bias setting period by connecting the avalanche photodiode to the first power supply, the power supply voltage being larger than a breakdown voltage of the avalanche photodiode, and
   stops an avalanche multiplication phenomenon during a light exposing period by disconnecting the avalanche photodiode from the first power supply to accumulate charges in the first capacitor, the charges being generated by the avalanche multiplication phenomenon in the avalanche photodiode, and
   wherein the second reset transistor is turned off in the bias setting period, and is turned on in the light exposing period, and
   the first capacitor includes a junction capacitance of a source or a drain of the second reset transistor.

2. The photosensor according to claim 1, further comprising:
   a read-out circuit which reads out the charges accumulated in the first capacitor.

3. The photosensor according to claim 2, wherein the first capacitor includes at least one of (1) a junction capacitance of the avalanche photodiode, (2) a parasitic capacitance of the avalanche photodiode, (3) a line capacitance of a line connected to the avalanche photodiode, (4) a junction capacitance of a source or a drain of the first reset transistor, or (5) an input capacitance of the read-out circuit.

4. The photosensor according to claim 2, wherein an amplitude of an input signal input to the read-out circuit depends on an overvoltage, which is a difference between the power supply voltage and the breakdown voltage.

5. The photosensor according to claim 2, wherein the read-out circuit includes a well region, and is electrically insulated from the power supply voltage by the well region.

6. The photosensor according to claim 2, further comprising:
   a transfer transistor connected between (i) the avalanche photodiode and (ii) the first reset transistor and the read-out circuit; and
   a second capacitor which accumulates charges transferred from the avalanche photodiode through the transfer transistor.

7. The photosensor according to claim 6, wherein the first capacitor includes a junction capacitance of a source or a drain of the transfer transistor.

8. The photosensor according to claim 6, wherein the transfer transistor is turned on in the light exposing period.

9. The photosensor according to claim 6, wherein the transfer transistor is turned off in the light exposing period.

10. The photosensor according to claim 6, further comprising:
a second reset transistor connected between the avalanche photodiode and a third power supply,
wherein the second reset transistor is turned on and the transfer transistor is turned off in the bias setting period, and
the second reset transistor is turned off and the transfer transistor is turned on in the light exposing period.

11. The photosensor according to claim 6, wherein the first reset transistor has a conductivity type with a polarity opposite to a polarity of a conductivity type of an anode or a cathode of the avalanche photodiode, the anode or the cathode being connected to the first reset transistor.

12. The photosensor according to claim 2, further comprising:
a count transistor connected to the avalanche photodiode and connected to the read-out circuit in parallel; and
a third capacitor connected to the avalanche photodiode through the count transistor,
wherein the third capacitor has a capacitance value larger than a capacitance value of the first capacitor.

13. The photosensor according to claim 1, further comprising:
a third reset transistor connected between the first power supply and the first reset transistor; and
a fourth capacitor connected to a connection point between the first reset transistor and the third reset transistor,
wherein the fourth capacitor has a capacitance value larger than a capacitance value of the first capacitor.

14. The photosensor according to claim 13, wherein the bias setting period includes:
a first period during which the third reset transistor is on and the first reset transistor is off; and
a second period during which the third reset transistor is off and the first reset transistor is on.

15. The photosensor according to claim 1, further comprising:
a resistor connected between the first power supply and the first reset transistor; and
a fifth capacitor connected to a connection point between the first reset transistor and the resistor,
wherein the avalanche multiplication phenomenon is stopped during the bias setting period by accumulating the charges in the first capacitor and the fifth capacitor, the charges being generated by the avalanche multiplication phenomenon in the avalanche photodiode.

16. The photosensor according to claim 15, wherein the resistor is a transistor having a conductivity type with a polarity opposite to a polarity of a conductivity type of the first reset transistor.

17. An image sensor, comprising:
a plurality of photosensors arranged in an array, the plurality of photosensors each being the photosensor according to claim 1.

18. The image sensor according to claim 17,
wherein adjacent avalanche photodiodes in the array are separated by a potential barrier, and
the potential barrier is larger than the overvoltage, which is a difference between the power supply voltage and the breakdown voltage.

19. A photosensor, comprising:
an avalanche photodiode including a photoelectric converter and a first capacitor connected to the photoelectric converter in parallel;
a first reset transistor connected between the avalanche photodiode and a first power supply; and
a second reset transistor connected between the avalanche photodiode and a second power supply,
wherein the first reset transistor:
applies a reverse bias of a power supply voltage between an anode and a cathode of the avalanche photodiode during a bias setting period by connecting the avalanche photodiode to the first power supply, the power supply voltage being larger than a breakdown voltage of the avalanche photodiode, and
stops an avalanche multiplication phenomenon during a light exposing period by disconnecting the avalanche photodiode from the first power supply to accumulate charges in the first capacitor, the charges being generated by the avalanche multiplication phenomenon in the avalanche photodiode, and
wherein the second reset transistor is turned off in the bias setting period, and is turned on in the light exposing period, and
the first capacitor includes a junction capacitance of a source or a drain of the second reset transistor.

20. A method of driving a photosensor including an avalanche photodiode including a photoelectric converter and a first capacitor connected to the photoelectric converter in parallel, the method comprising:
applying a reverse bias of a power supply voltage between an anode and a cathode of the avalanche photodiode during a bias setting period by connecting the avalanche photodiode to a first power supply, the power supply voltage being larger than a breakdown voltage of the avalanche photodiode; and
stopping an avalanche multiplication phenomenon during a light exposing period by disconnecting the avalanche photodiode from the first power supply to accumulate charges in the first capacitor, the charges being generated by the avalanche multiplication phenomenon in the avalanche photodiode,
wherein a second reset transistor is connected between the avalanche photodiode and the first power supply, the second reset transistor is turned off in the bias setting period, and is turned on in the light exposing period, and
the first capacitor includes a junction capacitance of a source or a drain of the second reset transistor.

* * * * *